(12) United States Patent
Ramaraju

(10) Patent No.: US 12,014,770 B2
(45) Date of Patent: Jun. 18, 2024

(54) MEMORY DEVICE HAVING VARIABLE IMPEDANCE MEMORY CELLS AND TIME-TO-TRANSITION SENSING OF DATA STORED THEREIN

(71) Applicant: R&D 3 LLC, Round Rock, TX (US)

(72) Inventor: Ravindraraj Ramaraju, Round Rock, TX (US)

(73) Assignee: R&D3 LLC, Round Rock, TX (US)

( * ) Notice: Subject to any disclaimer, the term of this patent is extended or adjusted under 35 U.S.C. 154(b) by 170 days.

(21) Appl. No.: 17/649,342

(22) Filed: Jan. 28, 2022

(65) Prior Publication Data

US 2022/0293165 A1 Sep. 15, 2022

Related U.S. Application Data

(63) Continuation-in-part of application No. 17/328,538, filed on May 24, 2021, now Pat. No. 11,783,891, and
(Continued)

(51) Int. Cl.
*G11C 7/14* (2006.01)
*G11C 5/06* (2006.01)
(Continued)

(52) U.S. Cl.
CPC .......... *G11C 11/4096* (2013.01); *G11C 5/063* (2013.01); *G11C 7/065* (2013.01);
(Continued)

(58) Field of Classification Search
CPC ..... G11C 11/4096; G11C 5/063; G11C 7/065; G11C 7/08; G11C 7/14; G11C 7/18;
(Continued)

(56) References Cited

U.S. PATENT DOCUMENTS 6,128,239 A 10/2000 Perner
6,151,260 A 11/2000 Birk
(Continued)

FOREIGN PATENT DOCUMENTS

JP 2000293993 A 10/2000
JP 2001184856 A 7/2001
(Continued)

OTHER PUBLICATIONS

International Search Report and Written Opinion for International Application No. PCT/US2018/049764 mailed Dec. 19, 2018, 13 pages.
(Continued)

*Primary Examiner* — Xiaochun L Chen
(74) *Attorney, Agent, or Firm* — Gonzalez PLLC; Gabriel J Gonzalez

(57) ABSTRACT

The present disclosure relates to circuits, systems, and methods of operation for a memory device. In an example, a memory device includes a plurality of memory cells, each memory cell having a variable impedance that varies in accordance with a respective data value stored therein; and a read circuit configured to read the data value stored within a selected memory cell based upon a variable time delay determination of a signal node voltage change corresponding to the variable impedance of the selected memory cell.

20 Claims, 25 Drawing Sheets

Related U.S. Application Data a continuation-in-part of application No. 17/105,927, filed on Nov. 27, 2020, now Pat. No. 11,501,826, said application No. 17/328,538 is a continuation of application No. 16/802,902, filed on Feb. 27, 2020, now Pat. No. 11,049,553, said application No. 17/105,927 is a continuation-in-part of application No. 16/802,902, filed on Feb. 27, 2020, now Pat. No. 11,049,553, which is a continuation of application No. 16/359,948, filed on Mar. 20, 2019, now Pat. No. 10,629,256, which is a continuation of application No. 16/040,419, filed on Jul. 19, 2018, now Pat. No. 10,269,413.

(60) Provisional application No. 63/143,708, filed on Jan. 29, 2021, provisional application No. 62/650,067, filed on Mar. 29, 2018, provisional application No. 62/573,460, filed on Oct. 17, 2017.

(51) Int. Cl.
| | | |
|---|---|---|
| *G11C 7/06* | (2006.01) | |
| *G11C 7/08* | (2006.01) | |
| *G11C 7/18* | (2006.01) | |
| *G11C 11/404* | (2006.01) | |
| *G11C 11/4091* | (2006.01) | |
| *G11C 11/4096* | (2006.01) | |
| *G11C 11/56* | (2006.01) | |
| *G11C 16/30* | (2006.01) | |
| *G11C 8/16* | (2006.01) | |
| *G11C 11/405* | (2006.01) | |
| *G11C 11/4094* | (2006.01) | |

(52) U.S. Cl.
CPC ............... *G11C 7/08* (2013.01); *G11C 7/14* (2013.01); *G11C 7/18* (2013.01); *G11C 11/404* (2013.01); *G11C 11/4045* (2013.01); *G11C 11/4091* (2013.01); *G11C 11/565* (2013.01); *G11C 16/30* (2013.01); *G11C 8/16* (2013.01); *G11C 11/405* (2013.01); *G11C 11/4094* (2013.01); *G11C 2207/2254* (2013.01)

(58) Field of Classification Search
CPC .............. G11C 11/404; G11C 11/4045; G11C 11/4091; G11C 11/565; G11C 16/30; G11C 8/16; G11C 11/405; G11C 11/4094; G11C 2207/2254; G11C 8/14; G11C 7/1036; G11C 7/227; G11C 11/4076
See application file for complete search history.

(56) References Cited

U.S. PATENT DOCUMENTS

| | | | |
|---|---|---|---|
| 6,259,644 | B1 | 7/2001 | Tran et al. |
| 6,760,268 | B2 | 7/2004 | Pelley |
| 7,570,507 | B2 | 8/2009 | Nirschl |
| 8,059,476 | B2 | 11/2011 | Ware et al. |
| 8,379,433 | B2 | 2/2013 | Houston et al. |
| 8,405,413 | B2 | 3/2013 | Carpenter et al. |
| 8,654,561 | B1 | 2/2014 | Jameson et al. |
| 8,747,680 | B1 | 6/2014 | Deshpande et al. |
| 8,750,042 | B2 | 6/2014 | Sharon et al. |
| 8,848,419 | B2 | 9/2014 | Wu et al. |
| 9,478,277 | B1 | 10/2016 | Liu |
| 2007/0002630 | A1 | 1/2007 | Gallo et al. |
| 2007/0025158 | A1 | 2/2007 | Kim et al. |
| 2008/0094909 | A1 | 4/2008 | Gallo et al. |
| 2008/0219043 | A1 | 9/2008 | Yoon et al. |
| 2009/0003033 | A1 | 1/2009 | Nirschl |
| 2009/0016100 | A1 | 1/2009 | Jeong |
| 2009/0073771 | A1 | 3/2009 | Li |
| 2009/0073783 | A1 | 3/2009 | Breitwisch et al. |
| 2009/0073784 | A1 | 3/2009 | Breitwisch et al. |
| 2009/0073785 | A1 | 3/2009 | Breitwisch et al. |
| 2009/0073790 | A1 | 3/2009 | Breitwisch et al. |
| 2010/0226164 | A1 | 9/2010 | Nagashima et al. |
| 2011/0038199 | A1 | 2/2011 | Breitwisch et al. |
| 2011/0075473 | A1 | 3/2011 | Park et al. |
| 2012/0063195 | A1 | 3/2012 | Lam et al. |
| 2012/0307554 | A1 | 12/2012 | Frey et al. |
| 2012/0324253 | A1 | 12/2012 | Gunther et al. |
| 2013/0121079 | A1 | 5/2013 | Wu et al. |
| 2013/0322194 | A1 | 12/2013 | Rachamadugu et al. |
| 2014/0003172 | A1 | 1/2014 | Ramaraju et al. |
| 2014/0043886 | A1 | 2/2014 | Wu et al. |
| 2014/0104931 | A1 | 4/2014 | Katoh et al. |
| 2014/0254272 | A1 | 9/2014 | Sharon et al. |
| 2015/0248927 | A1 | 9/2015 | Fujiwara et al. |
| 2015/0364192 | A1 | 12/2015 | Yoshimoto et al. |
| 2016/0078959 | A1 | 3/2016 | Bushnaq et al. |
| 2016/0093353 | A1 | 3/2016 | Jung et al. |
| 2016/0148695 | A1 | 5/2016 | Kim |
| 2016/0358648 | A1 | 12/2016 | Park et al. |
| 2017/0025415 | A1 | 1/2017 | Kurokawa |
| 2017/0103318 | A1 | 4/2017 | Ross et al. |
| 2017/0294227 | A1 | 10/2017 | Tezuka et al. |
| 2018/0075900 | A1 | 3/2018 | Ishizu et al. |
| 2018/0114578 | A1* | 4/2018 | Ishizu ............... G11C 7/10 |
| 2018/0301173 | A1 | 10/2018 | Tiwari |

FOREIGN PATENT DOCUMENTS

| | | |
|---|---|---|
| JP | 2002008369 A | 1/2002 |
| JP | 2016115385 A | 6/2016 |

OTHER PUBLICATIONS

International Search Report and Written Opinion for International Application No. PCT/US2018/049768 mailed Feb. 1, 2019, 12 pages.

Aoki, Masakazu, et al., "A 16-Level/Cell Dynamic Memory", Aoki, Masakazu, et al, "A 16-Level/Cell Dynamic Memory," IEEE Journal of Solid-State Circuits, vol. SC-22, No. J, Apr. 1987, 3 pages.

Barth, John, et al., "A 45 nm SOI Embedded DRAM Macro for the POWER(TM) Processor 32 MByte On-Chip L3 Cache", Barth, John, et al., "A 45 nm SOI Embedded DRAM Macro for the POWER{TM} Processor 32 MByte On-Chip L3 Cache," IEEE Journal of Solid-State Circuits, vol. 46, No. 1, Jan. 2011, 12 pages.

Begur, Soumya Shivakumar, "A 45nm CMOS, Low Jitter, All-Digital Delay Locked Loop with a Circuit to Dynamically Vary Phase to Achieve Fast Lock", Begur, Soumya Shivakumar, "A 45nm CMOS, Low Jitter, All-Digital Delay Locked Loop with a Circuit to Dynamically Vary Phase to Achieve Fast Lock", Master's Thesis, Dept. Electrical and Computer Engineering, Northeastern University, Oct. 2011, 75 pages.

Birk, Gershom, et al., "A Comparative Simulation Study on Four Multilevel DRAMs", Birk, Gershom, et al., "A Comparative Simulation Study on Four Multilevel DRAMs," Records of the 1999 IEEE International Workshop on Memory Technology, Design and Testing, San Jose, CA, USA, 1999, 8 pages.

BM, Corporation, "Power?+ (TM)", BM Corporation, "Power?+ (TM)," Presentation, Systems & Technology Group, Aug. 29, 2012, sctaylor@us. bm.com, 17 pages.

Cheng, Kuo-Hsing, et al., "A time-to-digital converter using multi-phase-sampling and time amplifier for all digital phase-locked loop", Cheng, Kuo-Hsing, et al.,"A time-to-digital converter using multi-phase-sampling and time amplifier for all digital phase-locked loop," ResearchGate, https://www.researchgate.net/publication/232650181, DOI:10.1109/ DDECS.2010.5491766, Jan. 2010, 5 pages.

Drake, Alan J., et al., "Single-Cycle, Pulse-Shaped Critical Path Monitor in the Power?+ Microprocessor", Drake, Alan J., et al., "Single-Cycle, Pulse-Shaped Critical Path Monitor in the Power?+ Microprocessor," International Symposium on Low Power Electronics and Design, IEEE, 2013, 6 pages.

(56) References Cited

OTHER PUBLICATIONS

Dudek, Piotr Dr, "VOL Time to Digital Converter, A high-resolution CMOS time to digital converter integrated ircuit utilising a vernier delay line", Dudek, Piotr, Dr., "VOL Time to Digital Converter, A high-resolution CMOS time to digital converter integrated ircuit utilising a vernier delay line" http://personalpages.manchester.ac.uk/staff/p.dudek/projects/tdc/default.htm, Mar. 28, 2018, 3 pages.

Franch, R. , et al., "On-chip Timing Uncertainty Measurements on IBM Microprocessors", Franch, R., et al., "On-chip Timing Uncertainty Measurements on IBM Microprocessors," 2008 IEEE International Test Conference, Santa Clara, CA, 2008, 7 pages.

Furuyama, Tohru , et al., "An Experimental 2-bil/Cell Storage DRAM for Macrocell or Memory-on-Logic Application", Furuyama, Tohru, et al., "An Experimental 2-bil/Cell Storage DRAM for Macrocell or Memory-on-Logic Application," IEEE Journal of Solid-State Circuits, vol. 24, No. 2, Apr. 1989, 6 pages.

Garlepp, Bruno W., et al., "A Portable Digital DLL for High-Speed CMOS Interface Circuits", Garlepp, Bruno W., et al., "A Portable Digital DLL for High-Speed CMOS Interface Circuits," IEEE Journal of Solid-State Circuits, vol. 34, No. 5, May 1999, 13 pages.

Gillingham, Peter , "A Sense and Restore Technique for Multilevel DRAM", Gillingham, Peter, "A Sense and Restore Technique for Multilevel DRAM," IEEE Transactions on Circuits and Systems-II: Analog and Digital Signal Processing, vol. 43, No. 7, Jul. 1996, 4 pages.

Jeon, Dongsuk , et al., "A 23-mW Face Recognition Processor with Mostly-Read 5T Memory in 40-nm CMOS", Jeon, Dongsuk, et al., "A 23-mW Face Recognition Processor with Mostly-Read 5T Memory in 40-nm CMOS," EEE Journal of Solid-State Circuits, vol. 52, No. 6, Jun. 2017, 15 pages.

Jovanovic, G. S., et al., "Vernie's Delay Line Time-to-Digital Converter", Jovanovic, G.S., et al., "Vernie's Delay Line Time-to-Digital Converter," Scientific Publications of the State University of Novi Pazar, Ser. A: Appl. Math. Inform. and Mech. vol. 1, 1 (2009), received Feb. 25, 2009, accepted May 30, 2009, 10 pages.

Kang, Mingu , et al., "A Multi-Functional In-Memory Inference Processor Using a Standard 6T SRAM Array", Kang, Mingu, et al., "A Multi-Functional In-Memory Inference Processor Using a Standard 6T SRAM Array," IEEE Journal of Solid-State Circuits, vol. 53, No. 2, Feb. 2018, 17 pages.

Khalid, Muhammad Humer, et al., "Replica Bit-Line Technique for Embedded Multilevel Gain-Cell DRAM", Khalid, Muhammad Umer, et al., "Replica Bit-Line Technique for Embedded Multilevel Gain-Cell DRAM," 10th EEE International NEWCAS Conference, Montreal, QC, 2012, 4 pages.

Khodabandehloo, Golnar , et al., "CVNS-Based Storage and Refreshing Scheme for a Multi-Valued Dynamic Memory", Khodabandehloo, Golnar, et al., "CVNS-Based Storage and Refreshing Scheme for a Multi-Valued Dynamic Memory," IEEE Transactions on Very Large Scale Integration (VLSI) Systems, vol. 19, No. 8, pp. Aug. 2011, 5 pages.

Lee, Ming-Ju Edward, "An efficient 1/0 and clock recovery design for terabit integrated circuits", Lee, Ming-Ju Edward, "An Efficient 1/0 and Clock Recovery Design for Terabit Integrated Circuits," PhD Dissertation, Department of Electrical Engineering, Stanford University, Aug. 2001, 130 pages.

Lomsdalen, Johannes Goplen, et al., "Self-refreshing Multiple Valued Memory", Lomsdalen, Johannes Goplen, et al., "Self-refreshing Multiple Valued Memory," 2006 IEEE Design and Diagnostics of Electronic Circuits and Systems, Prague, 2006, 3 pages.

Neinlader, Daniel K., "Precision CMOS receivers for VLSI testing application", Neinlader, Daniel K., "Precision CMOS Receivers for VLSI Testing Application," PhD Dissertation, Department of Electrical Engineering, Stanford University, Nov. 2001, 112 pages.

Okuda, Takashi , et al., "A Four-Level Storage 4-GB DRAM", Okuda, Takashi, et al., "A Four-Level Storage 4-GB DRAM," IEEE Journal of Solid-Slate Circuits, vol. 32, No. 11, Nov. 1997, 5 pages.

Qazi, Masood , et al., "A Low-Voltage 1 Mb FRAM in 0.13 μm CMOS Featuring Time-lo-Digital Sensing for Expanded Operating Margin", Qazi, Masood, et al., "A Low-Voltage 1 Mb FRAM in 0.13 μm CMOS Featuring Time-lo-Digital Sensing for Expanded Operating Margin," IEEE Journal of Solid-Slate Circuits, vol. 47, No. 1, Jan. 2012, 10 pages.

York, Timothy , "Fundamentals of Image Sensor Performance", York, Timothy, "Fundamentals of Image Sensor Performance," Fundamentals of Image Sensor Performance, http://www1.cse.wesll.edu/-jain/cse567-11/flp/imgsens/index.hlml, Last modified Apr. 24, 2011, 8 pages.

Zhang, Jintao , et al., "In-Memory Computation of a Machine-Learning Classifier in a Standard 6T SRAM Array", Zhang, Jintao, et al., "In-Memory Computation of a Machine-Learning Classifier in a Standard 6T SRAM Array," EEE Journal of Solid-Slate Circuits, vol. 52, No. 4, Apr. 2017, 10 pages.

Office Action from the Japan Patent Office, Japanese Patent Application No. 2020-517140, mailed on Oct. 4, 2022, 7 pgs.

Office Action from the Japan Patent Office, Japanese Patent Application No. 2020-516892, mailed on Oct. 4, 2022, 3 pgs.

\* cited by examiner

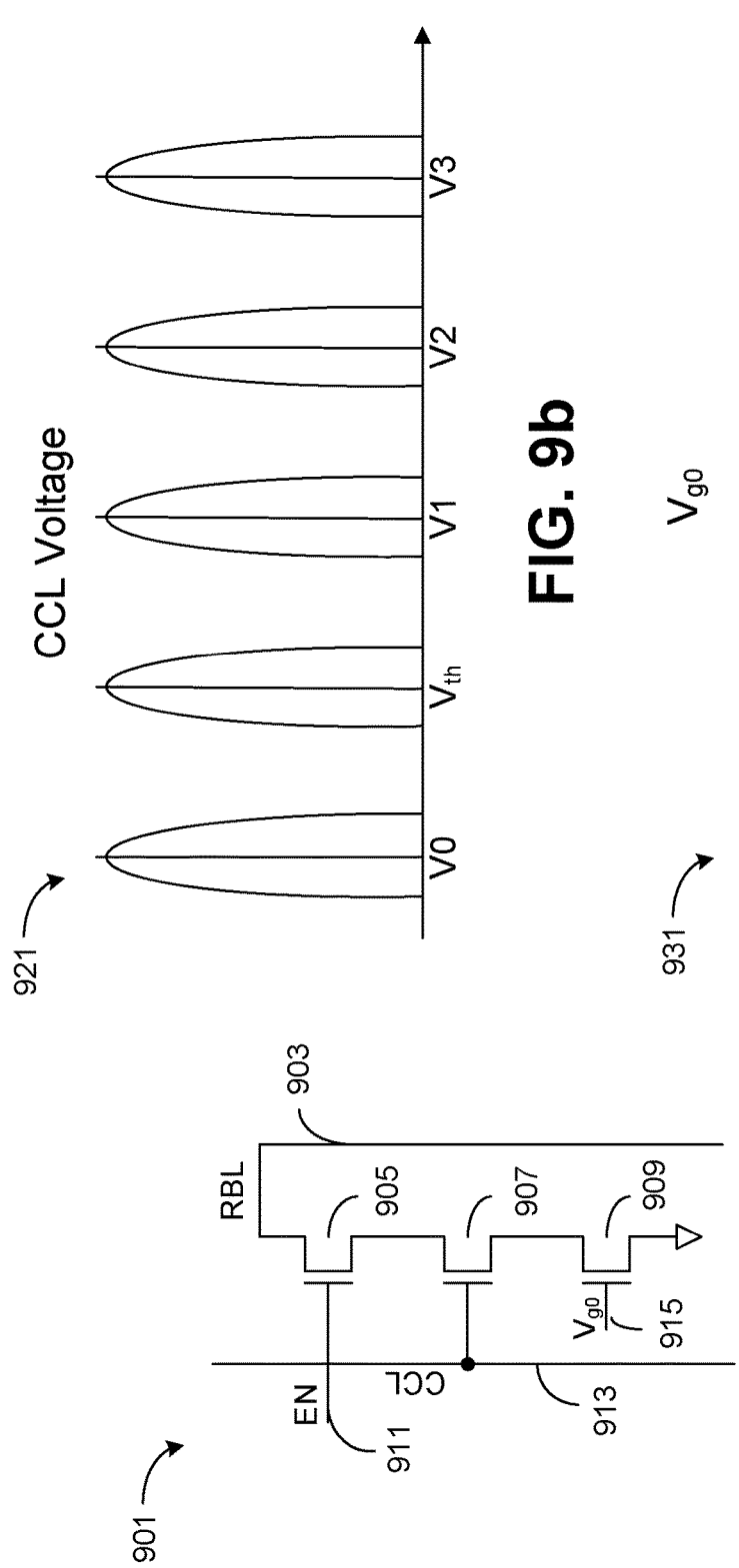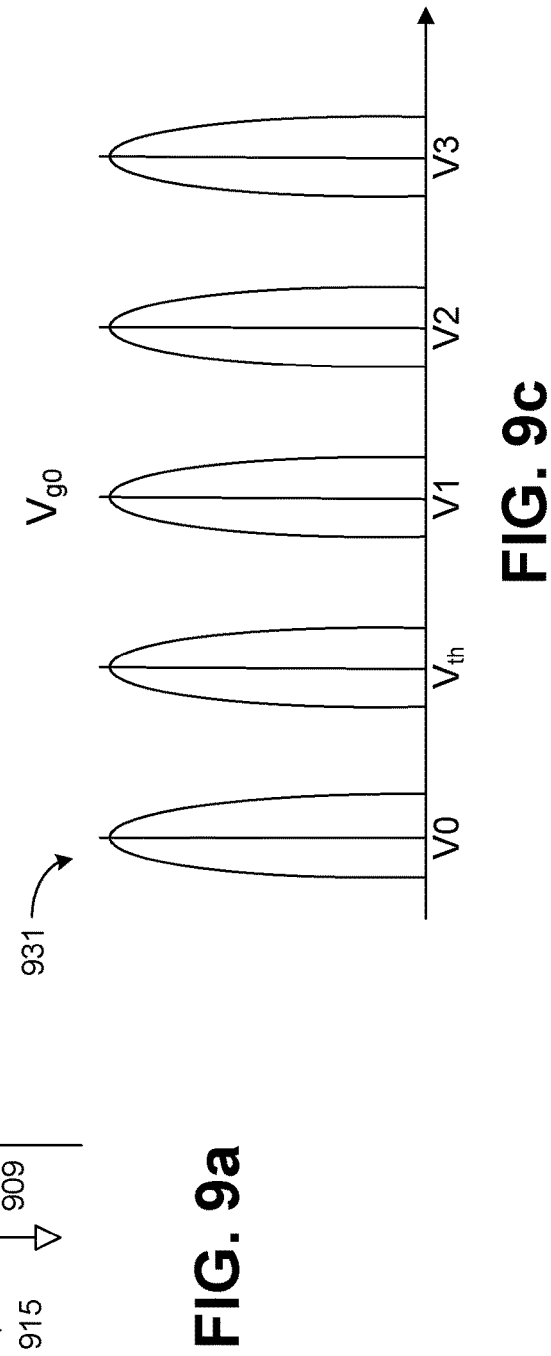
FIG. 9b
FIG. 9c
FIG. 9a

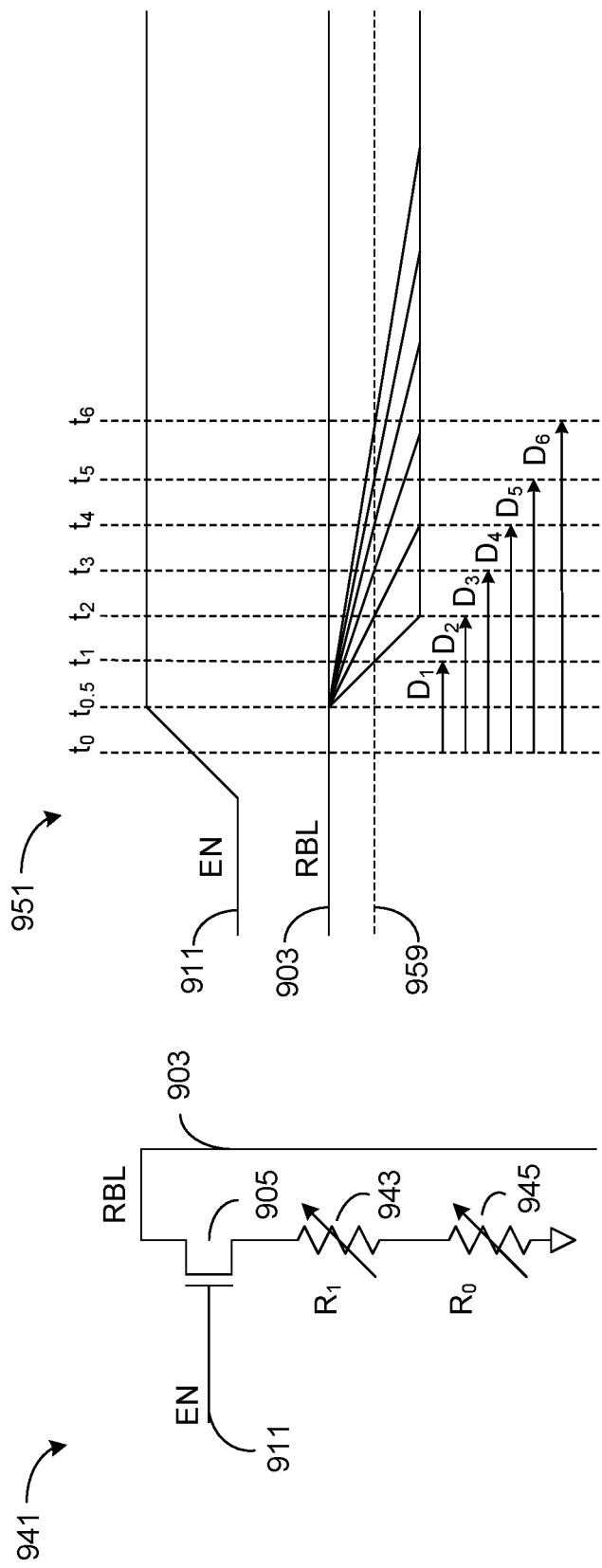

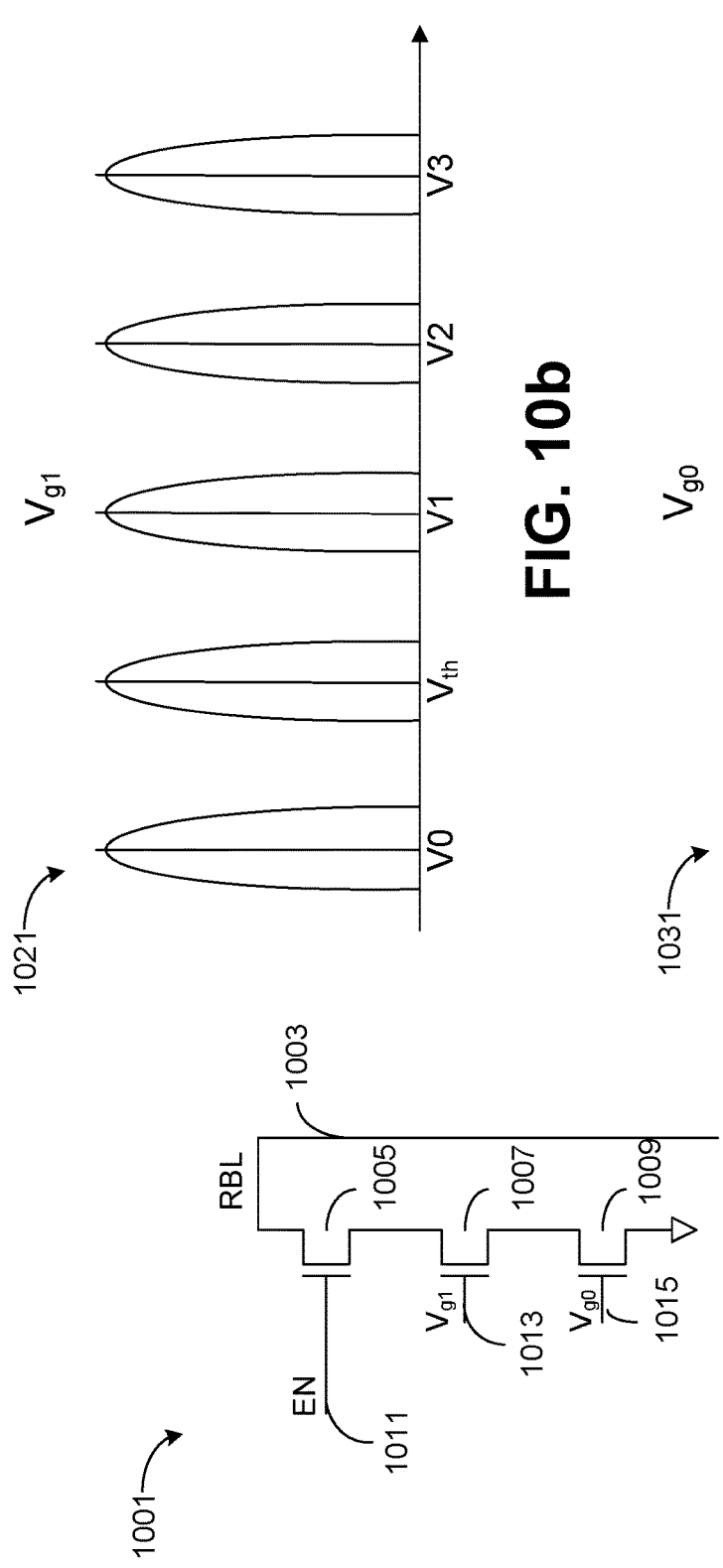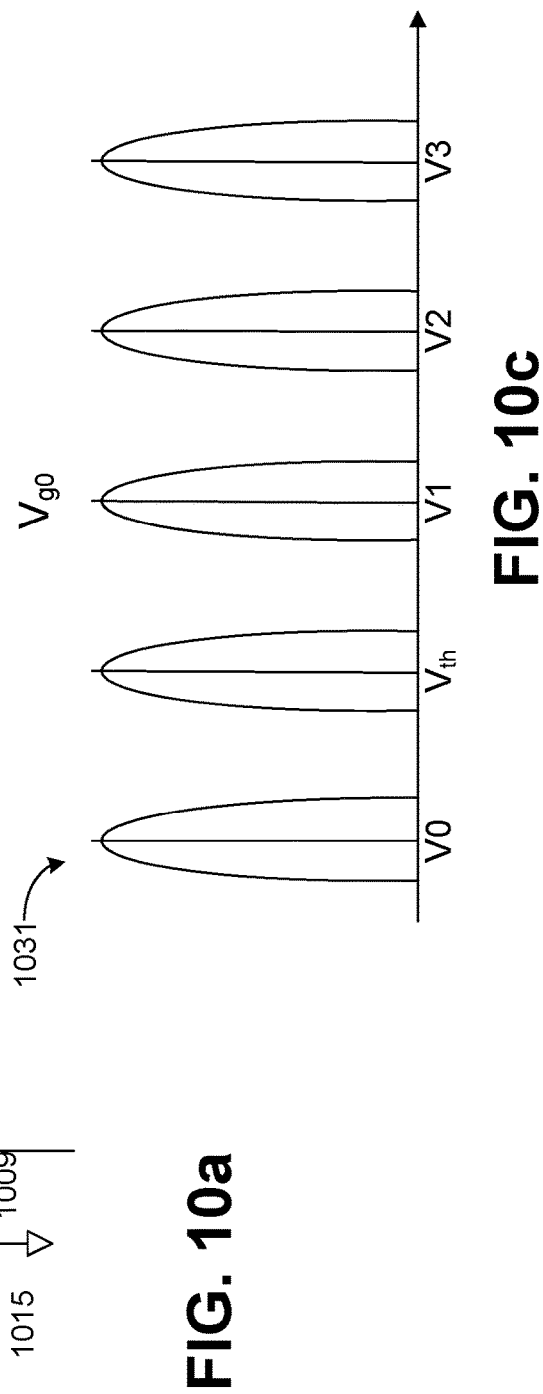

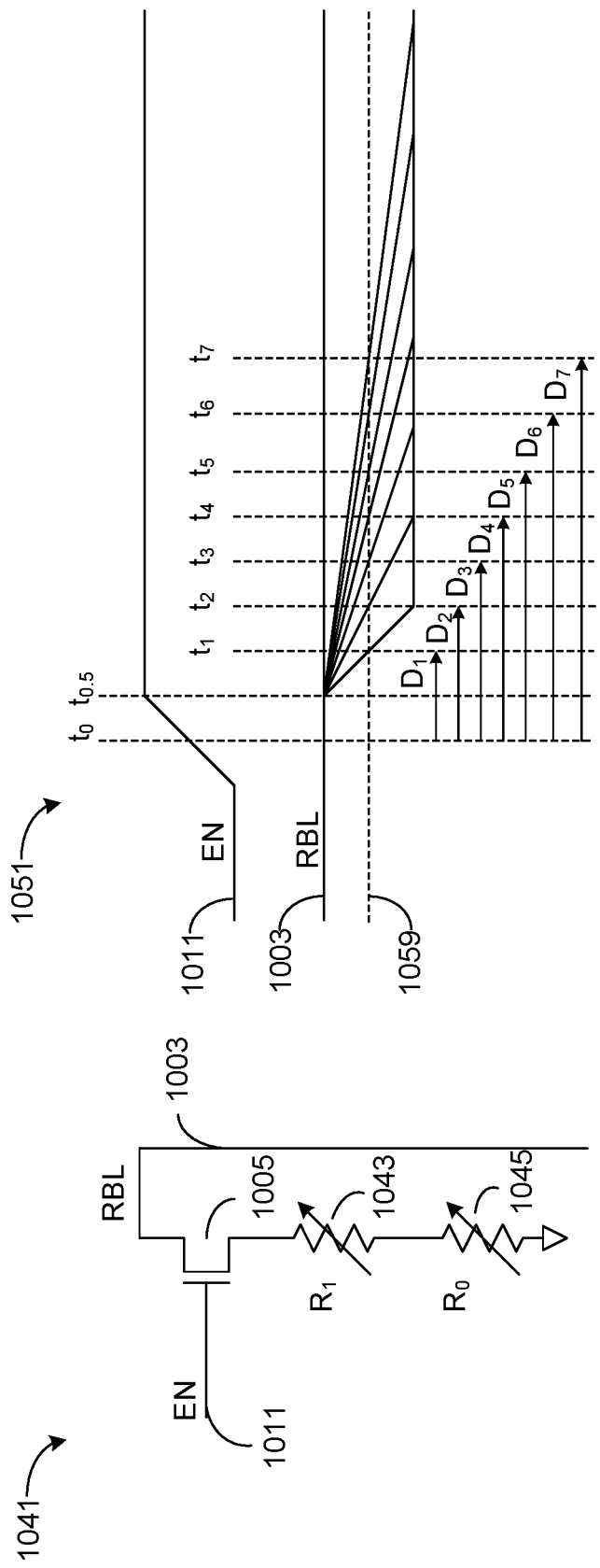

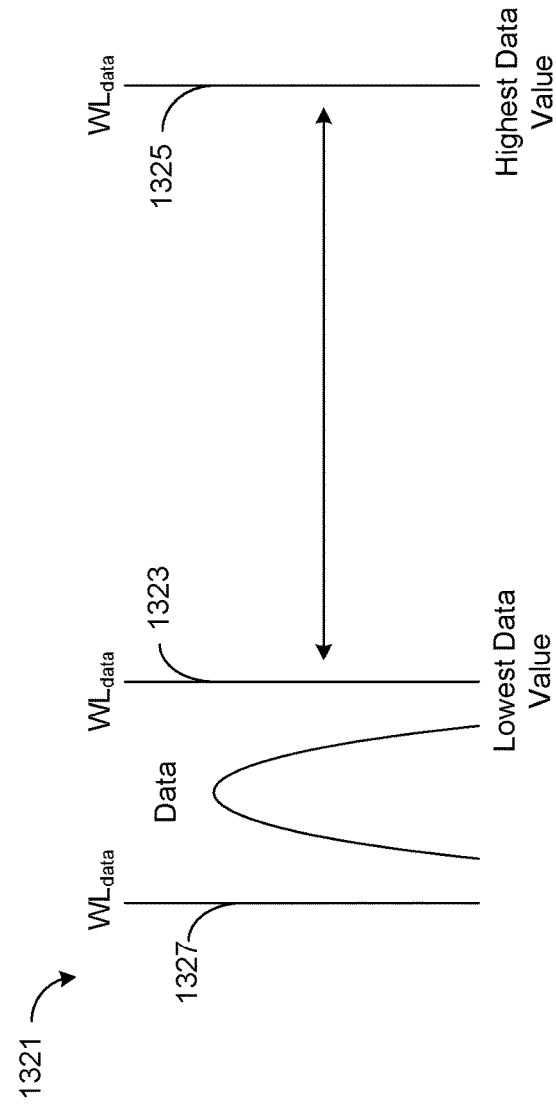
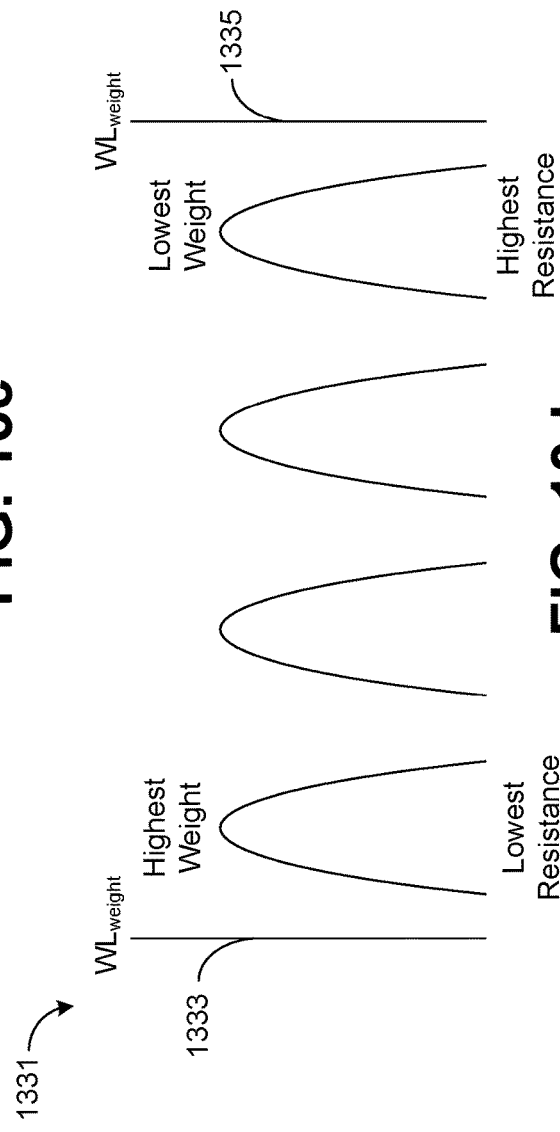
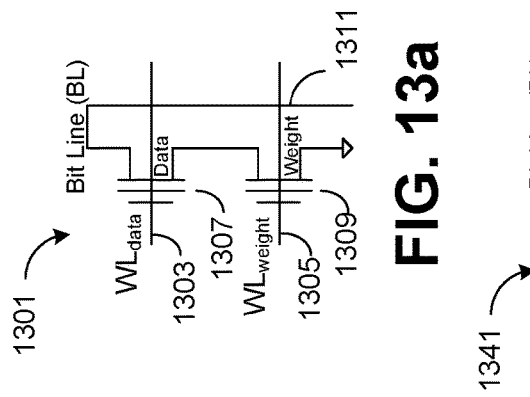

MEMORY DEVICE HAVING VARIABLE IMPEDANCE MEMORY CELLS AND TIME-TO-TRANSITION SENSING OF DATA STORED THEREIN

CROSS-REFERENCE TO RELATED APPLICATIONS

The present application claims the benefit of U.S. Provisional Patent Application No. 63/143,708, filed Jan. 29, 2021, titled "Memory Device Having Variable Impedance Memory Cells and Time-to-Transition Sensing of Data Stored Therein", which is incorporated by reference herein in its entirety. Furthermore, the present application is a continuation-in-part of U.S. patent application Ser. No. 17/328,538, filed May 24, 2021, titled "Memory Device Having Variable Impedance Memory Cells and Time-to-Transition Sensing of Data Stored Therein", which is a continuation of U.S. patent application Ser. No. 16/802,902, filed Feb. 27, 2020, titled "Memory Device Having Variable Impedance Memory Cells and Time-to-Transition Sensing of Data Stored Therein", which is a continuation of U.S. patent application Ser. No. 16/359,948, filed Mar. 20, 2019, titled "Memory Device Having Variable Impedance Memory Cells and Time-to-Transition Sensing of Data Stored Therein", which is a continuation of U.S. patent application Ser. No. 16/040,419, filed Jul. 19, 2018, titled "Memory Device Having Variable Impedance Memory Cells and Time-to-Transition Sensing of Data Stored Therein", which claims the benefit of U.S. Provisional Patent Application No. 62/650,067, filed Mar. 29, 2018, titled "Memory Structures and Related Methods of Operation," and further claims the benefit of U.S. Provisional Patent Application No. 62/573,460, filed Oct. 17, 2017, titled "Memory Operation". All applications are incorporated herein by reference in their entirety. Furthermore, the present application is a continuation-in-part of U.S. patent application Ser. No. 17/105,927, filed Nov. 27, 2020, titled "Memory Device Having Variable Impedance Memory Cells and Time-to-Transition Sensing of Data Stored Therein", which is a continuation-in-part of U.S. patent application Ser. No. 16/802,902, filed Feb. 27, 2020, titled "Memory Device Having Variable Impedance Memory Cells and Time-to-Transition Sensing of Data Stored Therein", which is a continuation of U.S. patent application Ser. No. 16/359,948, filed Mar. 20, 2019, titled "Memory Device Having Variable Impedance Memory Cells and Time-to-Transition Sensing of Data Stored Therein", which is a continuation of U.S. patent application Ser. No. 16/040,419, filed Jul. 19, 2018, titled "Memory Device Having Variable Impedance Memory Cells and Time-to-Transition Sensing of Data Stored Therein", which claims the benefit of U.S. Provisional Patent Application No. 62/650,067, filed Mar. 29, 2018, titled "Memory Structures and Related Methods of Operation," and further claims the benefit of U.S. Provisional Patent Application No. 62/573,460, filed Oct. 17, 2017, titled "Memory Operation". All applications are incorporated herein by reference in their entirety.

TECHNICAL FIELD

The present disclosure relates to circuits, systems, and methods of operation for a memory device, and more particularly relates to devices whose memory cells have a variable impedance that varies in accordance with a respective data value stored therein.

BACKGROUND

Memory may be used for many different types of purposes in a computing system. For example, memory may be used to store data or perform mathematical operations. Different types of memory may be used for these various purposes. Dynamic random-access memory (DRAM) may be used in situations that benefit from low-cost and high-capacity memory, and may be used in main memory components of a computing system. DRAM may be slower than other kinds of memory such as static random-access memory (SRAM).

SUMMARY

Memory devices are disclosed that generally perform a time delay determination of a voltage change on a signal node to determine the data value stored within a selected memory cell.

In one disclosed embodiment, a memory device includes a plurality of memory cells, each memory cell having a variable impedance that varies in accordance with a respective data value stored therein. The memory device also includes a read circuit configured to read the data value stored within a selected memory cell based upon a variable time delay determination of a signal node voltage change corresponding to the variable impedance of the selected memory cell.

In another disclosed embodiment, a memory device includes a plurality of memory cells in an array, and a read circuit. The read circuit is configured to effect a voltage transition of a signal node at a variable rate corresponding to a data value stored within a selected memory cell, and to perform a time-to-transition measurement of the signal node to determine the data value stored within the selected memory cell.

BRIEF DESCRIPTION OF THE DRAWINGS

For a detailed description of various embodiments, reference will now be made to the accompanying drawings in which:

FIG. 9a shows a memory cell read port in accordance with at least some embodiments;

FIG. 9b shows an example line graph depicting a voltage value distribution in accordance with at least some embodiments;

FIG. 9c shows an example graph depicting a voltage value distribution in accordance with at least some embodiments;

FIG. 9d shows a memory cell read port equivalent model in accordance with at least some embodiments;

FIG. 9e shows a corresponding read operation in accordance with at least some embodiments;

FIG. 10a shows a memory cell read port in accordance with at least some embodiments;

FIG. 10b shows an example line graph depicting a voltage value distribution in accordance with at least some embodiments;

FIG. 10c shows an example graph depicting a voltage value distribution in accordance with at least some embodiments;

FIG. 10d shows a memory cell read port equivalent model in accordance with at least some embodiments;

FIG. 10e shows a corresponding read operation in accordance with at least some embodiments;

FIG. 13a shows a non-volatile memory cell in a series configuration in accordance with at least some embodiments;

FIG. 13b shows a non-volatile memory cell in a series configuration in accordance with at least some embodiments;

FIG. 13c shows an example line graph depicting a voltage value distribution in accordance with at least some embodiments;

FIG. 13d shows an example line graph depicting a voltage value distribution in accordance with at least some embodiments;

It should be noted that the structures and timing diagrams depicted in the various figures are not necessarily drawn to scale, but rather are drawn in a manner to more clearly illustrate the teachings depicted therein.

DETAILED DESCRIPTION

Certain terms are used throughout the following description and claims to refer to particular system components. As one skilled in the art will appreciate, different companies may refer to a component by different names. This document does not intend to distinguish between components that differ in name but not in function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The ability to store multiple bits in a single memory cell may be beneficial to computer users. The ability to store multiple bits in a single memory cell allows more data to be stored in the same physical space. Furthermore, the ability to perform mathematical operations using memory cells may be beneficial to machine language programmers. In order to implement both the ability to store multiple bits in a single memory cell as well as improve on an ability to perform mathematical operations using memory cells, various methods and systems are described below, directed to interpreting data stored in a memory cell.

Figure 1:
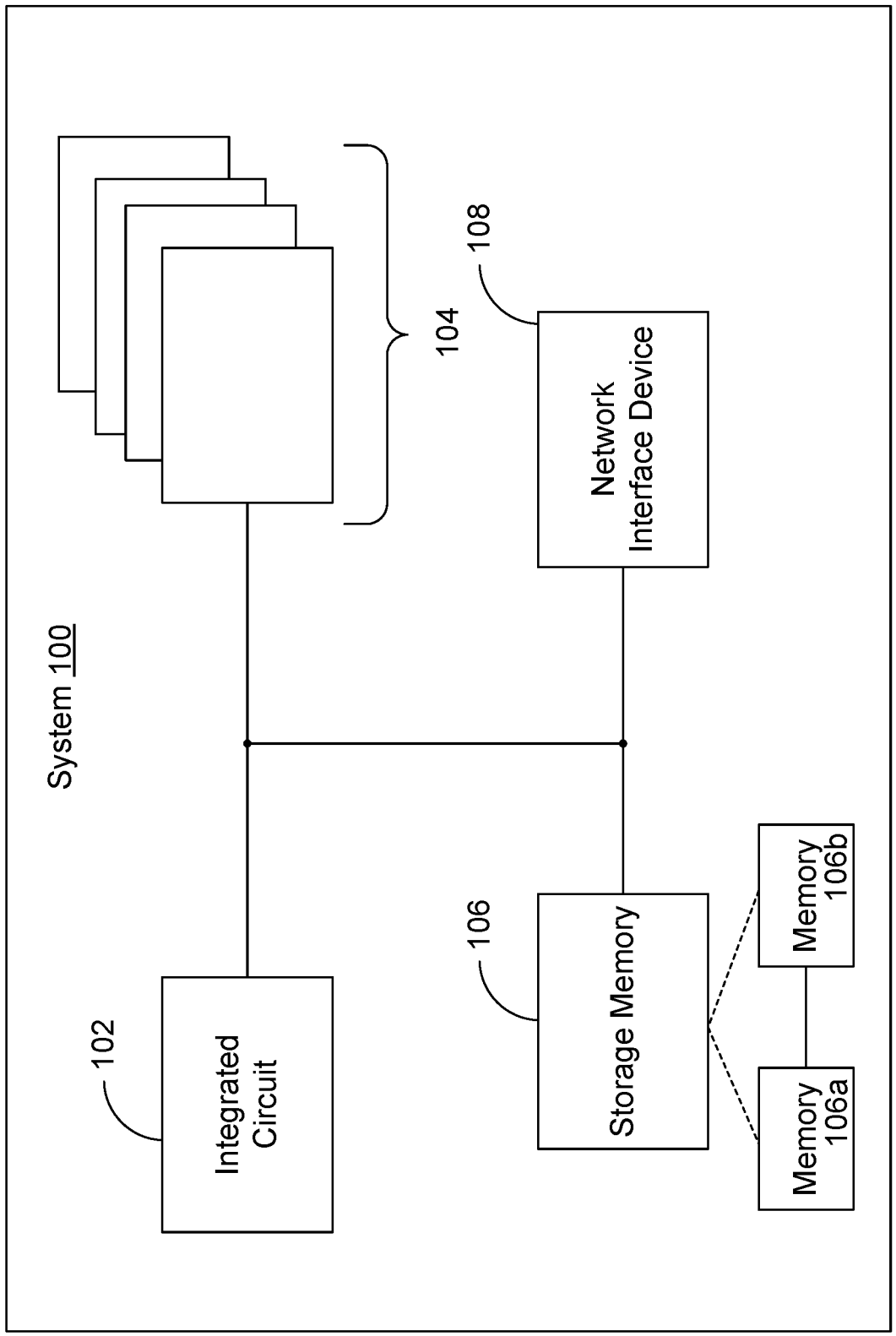
FIG. 1 shows, in block diagram form, an example computing system comprising memory structures in accordance with at least some embodiments.

FIG. 1 illustrates an environment within which memory in accordance with embodiments described herein may be used. In particular, FIG. 1 illustrates a computing system 100 that may utilize memory in accordance with embodiments described herein. The computing system 100 may be illustrative of, for example, a laptop, a desktop computer, a computer within a node of several computers, a cell phone, a tablet, or any other computing system that may utilize memory in accordance with embodiments described herein. In particular various components in the illustrative computing system 100 may use memory in accordance with embodiments described herein. The computer system 100 comprises an integrated circuit (IC) 102 and one or more memory 104 coupled to IC 102, where one or more memory 104 may comprise memory in accordance with embodiments described herein.

IC 102 represents any computing element present in a system. For example, IC 102 may be a central processing unit (CPU), a processing element, a graphics processing unit (GPU), hardware accelerator, system on a chip (SOC), digital signals processor (DSP), a machine learning unit, a matrix operations unit (MOU), etc. In some embodiments, IC 102 may comprise memory in accordance with embodiments described herein.

For example, IC 102 may comprise L3 cache memory in accordance with embodiments described herein. Additionally, memory in accordance with embodiments described herein, may be used as part of a computation process such as in the GPU, and in various chips such as the MOU tailored for machine learning. A MOU may perform matrix transpose and transformation operations. The MOU may also perform matrix arithmetic.

Additionally, IC 102 and one or more memory 104 may be coupled to storage device 106, and a network interface device 108. In some embodiments, the storage device 106 may comprise a hard drive, solid state disk, memory stick, optical disc, etc. The storage device 106 may comprise a non-transitory computer readable storage medium on which programs executable by IC 102 may be stored and accessed when needed by IC 102. Storage device 106 is not restricted to being comprised of only one type of memory. For example, in some embodiments, storage device 106 may comprise memory 106a and memory 106b used as a buffer for a solid state disk (storage device 106). Memory 106a may be a buffer for memory 106b which is a buffer for storage device 106.

Programs stored on the storage device 106 may comprise programs to implement various processes on the computer system 100. In some cases, the programs are copied from the storage device 106 to the memory 104, and the programs are executed from the memory 104. Thus, both the memory 104 and storage device 106 shall be considered computer-readable storage mediums.

In various embodiments, network interface device 108 may allow computer system 100 to exchange data over a wireless or wired network. In some embodiments, the computer system 100 may be connected to a plurality of other computers within a shared network.

Additionally, although a computing system 100 has been described to illustrate an environment in which memory in accordance with embodiments described herein may be present, embodiments of memory discussed herein are not limited to this specific environment. For example, memory in accordance with embodiments discussed herein may be used in vehicles, internet appliances, wireless local area network (LAN) hardware, switches, network interface devices, audio players, flash storage cards, televisions, cameras, video recorders, etc.

Turning now to FIGS. 2a-2e, features of various memory in accordance with various embodiments of memory described herein are discussed. Where the memory described herein may be used, for example, in IC 102, memory 104 or storage device 106 are discussed. In particular, block diagrams 201, 203, and 205 illustrate a one transistor (1T) DRAM cell, a two transistor (2T) DRAM cell, and a three transistor (3T) DRAM cell, respectively. In each memory cell, a value $V_{data}$ is stored in a storage node either as a logical 0 ("0") or a logical 1 ("1"). Values for $V_{data}$ are shown in graph 207.

The 1T DRAM memory cell 201, comprises a transistor 209 connected in series with a capacitor 211. A gate terminal of the transistor 209 is connected to a word line (WL) 213, while a source or drain terminal of the transistor 209 is connected to the bit line (BL) 215.

The 1T DRAM memory cell 201 stores data $V_{data}$ at a storage node between the transistor 209 and capacitor 211. During operation, BL 215 is charged to a level V/2 and during a read operation, the voltage of the BL 215 will change by delta V (i.e., ΔV). That is, during a read operation, the voltage of BL 215 will either increase or decrease relative to V/2 by an amount ΔV, indicating the logical value stored in the memory cell. Characteristics of WL 213, and the BL 215 of the 1T DRAM memory cell 201 during a read operation are illustrated by line graphs 217 and 219.

In particular, line graph 217 illustrates voltage values of the WL 213 during a read operation, and line graph 219 illustrates voltage values of the BL 219 during the same read operation. At time $t_1$, the voltage level of the word line 213 increases. After a time delay, at a subsequent time $t_2$, the voltage level of the BL 219 begins to either increase or decrease, depending on the logical value stored in the memory cell. At time $t_3$, the voltage value of BL 315 reaches a threshold voltage value sufficient to be processed and interpreted as a logical "0" or "1".

A 2T DRAM memory cell 203 comprises two transistors 221 and 223 where a drain terminal of transistor 221 is connected to the gate terminal of the transistor 223. $V_{data}$ is also stored at a storage node comprising a connection between transistor 221 and transistor 223. A write word line 225 is connected to the gate terminal of transistor 221, while a write bit line 227 is connected to the source terminal of transistor 221. The source and drain terminals of transistor 223 are connected to read bit line 229 and read word line 231.

Of note, the source and drain terminals in any NMOS transistor discussed herein are interchangeable. Accordingly, if one example describes a configuration identifying a source and drain terminal, embodiments in which the source and drain terminal designations are switched are also contemplated. Furthermore, embodiments described herein are in accordance with implementations using NMOS transistors. Implementations using PMOS transistors are also contemplated and descriptions complementary to those provided herein as also contemplated.

Depicted in line graph 233, the voltage levels on read word line 231 during a read operation are shown and corresponding voltage level on read bit line 229 are shown in line graph 235. Initially, at time $t_4$, the voltage levels of the read word line 231 and read bit line 229 are "high", or some value above 0V.

In relation to voltages present at the terminals of a transistor, a "high" value may correspond to a logical "1" value. A "high" value may correspond to a "VDD" voltage value. A "low" value as referenced herein, may correspond to a voltage value that introduces a potential difference between a "high" value sufficient to keep a transistor off. The "high" value may be present at a drain terminal, while the "low" value is present at the source terminal of a transistor. In one example, the "low" value may be any voltage value that is lower than the "high" value by a threshold voltage amount, where the threshold voltage defines the minimum potential difference (voltage) needed between two terminals to keep a transistor off. Thus, a "low" value is not necessarily zero, although it may be zero in some embodiments.

Continuing the discussion of line graph 233, subsequent to time $t_4$, during a read operation, the read word line voltage level is dropped below the initial "high" value. At time $t_5$, the read word line voltage level reaches a "low" level. After a time delay and subsequent to time $t_5$, the read bit line voltage level may remain unchanged (stay "high") or begin changing to a "low" level (time $t_6$) depending on the value of $V_{data}$. Whether or not the read bit line voltage level stays the same or shifts indicates the value of $V_{data}$ stored in the memory cell. At time $t_7$, the read word line voltage level is returned to the initial "high" level.

A 3T DRAM memory cell 205 comprises three transistors 237, 239, and 241. Two transistors 239 and 241 are connected in series while a drain terminal of transistor 237 is connected to a gate terminal of transistor 239. $V_{data}$ is stored at the node where the drain terminal of transistor 237 is connected to the gate terminal of transistor 239. A source terminal of transistor 237 is connected to a write bit line 243, while a write word line 245 is connected to a gate terminal of transistor 237. A read word line 247 is connected to a gate terminal of transistor 241, while a drain terminal of transistor 241 is connected to a read bit line 249.

Depicted in line graph 251, the voltage levels on read word line 247 during a read operation are shown and corresponding voltage levels on read bit line 253 are shown in line graph 253. Initially at time $t_8$, the read word line voltage level starts out "low" while the read bit line voltage level starts out "high." During a read operation at time $t_9$, the voltage level on read word line 251 is increased. Subsequently after a time delay, at time $t_{10}$, depending on the value stored as $V_{data}$, the voltage level of read bit line 249 will remain unchanged or drop. At time $t_{11}$, the voltage level on the read word line 247 is returned to a "low" level.

As illustrated in line graphs 219, 235, and 253, changes in voltages on the read bit lines are gradual and occur after a time delay. The rate of change of the voltage may vary based on characteristics of a transistor and an amount of voltage on the gate terminal. Additionally, the amount of voltage on the gate terminal also correlates to the amount of current that will flow through the transistor.

Figure 2A:
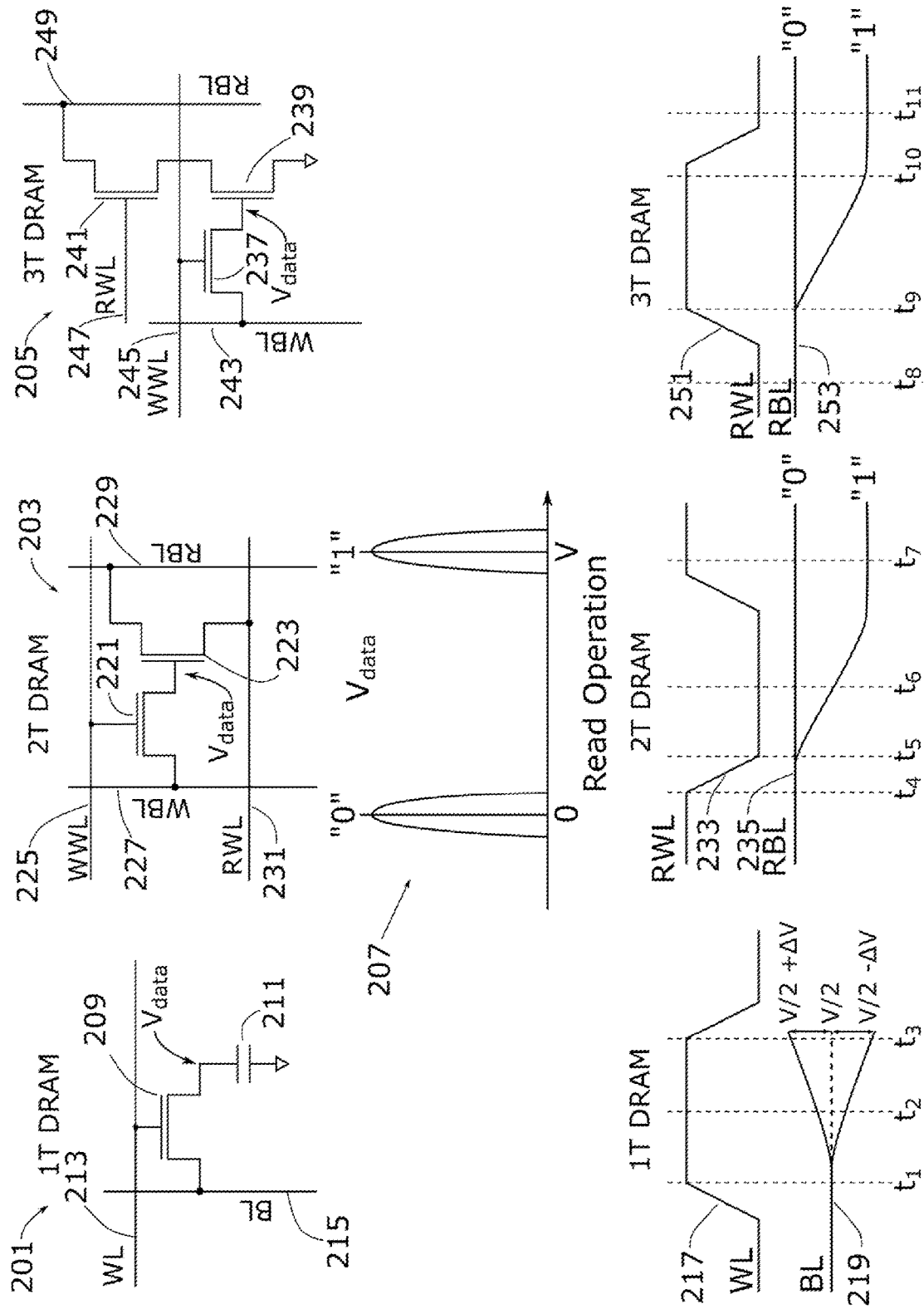
FIG. 2a shows, in partial block diagram form, DRAM memory cells and characteristics associated with each type of DRAM memory cell.

Features of various memory in accordance with various embodiments of memory described herein are discussed. Where the memory described herein may be used, for example, in IC 102, memory 104 or storage device 106 are discussed. In particular, in FIG. 2b, block diagram 261 illustrates non-volatile memory cells configured in a particular arrangement. The non-volatile memory cells illustrated in FIG. 2b are floating gate memory cells configured in a NAND gate arrangement and each individual memory cell is capable of storing 2 bit data as illustrated in the line graph 271 and 64 of these floating gate non-volatile memory cells 267 connected in series with access control transistors $M_{DL}$ and $M_{SL}$ to couple to bit line and source line respectively. Each of these 64 memory cells 267 have a separate word line 269 from WL<0> to WL<63> and coupled to their respective control signal. The word line signal is used to perform the read and write access along with the control signals DSL and SSL.

The line graph 271 illustrates the 2 bit data value stored as a threshold voltage programmed into a memory cell 267 and the voltage value of the word line signal during the read operation. The $V_{read0}$, $V_{read1}$, and $V_{read2}$, are a possible voltage value during the read operation of a particular memory cell 267 in the block 271 and all other memory cells 267 in the block 271 have their word line signal at $V_{pass}$ voltage value.

Figure 2C:
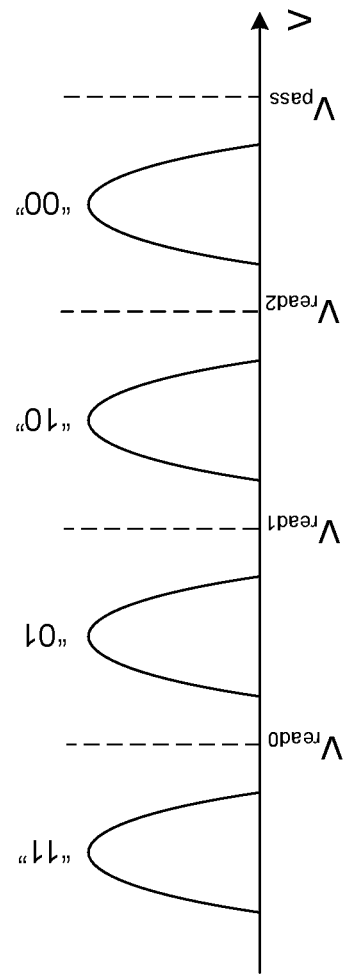
FIGS. 2b-2c each shows a plurality of memory cells in a NAND arrangement and a corresponding read operation word line voltage, respectively, in accordance with at least some embodiments.
Figure 2B:
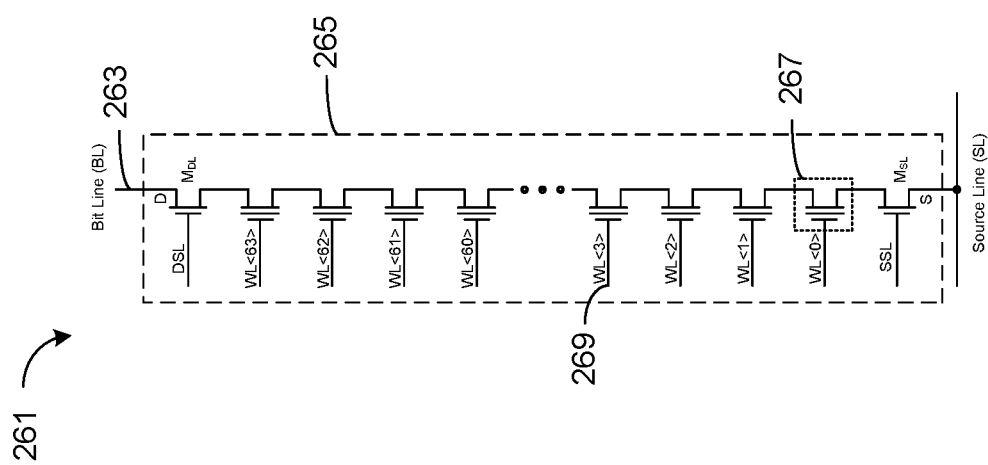
Figure 2E:
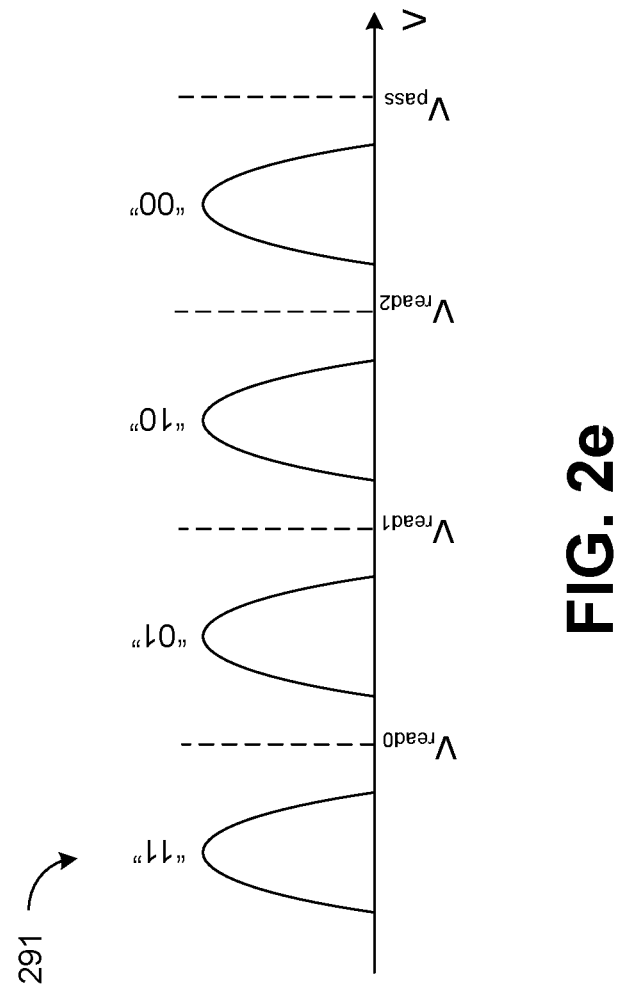
FIGS. 2d-2e each shows a memory cell and a corresponding read operation word line voltage, respectively, in accordance with at least some embodiments.
Figure 2D:
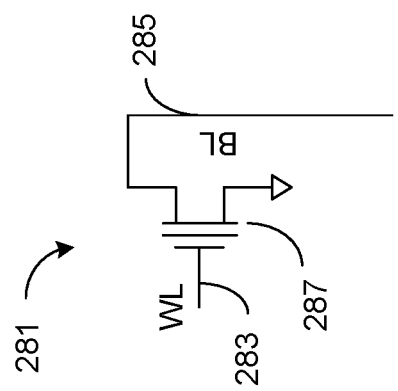

Turning now to FIG. 2c, features of various memory in accordance with various embodiments of memory described herein are discussed. Where the memory described herein may be used, for example, in IC 102, memory 104 or storage device 106 are discussed. In particular, block diagram 281 (FIG. 2d) illustrate non-volatile memory cell 287 configured in a particular arrangement. The non-volatile memory cell illustrated in FIG. 2d is a floating gate memory cell configured in a NOR gate arrangement and each individual memory cell is capable of storing 2 bit data as illustrated in the line graph 291. The word line signal WL 283 is coupled to a control signal to perform the read and write access of the memory cell 287.

The line graph 291 illustrates the 2 bit data value stored as a threshold voltage programmed into a memory cell 287 and the voltage value of the word line signal during the read operation. The $V_{read0}$, $V_{read1}$, and $V_{read2}$, are a possible voltage value during the read operation of a particular memory cell 287.

Figure 3:
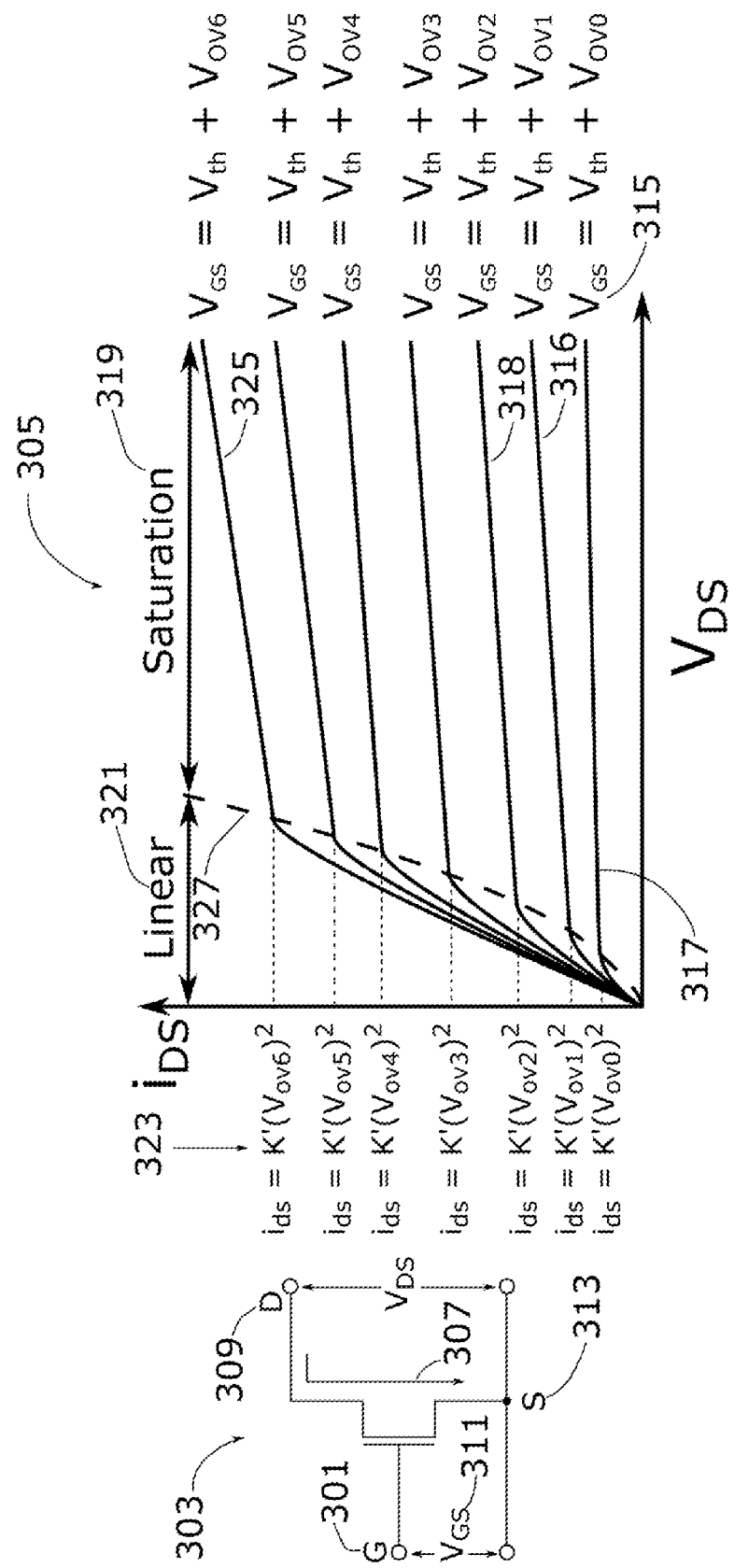
FIG. 3 shows an example graph depicting a relationship between current and voltage in a transistor.

Turning now to FIG. 3, current voltage characteristics of a transistor as well as a block diagram of a transistor are described. Current flow shown in transistor 303 is shown using conventional flow notation, as opposed to electron flow notation. In particular, the amount of voltage applied at a gate terminal 301 of transistor 303 may determine the amount of current 305 flowing through the transistor. The following characteristics as discussed in graph 305 of transistor 303 may be used to store multiple values in a single memory cell as described herein.

In the various configurations of a DRAM memory cell, discussed in FIG. 2, a read bit line (e.g., 215, 229, 249) is connected to a drain or source terminal of a transistor. Transistor 303 may represent any of the transistors 209, 223, and 241, where a read bit line is connected to a drain terminal 309. When a sufficient gate voltage 311 is applied to gate terminal 301, to turn on transistor 303, current 307 begins to flow from the drain terminal 309 to the source terminal 313.

As mentioned previously, the source and drain terminals of a typical negative-channel metal-oxide (NMOS) transistor, such as transistor 303, are interchangeable. The source and drain terminals may be referred to as conduction electrodes. Given a sufficient voltage such as a voltage amount greater than a threshold voltage amount is applied at gate terminal 301, current will flow between the conduction electrodes based on whether one conduction electrode is at a lower potential in relation to the other conduction electrode. In an example scenario where sufficient voltage is applied to gate terminal 301, if no potential difference is present between the conduction electrodes, current will not flow between the conduction electrodes.

In application, a source or drain designation assigned to a respective conduction electrode may reflect a given state of the transistor and the direction of current flow between two conduction electrodes. In some scenarios, the drain terminal is at a higher potential than the source terminal. However, the source and drain designations assigned within this document are not meant to imply a direction of current flow for a given example described herein. To ease discussion, in the examples discussed herein, one conduction electrode of a transistor has been labeled a drain terminal and the other terminal labeled a source terminal. For a given example where respective conduction electrodes have been designated as source and drain, embodiments where the source and drain designations are switched from what is described herein, are contemplated as well.

Continuing the discussion of transistor 303, as a read bit line (e.g., 215, 229, or 249) is connected to a drain or source terminal, the current flowing between the drain and source terminals of a transistor (e.g., transistor 209, 223, 239, 241)

may correspond to a bit line discharging. The amount of voltage 311 applied at a gate terminal of a transistor with respect to a source terminal or the amount of voltage 311 applied at a source terminal of a transistor with respect to a gate terminal may also determine the amount of time taken and the rate of discharge, of a bit line for example. For example, in a 1T or 3T DRAM cell, a voltage is applied at a gate terminal with respect to a source terminal. In a 2T DRAM cell, voltage is applied at a source terminal with respect to a gate terminal. Accordingly, based on a measured time delay for a bit line to discharge, the multiple values may be measured and detected.

In graph 305, the x-axis represents voltage values across the source and drain terminals (313 and 309, respectively) of transistor 303, while the y-axis represents an amount of current 307 flowing between the source and drain terminals (313 and 309). In graph 305, the different $V_{GS}$ curves (e.g., 317, 316, 318, and 325), represent different voltage amounts $V_{GS}$ applied at gate terminal 301 and corresponding current ($i_{DS}$) and voltage ($V_{DS}$) characteristics for each $V_{GS}$.

As shown by the different $V_{GS}$ curves, different voltage amounts applied to gate terminal 301 may determine an amount of current flowing through transistor 303 and an amount of voltage measured across the source and drain terminals (313 and 309). For example $V_{GS}$ curve 317 depicts the amount of current that may flow through transistor 303, for a particular $V_{GS}$ level 315 and as the voltage across the source and drain terminals is increased ($V_{DS}$).

Each $V_{GS}$ voltage level is set above the threshold voltage ($V_{th}$) by an amount defined as the overdrive voltage (e.g., $V_{OV1}$), where $V_{OV6}$ represents an amount greater than $V_{OV0}$. Accordingly, the $V_{GS}$ level equaling the threshold voltage plus $V_{OV6}$ is greater than the $V_{GS}$ level equaling the threshold voltage plus $V_{OV0}$. For a given $V_{GS}$ level, the amount of current flowing through the transistor 303 increases as $V_{DS}$ is increased initially (linear region of operation 321).

After some value of $V_{DS}$ is reached, for each $V_{GS}$ curve, additional increases in $V_{DS}$ do not substantially impact the current ($i_{DS}$) flowing through transistor 303 and the transistor is considered to be operating in a saturation region of operation 319. Changes in $V_{DS}$ have more influence on the current flowing through transistor 303 in the linear region of operation 321. For each $V_{GS}$ curve, the transition between modes of operation from the linear region of operation 321 to the saturation region of operation 319 is marked by dashed line 327.

As shown in graph 305, $i_{DS}$ is a function of the overdrive voltage ($V_{OV}$), which is the amount by which the gate-to-source voltage ($V_{GS}$) exceeds the threshold voltage ($V_{th}$). In particular, as shown in column 323, taking curve 317 as an example:

$$i_{DS} = K'(V_{OV0})^2 \quad (1)$$

where K' is a parameter further representing technology and device parameter constants of the transistor, more specifically:

$$K' = \mu_n C_{ox}(W/L) \quad (2)$$

where $\mu_n$ represents surface mobility, $C_{ox}$ represents gate oxide capacitance per unit area, W is a width of the transistor, and L represents a length of the transistor.

Based on the $V_{GS}$ value applied at the gate terminal 311, transistor 303 may behave differently and according to the various $V_{GS}$ curves (i.e., curves 316, 317, 318, and 325) shown in graph 305. Thus, transistor 303 may operate as a variable resistor, where the amount and rate of change of $i_{DS}$ (in the linear region of operation 321) is different for each curve. In particular, during a given read operation, where a read bit line is connected to a source or drain of transistor 303, the value of the gate voltage ($V_{GS}$) dictates the $i_{DS}$ vs. $V_{DS}$ curve that is representative of the amount of $i_{DS}$ flowing through transistor 303. The value of the gate voltage ($V_{GS}$) may determine the rate at which a read line may discharge. In various embodiments, a measure of the time taken to discharge a read bit line may be used to determine a particular voltage or value that is stored in a memory cell.

Figure 4A:
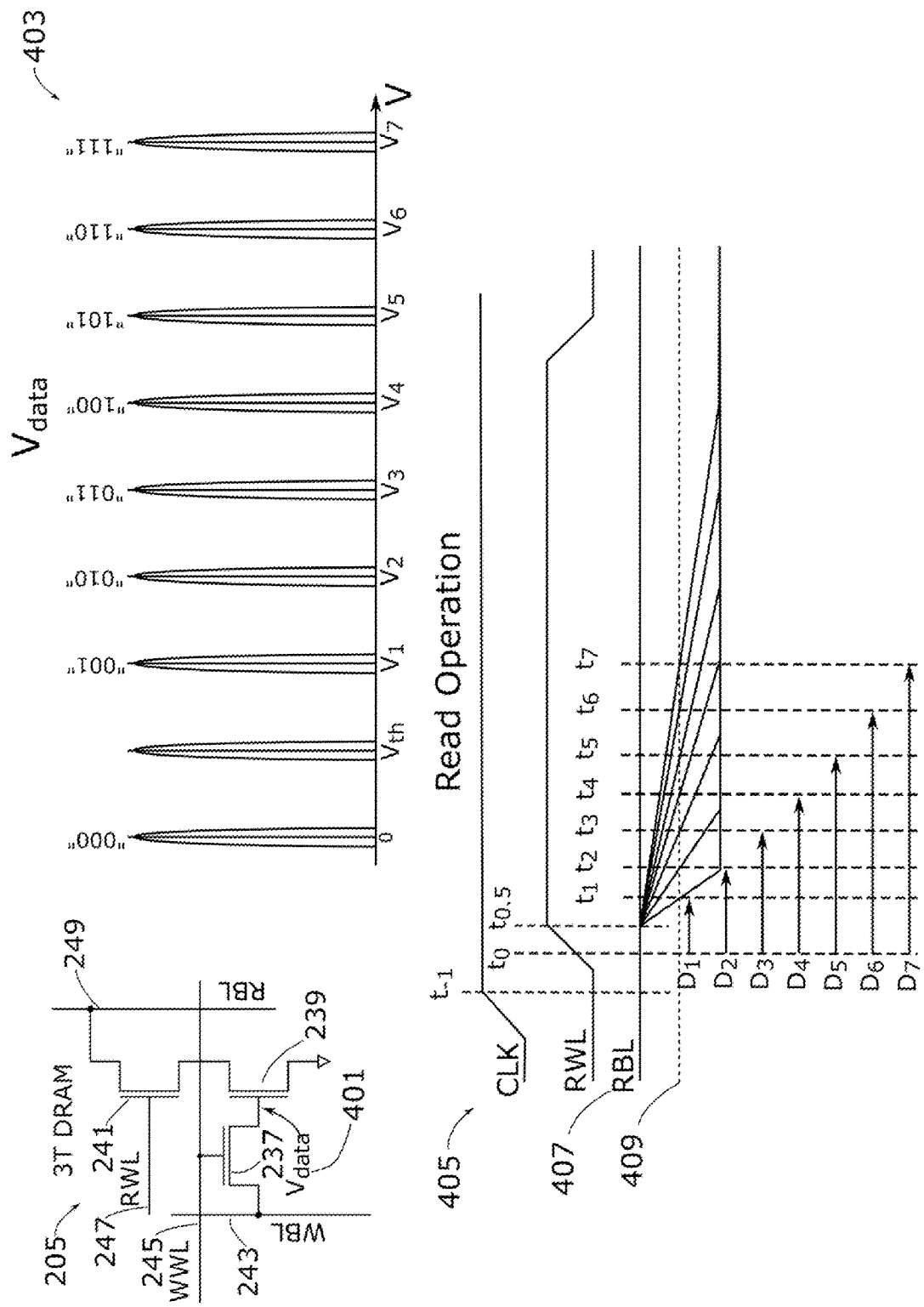
FIG. 4a shows a DRAM memory cell and a corresponding read operation in accordance with at least some embodiments.

Turning now to FIG. 4a, a memory cell in accordance with various embodiments is discussed. The rate at which a voltage change occurs may be used to discern the value stored within the memory cell. Taking a three transistor (3T) DRAM cell (205) as an example, a method for storing multiple values in the memory cell is described.

In this example, eight logical values 0-7 for $V_{data}$, represented in binary nomenclature in graph 403 may be programmed into the 3T DRAM cell 205. In graph 403, a voltage value is represented along the x-axis. Each logical value is stored as a different voltage value.

For example, the logical value "0" may be stored as a voltage value around zero volts, the logical value "1" may be stored approximately as a voltage value "$V_1$". The logical value "2" may be stored approximately as voltage value "$V_2$" where the value of "$V_2$" is higher than "$V_1$", and the remaining logical values may be programmed accordingly where successive logical values are programmed as increasingly larger voltage values.

During operation of the 3T DRAM cell 205, the voltage value representing each logical value may not be exactly zero or "$V_1$", "$V_2$", etc. Instead, the voltage value may be within some voltage value above or below the targeted voltage values of zero, "$V_1$", "$V_2$", for example. Accordingly, voltage values that may register as a particular logical value are represented as an individual bell curve in graph 403. Each bell curve captures a potential distribution of voltage values that may correspond to a respective logical value.

The manner in which the voltage values are assigned to represent different logical values is not limited to this example and other assigning schemes may be used. That is, the assignment scheme between a voltage value and a corresponding logical value is discussed for the purpose of illustrating an embodiment and is not meant to be limiting of the type of assigning scheme that may be used. For example, the logical value "0" may be stored as a voltage value "0" while the logical value "7" is stored as a voltage value "$V_7$". Graph 403 captures one example way in which different voltage values may be used to represent different logical values. Additionally, any assigning scheme discussed in the document is considered an example and shall not constitute a limiting example.

During a read operation of the 3T DRAM cell 205, at time $t_{-1}$, a clock may go high, as represented in line graph 405. Next at time $t_{-0.5}$, the read word line (RWL) goes high. Subsequently, the amount of $i_{DS}$ flowing through transistor 239 and the rate of change of $i_{DS}$ depends on the voltage value of $V_{data}$ 401.

The manner and rate at which the bit line discharges depends on the voltage value of $V_{data}$ 401, where $V_{data}$ 401 is stored at a storage node. Recall the different $V_{GS}$ curves shown in graph 305 for different values of $V_{GS}$. The higher voltage value of $V_{GS}$ (curve 325) would correspond to a faster discharge rate of the bit line than a lower voltage value of $V_{GS}$, such as curve 317. That is, if a voltage value of "$V_7$" is stored as $V_{data}$, (in this example "$V_7$" may follow the curve represented by curve 325 in graph 305), the discharge may occur at time to. As "$V_7$" may follow the curve 325 (graph 305), the discharge may occur sooner than the other $V_{GS}$ curves in graph 305.

In detecting a bit line discharge, the bit line is considered sufficiently discharged after it has reached a predetermined threshold. Various circuitry may be used to assess the voltage level of the bit line and make a determination as to whether the bit line has sufficiently discharged. For example, a voltage comparator may be utilized to compare the bit line to a reference voltage, such as a reference voltage provided by a bandgap reference circuit, or other reference voltage. In another example, a "skewed" inverter having a higher than usual trip point may be utilized. Such a skewed inverter may be implemented by sizing the PMOS transistor to be stronger than the NMOS transistor.

In some embodiments, a strobe clock may be programmed to fire during a predefined time window, where an indicator is captured during the predefined time window. The indicator may be produced by the various circuitry used to assess the voltage level of the bit line. In some embodiments, the various circuitry may comprise a comparator, circuitry capable of capturing a voltage level of the bit line, etc. Thus the indicator may comprise various forms. For example, the indicator may be a value output by the comparator, or the value may reflect the voltage value of the bit line. Overall, the indicator contains data that may be used to determine whether a voltage level of the bit line has fallen below a predetermined threshold amount.

In the example of voltage value of "$V_7$" is stored as $V_{data}$, the time delay from the read word line "RWL" 407 going high to the read bit line "RBL" 409 discharging to a predetermined threshold level at time $t_1$ is indicated by time delay $D_1$ from time $t_0$ to time $t_1$.

In the examples discussed herein, the read word line "RWL" and word line are interchangeable and imply a control signal to enable the read operation of the memory cell and does not limit the example or the application. In one embodiment read word line "RWL" refers to the word line. Similarly the read bit line "RBL" and bit line are interchangeable and imply the output of the memory cell used during the read operation and does not limit the example or the application.

In another example, if $V_{data}$ is a voltage value of "$V_6$" with a voltage level lower than the voltage value of "$V_7$", the "$V_6$" voltage level may take longer to discharge the bit line than if "$V_7$" were stored as $V_{data}$. Accordingly, the bit line may discharge around time $t_2$ subsequent to time to and indicated the by time delay $D_2$ from time $t_0$ to time $t_2$.

Overall, the lower the voltage level of a stored $V_{data}$, the longer it may take a bit line to discharge. Accordingly, in the example provided in FIG. 4a, $V_{data}$ 401 with a voltage level of "$V_7$" will experience a bit line that is sufficiently discharged, or a bit line that has reached a predetermined threshold voltage, around time $t_1$. $V_{data}$ 401 with a voltage level of "$V_6$" will experience a bit line that is sufficiently discharged, or a bit line that has reached a predetermined threshold voltage, around time $t_2$. $V_{data}$ 401 with a voltage level of "$V_5$" will experience a bit line that is sufficiently discharged, or a bit line that has reached a predetermined threshold voltage around time $t_3$. $V_{data}$ 401 with a voltage level of "$V_4$" will experience a bit line that is sufficiently discharged, or a bit line that has reached a predetermined threshold voltage around time $t_4$, so on and so forth. For the case where $V_{data}$ 401 is equal to zero volts, the read bit line will continue to stay high. Accordingly, a read bit line that continues to stay high for a set time quantity may indicate that $V_{data}$ 401 is equal to zero volts.

As briefly mentioned previously, in order to detect the span of time taken by the bit line to sufficiently discharge, or has reached a predetermined threshold voltage, a strobe clock or a plurality of strobe clocks may be coupled to the bit line. Each of the plurality of strobe clocks is set to fire at different time windows and cause surrounding circuitry to strobe the bit line or a comparator connected to the bit line to determine whether sufficient discharge has occurred. Upon detecting that a bit line voltage has fallen below the predetermined voltage level, the corresponding strobe clock may dictate the time window within which an indicator is captured. Based on the specific strobe clock that captures an indicator reflecting that the bit line has fallen below a predetermined threshold amount, surrounding circuitry may determine the span of time the bit line has taken to discharge to the predetermined threshold voltage as indicated time span $D_1$, $D_2$, $D_3$, $D_4$, $D_5$, $D_6$, and $D_7$.

Whether or not sufficient discharge has occurred may be determined by any known method in art. For example, a determination may be made that sufficient discharge has occurred by checking a state of a comparator connected to read bit line 249. The voltage level of the read bit line 249 may be compared to a predetermined threshold amount to assess whether read bit line 249 has discharged a sufficient amount.

Based on a length of time taken for a bit line to discharge sufficiently, surrounding circuitry may determine the voltage value of $V_{data}$ stored in the memory cell, which in turn is correlated to a logical value. In the situation where $V_{data}$ is equal to zero volts, the surrounding circuitry may determine $V_{data}$ is zero volts after detecting the bit line remains high for a time quantity that is greater than a predetermined threshold amount of time. The concept of correlating a time window for discharge to a voltage value and in turn a logical value may be applied to other types of memory cells such as a 2T or 1T DRAM cell or any other non-volatile memory cells.

Figure 4B:
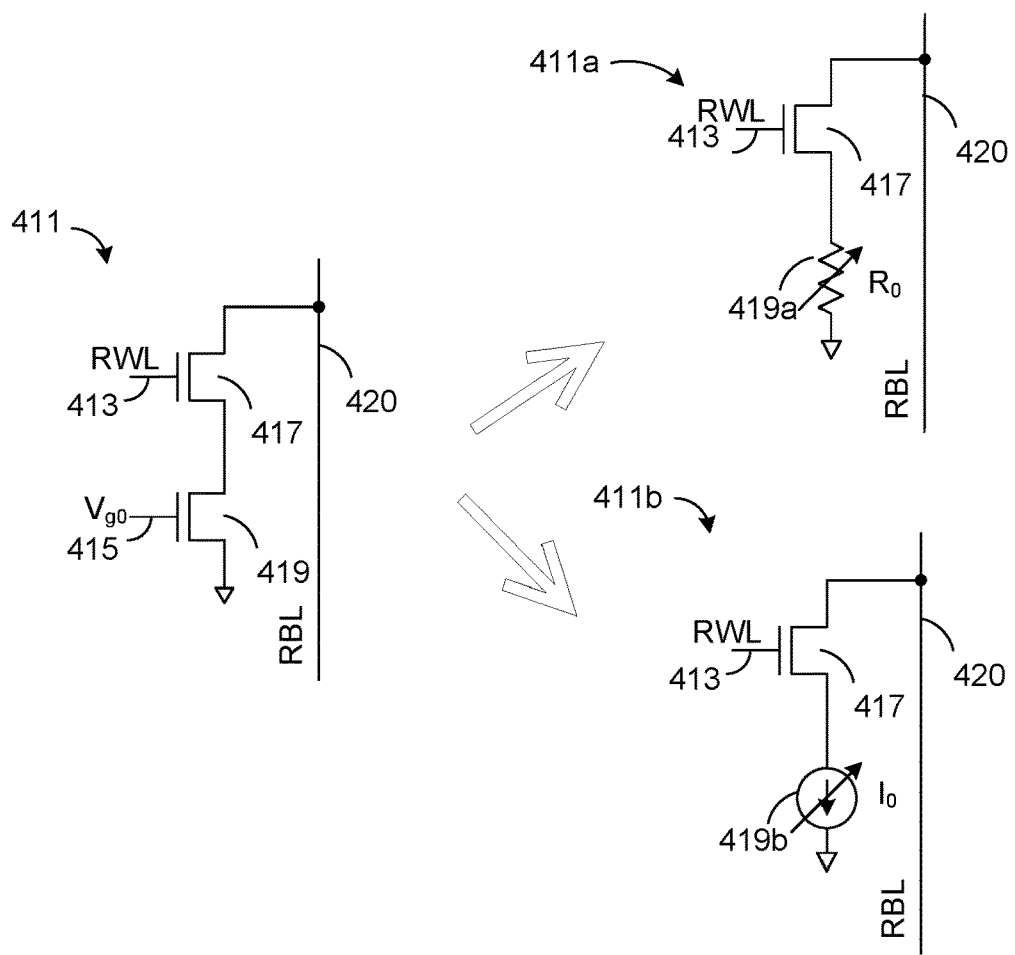
FIG. 4b shows a memory cell read port and a corresponding equivalent read port model in accordance with at least some embodiments.

Turning now to FIG. 4b, 411 illustrates a NMOS read stack comprising of NMOS transistor 417 and 419. For ease of the discussion NMOS read stack is illustrated and discussed, and it applicable for a PMOS read stack as well. The NMOS read stack and PMOS read stack are interchangeable without affecting the read operation being discussed. The control electrode of the NMOS transistor 417 is coupled to a read word line RWL 413 and the drain electrode of the NMOS transistor 417 is coupled to a read bit line RBL 420 and the source electrode of the NMOS transistor 417 is coupled to the drain electrode of the NMOS transistor 419. The control electrode of the NMOS transistor is coupled to a data storage node for example $V_{data}$ 401 in FIG. 4a and represented by $V_{g0}$ 415.

An equivalent model of the NMOS read stack in block diagram 411 is illustrated in block diagram 411a as a variable resistor $R_0$ 419a. The resistance $R_0$ value is dependent on the voltage value of the $V_{g0}$ which represents a logical data value as a voltage value. The variable resistance value of $R_0$ is dependent on the voltage storage at the data node for example 401 in FIG. 4. This equivalent variable resistance $R_0$ affects the discharge rate of the RBL 420 and an equivalent variable resistance $R_0$ of a PMOS affects the charge rate of the RBL 420. The variable rate of RBL 420 transition is correlated to a voltage value of the $V_{g0}$ and in turn to a logical value of the data stored.

Another equivalent model of the NMOS read stack in block diagram 411 is illustrated in block diagram 411b as a variable current sink $I_0$ 419b. The equivalent current sink $I_0$ 419b value is dependent on the bias voltage applied to the control electrode of the 419 in 411 which is $V_{g0}$ 415 and $V_{g0}$ is a voltage value of a logical data value stored at the storage node. The variable current value of the current sink $I_0$ 419b is dependent on the voltage at the data storage node for example 401 in FIG. 4. A current source $I_0$ would be equivalent to a current sink $I_0$ in a PMOS read stack implementation.

Figure 4C:
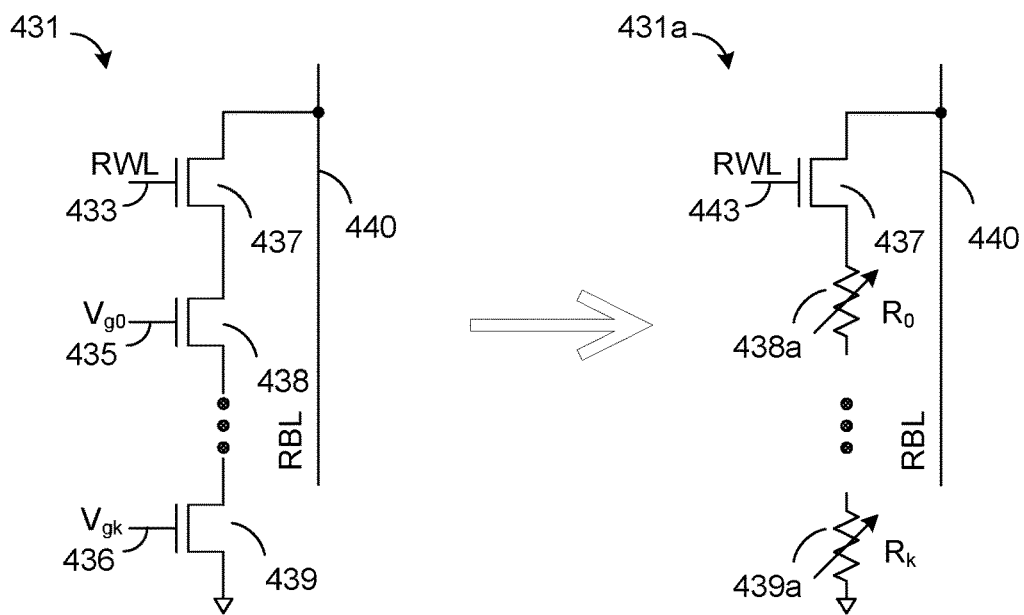
FIG. 4c shows a memory cell read port and a corresponding equivalent read port model in accordance with at least some embodiments.

Now turning to FIG. 4c, the block diagram 431 represents a series of k NMOS transistors configured in a logical NAND gate configuration and control electrode of each NMOS transistor is coupled to a voltage value $V_{g0}, \ldots V_{gk}$ respectively representing a corresponding logical data value. An equivalent representation of the series NMOS transistors in block 431 is as a series of variable resistors $R_0$ 438a, ... $R_K$ 439a is illustrated in block diagram 431a. The value of each variable resistors $R_0$, $R_K$ is dependent on the voltage value of respective voltages $V_{g0}, \ldots V_{gk}$ applied to the control electrode of the NMOS transistors 435, ... 436. The effective resistance is summation of all resistance value and this effective resistance value affects the transition rate of the RBL 440. Since addition is commutative, the effective resistance value is also commutative. This effective resistance variable value affects the transition time of the RBL at a variable rate. This variable rate of discharge and in a PMOS transistor implementation a charge up is correlated to an effective voltage value and in turn to an effective data value. The determination of the effective data value may be based on an output of an arithmetic operation on all the respective logical data values represented as a respective voltage value. For example, the effective logical data determination may be based on logarithmic addition operation of all the respective corresponding voltage values and the effective logical data represents product of multiplication operation.

Figure 4D:
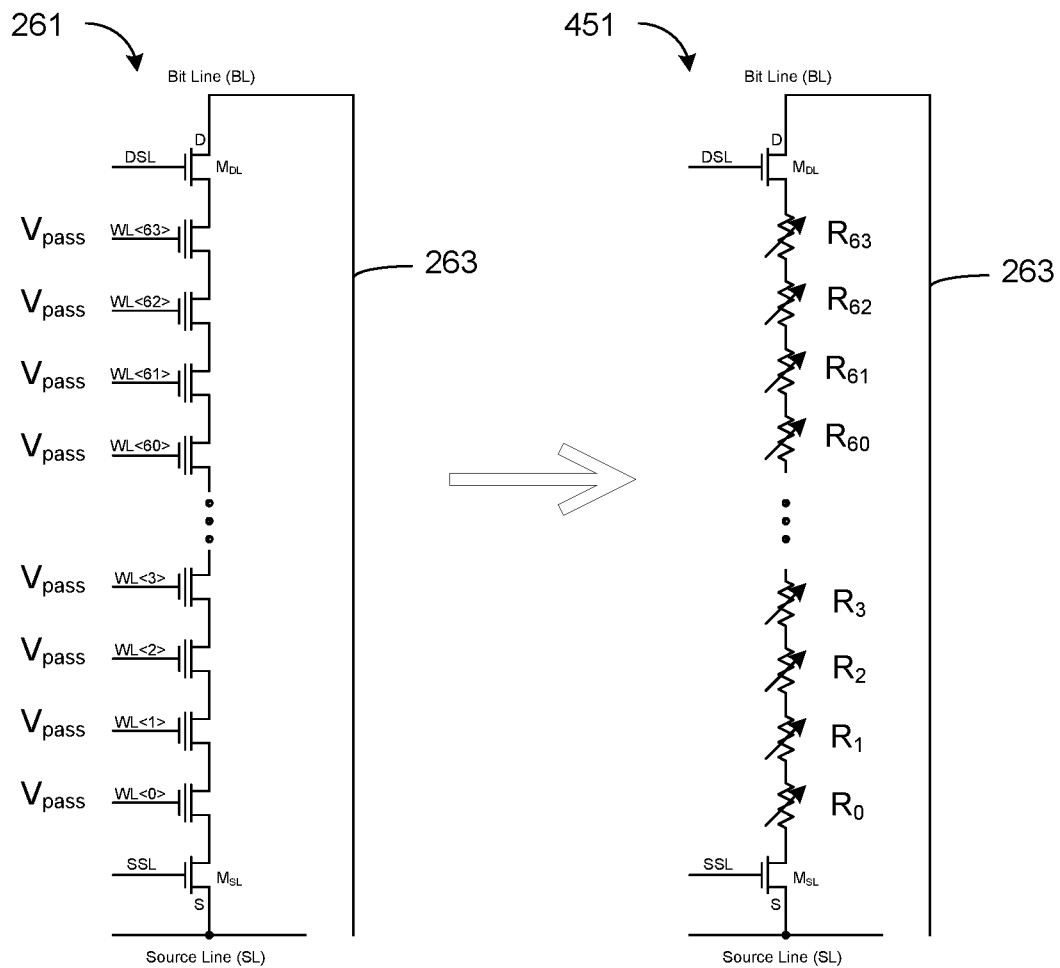
FIG. 4d shows a NAND flash memory cell and a corresponding equivalent model in accordance with at least some embodiments.

Now turning to FIG. 4d, the block diagram 261 represents a NAND flash memory cell with 64 entries where each non-volatile memory cell which is a floating gate transistor represents an entry as discussed in FIG. 2a. The block diagram 451 illustrates an equivalent variable resistors $R_0$, $R_1$, $R_2$, $R_3$, ..., $R_{60}$, $R_{61}$, $R_{62}$, and $R_{63}$ connected in series and each variable resistor value corresponds to the threshold voltage programmed in each corresponding floating transistor in block diagram 261. The voltage value of the control voltage applied to respective floating gate transistor is $V_{pass}$ as illustrated in line diagram 271 in FIG. 26. The variable rate of discharge is correlated to an effective voltage value and in turn to an effective data value. The determination of the effective data value may be based on an output of an arithmetic operation on all the respective logical data values represented as a respective voltage value. For example, the effective logical data determination may be based on logarithmic addition operation of all the respective corresponding voltage values and the effective logical data represents product of multiplication operation.

Figure 4E:
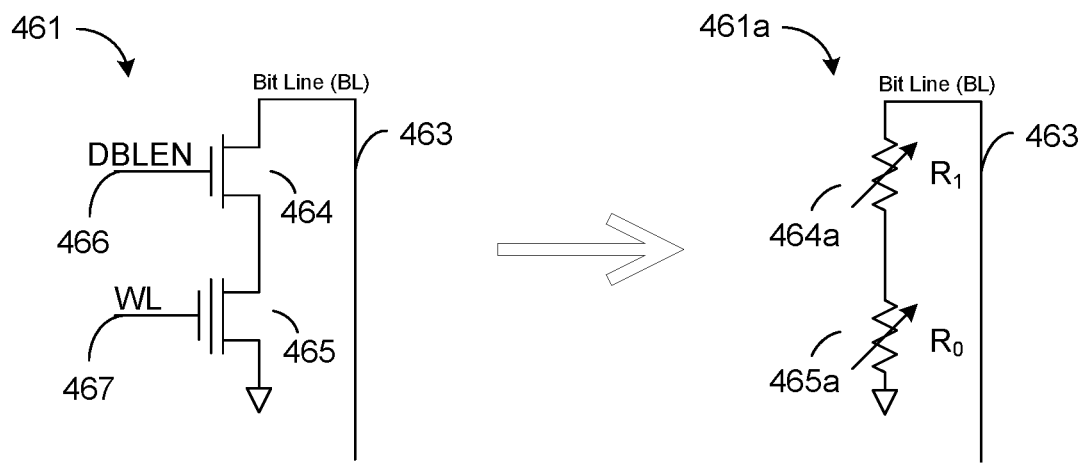
FIG. 4e shows a non-volatile memory cell and a transistor circuit and a corresponding equivalent model in accordance with at least some embodiments.

Now turning to FIG. 4e, the block diagram 461 illustrates a floating gate transistor 465 is coupled to a NMOS transistor 464 in series configuration. The floating gate transistor 465 has a data programmed in as a threshold voltage as discussed in FIG. 2c and the word line WL 467 is applied a voltage value of $V_{pass}$. The NMOS transistor 464 has the control electrode coupled to DBLEN 466 and during a read operation, a voltage great the than the threshold voltage of NMOS transistor 464 is applied. The voltage applied to DBLEN is equivalent to $V_{g0}$ 415 of NMOS 419 in FIG. 4b. The block diagram 461a illustrates the equivalent variable resistors $R_1$ 464a and $R_0$ 465a in series for transistors 464 and 465 respectively. The variable rate of discharge is correlated to an effective voltage value and in turn to an effective data value. The determination of the effective data value may be based on an output of an arithmetic operation on all the respective logical data values represented as a respective voltage value. For example, the effective data determination may be based on logarithmic addition operation of all the respective corresponding voltage values and the effective data value represents product of multiplication operation. In this FIG. 4e, for example the voltage value applied to DBLEN 466 represent a data value "a" in a logarithmic representation and the data value stored in 465 be "b" in a logarithmic representation. The summation of equivalent resistors $R_1$ and $R_0$ to $R_{sum}$ is logarithmic addition of data value "a" and "b" resulting in logarithmic multiplication of "a" and "b". The logarithmic base number can be any suitable numeric value and the effective data value determination may include anti-logarithmic to convert to a product value. This provides an output of a multiplicative operation of two data values.

$$R_{sum}=R_1+R_0 \quad (3)$$

$$R_{sum}=\log(a)+\log(b)=\log(ab) \quad (4)$$

The transistors 464 and 465 may of same type in another embodiment and for example, NMOS transistors in series. The voltage value applied to the respective control electrode represent a data value. The effective data value determined based on variable rate of transition time is multiplication operation output of the respective data values.

Figure 4F:
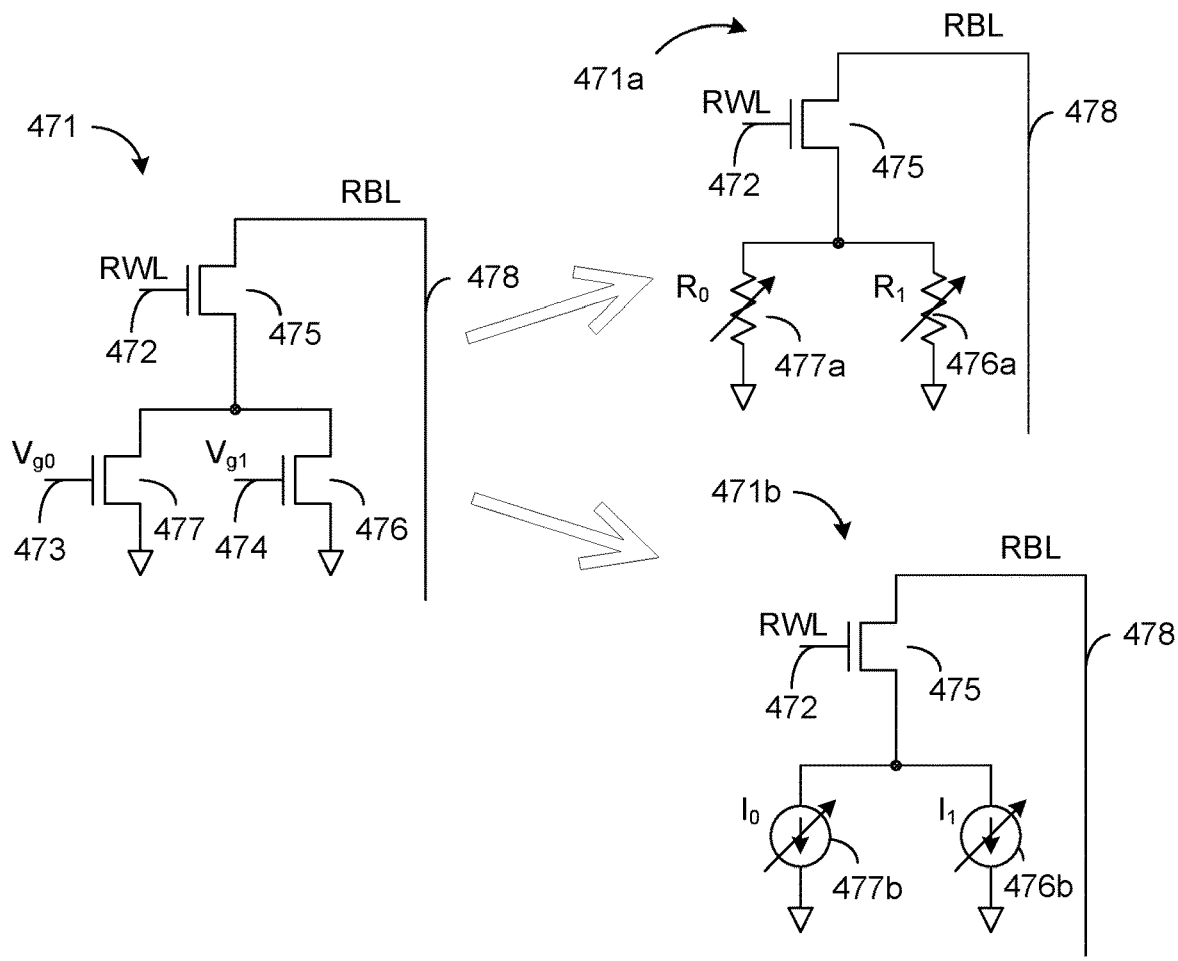
FIG. 4f shows a memory cell read port and a corresponding equivalent model in accordance with at least some embodiments.

Now turning to FIG. 4f, the block diagram 471 represents two data storage nodes $V_{g0}$ and $V_{g1}$ in a NOR configuration. The transistor 475 is the access transistor and transistors 476 and 477 are coupled to their respective data storage node. The block diagram 471a illustrates an equivalent variable resistors $R_0$ 477a and $R_1$ 476a in a parallel configuration. The effective resistance is parallel resistor summation and this in turns effects a variable rate of transition of the RBL 478. The variable rate of transition is correlated to an effective data value based on a function operation. For example, the variable resistor $R_0$ and $R_1$ represent logarithmic data value "a" and "b" respectively. Then the effective resistance $R_{sum}$ can be represented by the following equations $$R_{sum} = \frac{R_0 + R_1}{R_0 R_1} \quad (5)$$

$$R_{sum} = \frac{\log(a) + \log(b)}{\log(a)\log(b)} \quad (6)$$

The block diagram 471b illustrates another equivalent representation with variable current sink $I_0$ 477b and $I_1$ 476. The total current sunk by the two variable current source is $$I_{total}=I_0+I_1 \quad (7)$$

The total current sunk is correlated to an effective data value. For example, $I_0$ and $I_1$ represent logarithmic data value, the total current represents a logarithmic multiplication of the data values represented by $I_0$ and $I_1$. The determination of the effective data value may be performed by binary search operation along the RBL 478 by varying a current source coupled to the RBL 478 and making a determination based on the binary search method.

In another embodiment transistors 476 and 477 may of different types or a floating gate transistor of same type. In a floating gate embodiment, the data values are programmed in as their respective threshold voltage value and the word line signal are at $V_{pass}$ voltage as discussed in line graph 291 in FIG. 2d.

Figure 4G:
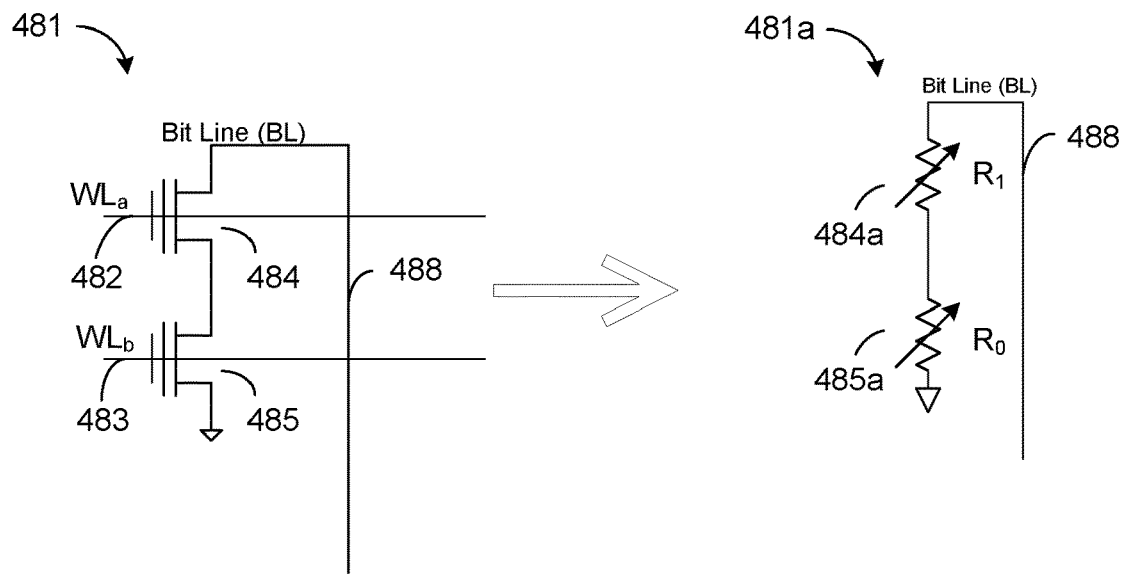
FIG. 4g shows a non-volatile NAND memory cell and a corresponding equivalent model in accordance with at least some embodiments.

Now turning to FIG. 4g, the block diagram 481 illustrates two floating gate transistors 484 and 485 connected in series. This is an alternative embodiment to the block diagram 461 discussed in FIG. 4e. The data is programmed as threshold voltage value in each of the respective floating gate transistors 484 and 485. The control voltage on the word line $WL_a$ and $WL_b$ is $V_{pass}$ as discussed in the line graph 291 in FIG. 2d. The block diagram 481a illustrates an equivalent variable resistors $R_1$ and $R_0$ in a series configuration. The block diagram 481a is equivalent to block diagram 461a in FIG. 4e and the effective data value determination follows the method discussed in FIG. 4e.

In detecting a bit line discharge, the bit line is considered sufficiently discharged after it has reached a predetermined threshold. Various circuitry may be used to assess the voltage level of the bit line and make a determination as to whether the bit line has sufficiently discharged. For example, a voltage comparator may be utilized to compare the bit line to a reference voltage, such as a reference voltage provided by a bandgap reference circuit, or other reference voltage. In another example, a "skewed" inverter having a higher than usual trip point may be utilized. Such a skewed inverter may be implemented by sizing the PMOS transistor to be stronger than the NMOS transistor.

In some embodiments, a strobe clock may be programmed to fire during a predefined time window, where an indicator is captured during the predefined time window. The indicator may be produced by the various circuitry used to assess the voltage level of the bit line. In some embodiments, the various circuitry may comprise a comparator, circuitry capable of capturing a voltage level of the bit line, etc. Thus the indicator may comprise various forms. For example, the indicator may be a value output by the comparator, or the value may reflect the voltage value of the bit line. Overall, the indicator contains data that may be used to determine whether a voltage level of the bit line has fallen below a predetermined threshold amount.

As briefly mentioned previously, in order to detect the span of time taken by the bit line to sufficiently discharge, or has reached a predetermined threshold voltage, a strobe clock or a plurality of strobe clocks may be coupled to the bit line. Each of the plurality of strobe clocks is set to fire at different time windows and cause surrounding circuitry to strobe the bit line or a comparator connected to the bit line to determine whether sufficient discharge has occurred. Upon detecting that a bit line voltage has fallen below the predetermined voltage level, the corresponding strobe clock may dictate the time window within which an indicator is captured. Based on the specific strobe clock that captures an indicator reflecting that the bit line has fallen below a predetermined threshold amount, surrounding circuitry may determine the span of time the bit line has taken to discharge to the predetermined threshold voltage as indicated time span $D_1$, $D_2$, and $D_3$.

Whether or not sufficient discharge has occurred may be determined by any known method in art. For example, a determination may be made that sufficient discharge has occurred by checking a state of a comparator connected to read bit line 249. The voltage level of the read bit line 249 may be compared to a predetermined threshold amount to assess whether read bit line 249 has discharged a sufficient amount.

Based on a length of time taken for a bit line to discharge sufficiently, surrounding circuitry may determine the voltage value of $V_{data}$ stored in the memory cell, which in turn is correlated to a logical value. In the situation where $V_{data}$ is equal to zero volts, the surrounding circuitry may determine $V_{data}$ is zero volts after detecting the bit line remains high for a time quantity that is greater than a predetermined threshold amount of time. The concept of correlating a time window for discharge to a voltage value and in turn a logical value may be applied to other types of memory cells such as a 2T or 1T DRAM cell or any other non-volatile memory cell.

The example three transistor (3T) DRAM discussed in the FIG. 4a and the various memory cell configurations discussed in FIGS. 4b, 4c, 4d, 4e, 4f and 4g show a method for storing multiple values and performing an effective data value read based on 1 bit or multiple bit stored in each individual memory cell. The example in FIG. 4a the three transistor (3T) DRAM stores 3 bit logical value represented by storing eight voltage values. The concept of correlating a time delay to discharging the read bit line to a voltage value and in turn a logical value may be applied to other types of memory cells.

Figure 5A:
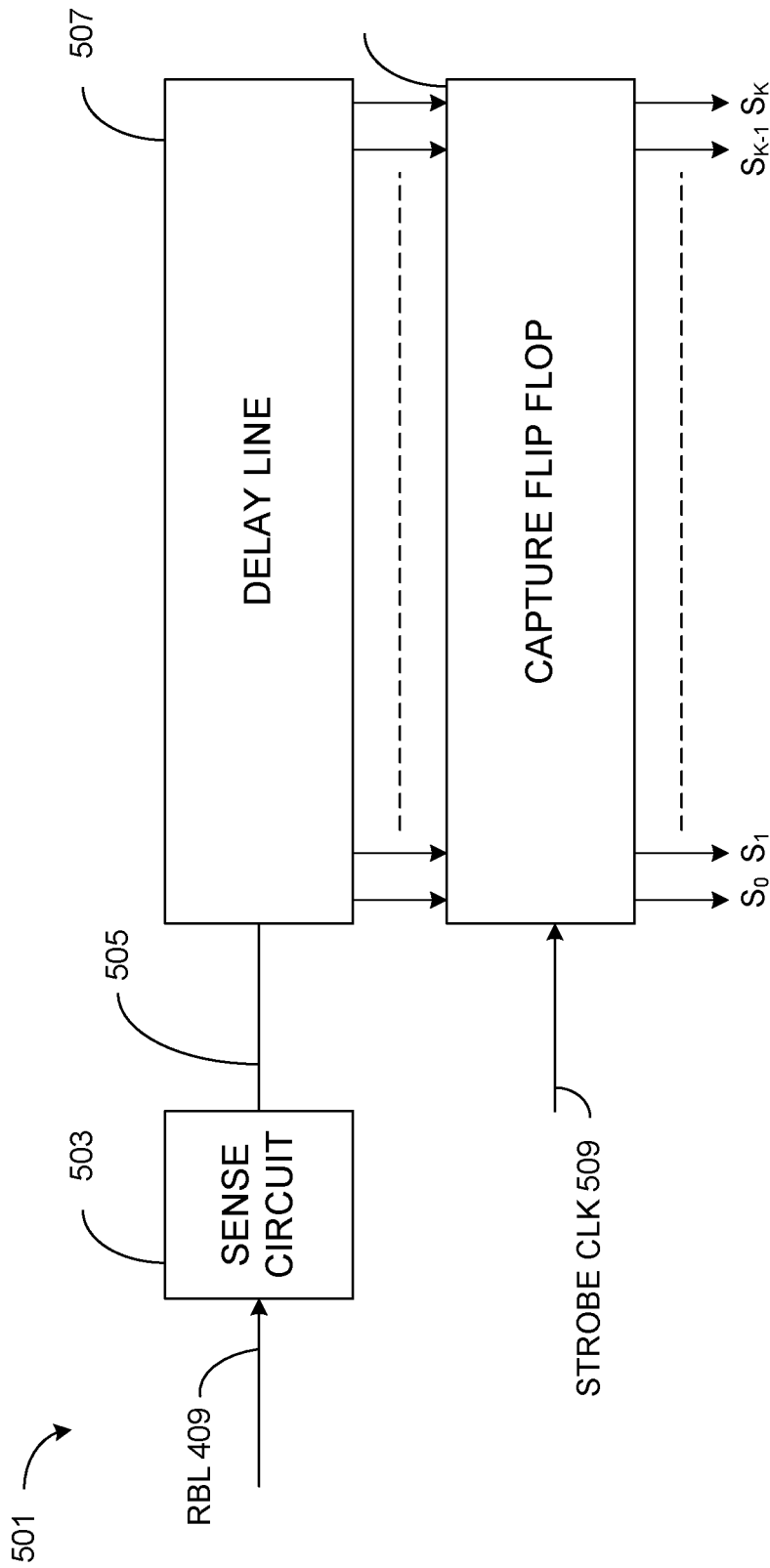
FIG. 5a shows, in block diagram form, a time-to-delay measurement circuit in accordance with at least some embodiments.

Turning now to FIG. 5a, an example of circuitry that may be used to correlate a measured delay time to a stored voltage value is discussed. One of the read operations previously discussed includes a time to discharge method that correlates a measured delay time to a voltage value.

Block diagram 501, illustrates in block diagram form some circuitry that may correlate a delay time to a voltage value. In block diagram 501, a delay line 507 is coupled to RBL 409 from the FIG. 4a for an example. In another example, the RBL 409 is RBL 420 from the FIG. 4b, RBL 440 from the FIG. 4c, Bit Line (BL) 263 from the FIG. 4d, Bit Line (BL) 463 from FIG. 4e, RBL 478 from FIG. 4f, and Bit Line (BL) 488 from FIG. 4g. The sense circuit 503 which couples the delay line 507 to RBL 409 may be a voltage comparator or a skewed inverter or a Schmitt trigger element to make a determination that the RBL 409 has discharged to a predetermined threshold voltage value. The output of the sense circuit 505 is connected to the delay line 507 in turn is connected to a capture flip flop 511. A strobe clock signal 509 is input to the capture flip flop 511. The output capture flip flop 511 may have several bits (e.g., $S_0, S_1, S_2, \ldots, S_{k-1}, S_k$). In some embodiments, the delay line 507 may include a serial chain of non-inverting buffers, each having a respective output that is coupled to an input of an individual flip flop within the output capture flip flop 511.

The various delay times $D_1, D_2, \ldots, D_7$ discussed in FIG. 4, coupled to the sense circuit 503 trigger output of the sense circuit 503 at various delay times corresponding to respective delay times. The output 505 of the sense circuit 503 in response to the smallest delay $D_1$ propagates for the most amount of time through delay line 505. The output 505 of the sense circuit 503 in response to the largest delay $D_7$ propagates for the least amount of time through the delay line 507. And for the condition where RBL 409 does not switch, there is no change in value in delay line 507. The propagation length of the delay time through delay line 507 may be correlated to the logical value stored in a 3T DRAM cell.

For example, $D_1$ may be set to determine if a bit line RBL 409 falls below a threshold voltage value within a first predetermined time window. In the event that the bit line falls below the threshold voltage value within the first predetermined time window, $D_1$ begins propagating the output 505 response of the sense circuit 503 through delay line 507. To ease the discussion of the example, the output response of the sense circuit is propagating a "1" and it is not limited to propagating only "1" it can be propagating "0" or any other predetermined response value.

In the event that the bit line does not fall within the threshold voltage value within the first predetermined time window, $D_2$ will not propagate a "1". Taking this scenario further, $D_2$ may be set to determine if a bit line falls below a threshold voltage value within a second predetermined time window, where the second predetermined time window occurs later in time than the first predetermined time window. In the event that the bit line falls below the threshold voltage value within the second predetermined time window, $D_2$ begins propagating a "1" through delay line 507. Thus, $D_2$, will have propagated a "1" for less time than the case where $D_1$ begins propagating. That is, the delay line 507 may reflect the below values for respective delay times:

$$D_1: 1111111111111111000 \qquad (9)$$

$$D_2: 1111111111111100000 \qquad (10)$$

. . .

$$D_7: 1100000000000000000 \qquad (11)$$

A strobe clock 509 may be set to fire at a time $t_8$, which is happens later than time $t_7$ in the FIG. 4a after all delay times have passed. The strobe clock may capture data reflecting how long a "1" has propagated through the delay line and this may be correlated to voltage value of $V_{data}$ and in turn a logical value.

Figure 5B:
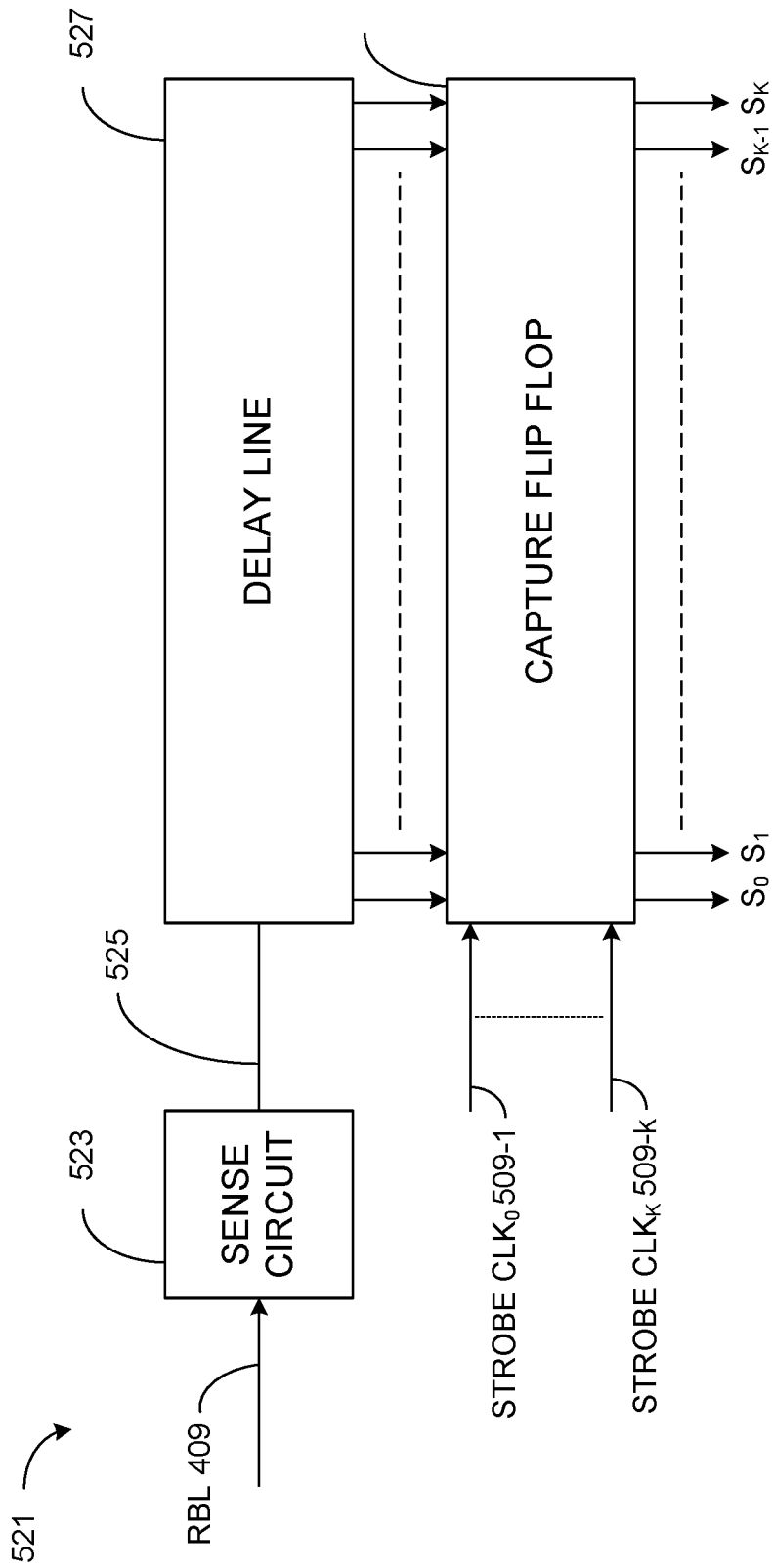
FIG. 5b shows, in block diagram form, a time-to-delay measurement circuit in accordance with at least some embodiments.

Turning now to FIG. 5b, an example of circuitry that may be used to correlate a measured delay time to a stored voltage value is discussed. One of the read operations previously discussed includes a time to discharge method that correlates a measured delay time to a voltage value.

Block diagram 521, illustrates in block diagram form some circuitry that may correlate a delay time to a voltage value. In block diagram 521, a delay line 527 is coupled to RBL 409 from the FIG. 4a for an example. In another example, the RBL 409 is RBL 459 from the FIG. 4b. The sense circuit 523 which couples the delay line 527 to RBL 409 may be a voltage comparator or a skewed inverter or a Schmitt trigger element to make a determination that the RBL 409 has discharged to a predetermined threshold voltage value. The output of the sense circuit 525 is connected to the delay line 507 in turn is connected to a capture flip flop 511. A plurality of strobe clock signals 509, . . . , 529 are inputs to the capture flip flop 531. The output capture flip flop 511 may have several bits (e.g., $S_0$, $S_1$, $S_2$, . . . , $S_{k-1}$, $S_k$). In some embodiments, the delay line 507 may include a serial chain of non-inverting buffers, each having a respective output that is coupled to an input of an individual flip flop within the output capture flip flop 531.

The block 521 in FIG. 5b, operation is similar to the block 501 in FIG. 5a except that the plurality of strobe clocks 509, . . . , 529 are provided as the inputs to the capture flip flop 531 and rest of the operation explained for block 501 in FIG. 5a is applicable to block 521.

Figure 5C:
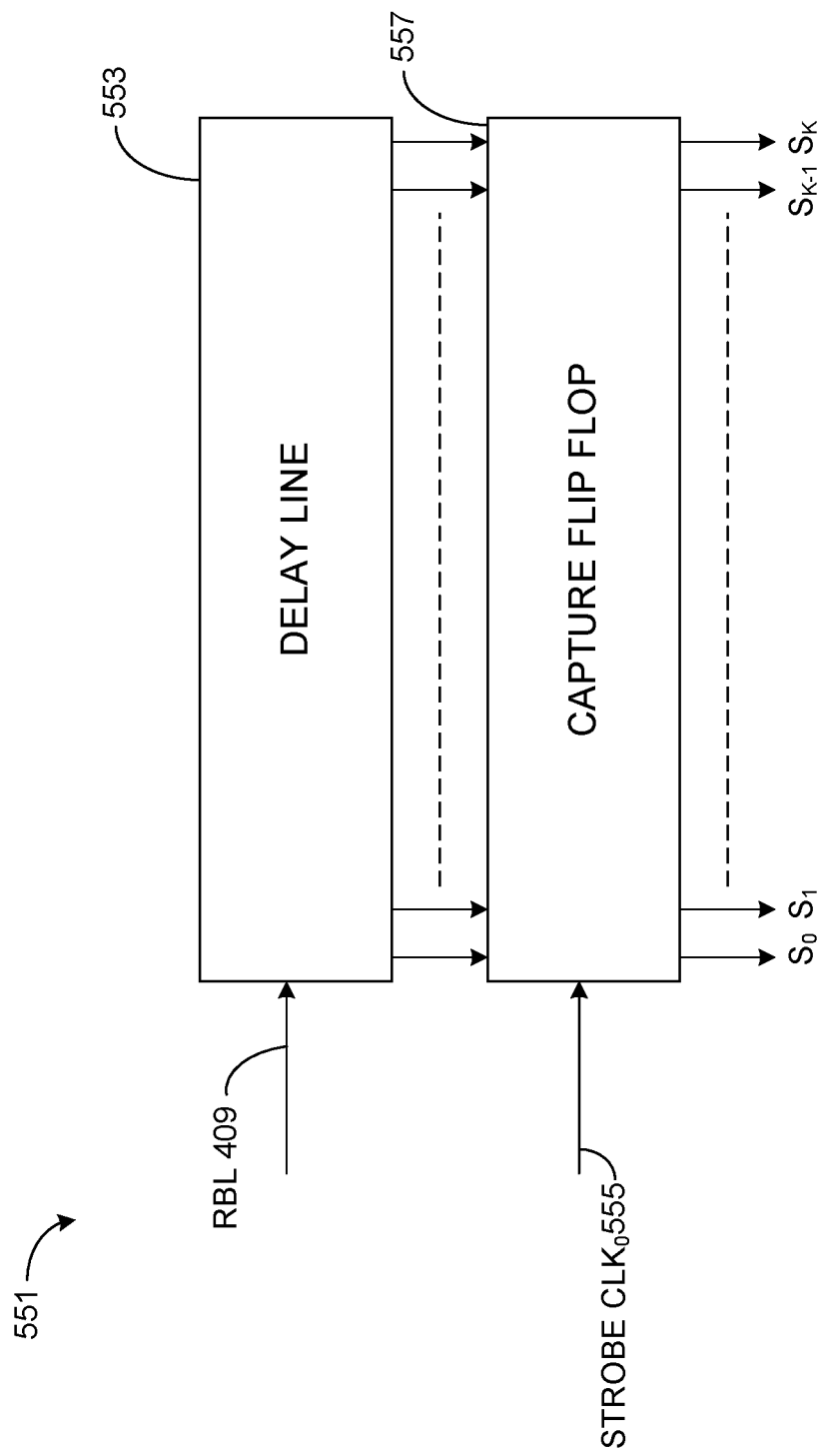
FIG. 5c shows, in block diagram form, a time-to-delay measurement circuit in accordance with at least some embodiments.

Turning now to FIG. 5c, an alternate embodiment to block 501 discussed in FIG. 5a, is presented. In block 551, the bit line RBL 409 is connected to the delay line 553 and the delay line 553 in turn is connected to the capture flop 557. The strobe clock 555 is provided as input clock to the capture flop 557 and the output capture flip flop 557 may have several bits (e.g., $S_0$, $S_1$, $S_2$, . . . , $S_{k-1}$, $S_k$). In some embodiments, the delay line 507 may include a serial chain of non-inverting buffers, each having a respective output that is coupled to an input of an individual flip flop within the output capture flip flop 557.

Figure 6:
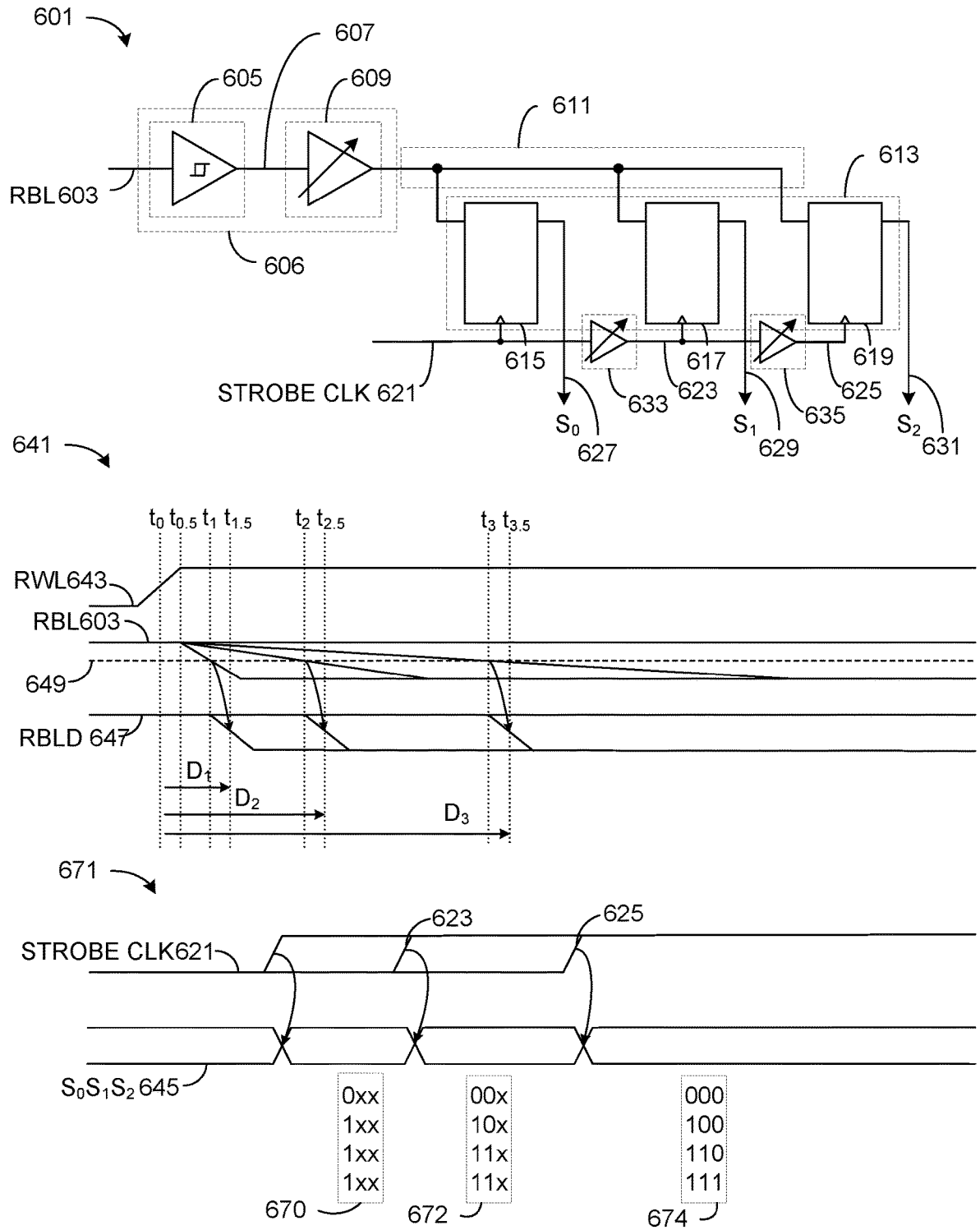
FIG. 6 shows a circuit configuration for a time-to-delay measurement circuit and a read operation in accordance with at least some embodiments.

Turning now to FIG. 6, an example circuit block diagram 601 and corresponding timing and value diagrams (641 and 671, respectively) are illustrated. The block diagram 601 includes sense circuit 606, delay line 611, and capture flip flop 613. The block diagram 601 is configured to perform a time-to-transition method that correlates a measured delay time to a voltage value. In various embodiments, the block diagram 601 may represent a time-to-transition or time-to-delay measurement circuit.

In some embodiments, the block diagram 601 may be configured to operate in a manner similar to block 501 in FIG. 5a. In some embodiments, the block diagram 601 may be a Time to Digital Converter (TDC). For purposes of this description, a time-to-transition circuit may be used interchangeably with Time to Digital Converter or time-to-delay measurement circuit.

The example block diagram 601 may be configured to couple a memory cell (e.g., a memory cell discussed herein with reference to FIGS. 4a, 4b, 4c, 4d, 4e, 4f, and/or 2a) by way of an output coupled to read bit line "RBL" 603. In various embodiments, the RBL 603 may be representative of RBL 249, 420, 440, 263, 463, 478, and 488 as described herein with reference to FIGS. 2a, 4a, 4b, 4c, 4d, 4e, 4f, and/or 4g. In one non-limiting example the block diagram 601 may be coupled to a memory cell such as memory cell 205 as described herein with reference to FIG. 2a, where the memory cell 205 is configured to store four voltage levels representing 2 bits of data value.

The sense circuit 606 defines an input coupled to the RBL 603, a Schmitt buffer 605, an adjustable delay element 609, and an output. The delay line 611 defines an input coupled to the output of the sense circuit 606, and one or more outputs coupled to the capture flip flop 613. In some embodiments, the delay line 611 is an RC delay line that couples the output of the sense circuit 606 to the capture flip flop 613. In various embodiments, the delay line 611 is similar to the delay lines 507, 527, and 553 (FIGS. 5a, 5b, and 5c).

The capture flip flop 613 comprises a plurality of flip flops 615, 617, and 619 having respective outputs 627, 629, and 631. In the example described herein, the outputs 627, 629, and 631 respectively couple output values $S_0$, $S_1$, and $S_2$. That is, the output value $S_0$ couples the output 627, the output value $S_1$ couples the output 629, and the output value $S_2$ couples the output 631. The capture flip flop 613 further comprises adjustable delay elements 633 and 635, and an input coupling a strobe clock signal 621. The adjustable delay elements 633 and 635 couple the input coupling the strobe clock signal 621, and each of the delay elements 633 and 635 is configured to introduce a respective delay to the original strobe clock signal 621.

In various embodiments, adjustable delay elements 633 and 635 may be configured to generate a delayed strobe clock signal. Furthermore, although elements 633 and 635 are described as adjustable delay elements, the delay elements may be adjustable delay elements and/or fixed delay elements. In some embodiments, the elements 633 and 635 may represent any element that may be configured to generate strobe clock signals according to a predetermined schedule. Accordingly, references herein to an adjustable delay element are not meant to be limiting.

In the non-limiting example shown in FIG. 6, the input of the capture flip flop 613 coupling the strobe clock signal 621 is configured to couple the input of the adjustable delay element 633. Accordingly, the output of the adjustable delay element 633 provides a first delayed strobe clock signal 623, where the first delayed strobe clock signal 623 is correlated with the strobe clock signal 621 with some additional delay added in. The first delayed strobe clock signal 623 couples the input of the adjustable delay element 635. Accordingly, the output of the adjustable delay element 635 provides a second delayed strobe clock signal 625, where the second delayed strobe clock signal 625 is correlated with the first delayed strobe clock signal 623 with some additional delay added in.

The flip flop 615 comprises two inputs, one input coupled to the delay element 611 and the second input coupled to the strobe clock signal 621. An output of the flip flop 615 couples the output 627 configured to produce the output value $S_0$. The flip flop 617 comprises two inputs, one input coupled to the delay element 611 and the second input coupled to strobe clock signal 621 by way of the delay element 633. An output of the flip flop 617 couples the output 629 configured to produce the output value $S_1$. The flip flop 619 comprises two inputs, one input coupled to the delay element 611 and the second input coupled to the strobe clock signal 621 by way of the delay elements 633 and 635. An output of the flip flop 619 couples the output 631 configured to produce the output value $S_2$.

The timing diagram 641 shows various values associated with a read word line "RWL" 643, the "RBL" 603, and the read bit line delay "RBLD" 647 during an example read operation. The example read operation uses the block diagram 601 to correlate a measured time delay to a voltage value stored in the memory cell (e.g., memory cell 205), and further to correlate the voltage value to a logical data value. The RWL 643 may be the RWL 247 (e.g., memory cell 205), and the RBLD 647 may represent values coupled to the delay line 611.

During an example read operation, subsequent to time $t_0$, RWL 643 changes state from a low value to a high value. Depending on the logical value stored as a voltage value in the memory cell, subsequent to RWL 643 going high, RBL 603 will begin to discharge. For cases where the memory cell stores a higher voltage value, the bit line will discharge faster than cases where the memory cell stores a lower voltage value.

In a non-limiting example where the memory cell stores a higher voltage value, such as a voltage value $V_3$ (e.g., FIG. 4b, memory cell 205), in response to RWL 643 going high, the RBL 603 reaches a predetermined threshold 649 at or around time $t_1$. In response to the RBL 603 reaching a predetermined threshold at $t_1$, the output of the sense circuit 606 changes state. In this example, the output of the sense circuit 606 changes to a low state at or around time $t_{1.5}$. The transition to a low state at time $t_{1.5}$ is illustrated by the RBLD 647 in the timing diagram 641. The output of the sense circuit 606 cascades through the flip flop 615, and causes the output 627 of the flip flop to produce output value $S_0$ having a low value around time $t_{1.5}$.

The strobe clock signal 621 and iterations of the strobe clock signal 621 (e.g., first delayed strobe clock signal 623, second delayed strobe clock signal 625) couples the capture flip flop 613 to determine the time when the RBDL 647 changes state. In FIG. 6, the strobe clock signal 621 may be programmed to fire or change state (e.g., switch from a low to a high state) during a first predetermined time window. The first predetermined time window may be set for a period between when delay $D_1$ ends and before delay $D_2$ ends. In one non-limiting example, the first predetermined time window is set around time $t_{1.5}$. In another non-limiting example, the first predetermined time window is set between times $t_{1.5}$ and $t_{25}$. The firing of the strobe clock signal 621 causes a state of the RBLD 647 to be captured at the time of the firing (e.g., time of firing around $t_{1.5}$).

In some examples, where the memory cell stores a voltage value of $V_3$, the RBLD 647 transitions to a low value around time $t_{1.5}$, which falls within the delay time $D_1$ (e.g., delay spanning from $t_0$ to $t_{1.5}$). When the strobe clock signal 621 fires during the first predetermined time window, the captured value is "low" as the RBLD 647 has transitioned to a low value in response to RBL 603 transitioning to a predetermined threshold 649 at time $t_1$.

The subsequent firing of the strobe clocks, including the first delayed strobe clock signal 623 and the second delayed strobe clock signal 625 capture a low value at the outputs 629 ($S_1$) and 631 ($S_2$) of the flip flops 617 and 619, respectively. In various embodiments, the first delayed strobe clock signal 623 may be programmed to fire or change state (e.g., switch from a low to a high state) during a second predetermined time window. The second predetermined time window may be set for a period between when the delay $D_2$ ends and before delay $D_3$ ends. In one non-limiting example, the second predetermined time window is set around time $t_{2.5}$. In another non-limiting example, the second predetermined time window is set between times $t_{2.5}$ and $t_{3.5}$. The firing of first delayed strobe clock signal 623 causes a state of the RBLD 647 to be captured at the time of the firing (e.g., time of firing around $t_{2.5}$).

Additionally, the second delayed strobe clock signal 625 may be programmed to fire or change state (e.g., switch from a low to a high state) during a third predetermined time window. The third predetermined time window may be set for a period after or around when delay $D_3$ ends. In one non-limiting example, the third predetermined time window is set around time $t_{3.5}$. The firing of the second delayed strobe clock signal 625 causes a state of the RBLD 647 to be captured at the time of the firing (e.g., time of firing around $t_{3.5}$).

In some examples where the memory cell stores voltage value $V_3$, all three outputs 627, 629, 631 may have a low value at the time the strobe clock signal 621 is fired. All three outputs 627, 629, and 631 having a low value around times $t_{1.5}$, $t_{2.5}$, and $t_{3.5}$ indicate that RBL 603 reached the predetermined threshold at time $t_1$, which correlates to a delay time $D_1$. An RBL 603 reaching a predetermined threshold within delay time $D_1$ is correlated to the memory cell 205 storing a voltage value $V_3$, which is further correlated to the binary value of 11.

Still referring to FIG. 6, in another non-limiting example, the memory cell stores a lower voltage value such as $V_2$. In this example, the RBL 603 response will take longer. For example, after RWL 643 goes high around time $t_0$, in response to RWL 643 going high, RBL 603 reaches a predetermined threshold at or around time $t_2$. In response to the RBL 603 reaching a predetermined threshold at time $t_2$, the output of the sense circuit 606 changes state. In this example, the output of the sense circuit 606 changes to a low state at or around time $t_{2.5}$. The transition to a low state at time $t_{2.5}$ is illustrated by the RBDL 647 in the timing diagram 641. Around the time $t_{2.5}$, the output of the sense circuit 606 cascading through the flip flop 617 causes the output 629 of the flip flop to produce output value $S_1$ having a low value.

The strobe clock signal 621 and iterations of the strobe clock signal 621 (e.g., first delayed strobe clock signal 623, second delayed strobe clock signal 625) couples the capture flip flop 613 to determine the time when the RBDL 647 changes state. Accordingly, the strobe clock signal 621 fires around time $t_{1.5}$ to capture a state of the RBLD 647, the first delayed strobe clock signal 623 fires around time $t_{2.5}$ to capture an additional state of the RBLD 647, and the second delayed strobe clock signal 625 fires around time $t_{3.5}$ to capture another state of the RBLD 647.

In some examples, where the memory cell stores voltage value $V_2$, a state of the RBLD 647 will change around time $t_{2.5}$. That is, the RBL 603 discharges within the time period delay $D_2$. Accordingly, at the time of firing of the strobe clock signal 621 (e.g., around time $t_{1.5}$) the state of the RBLD 647 has not changed. When the strobe clock signal 621 fires, the output of S0 captured around time $t_{1.5}$ is "high".

Subsequent to the firing of the strobe clock signal 621, the RBL 603 discharges and the state of the RBLD 647 changes (e.g., switches from a high to a low state). Around time $t_{2.5}$, a firing of the first delayed strobe clock signal 623 captures a state of the RBLD 647 as "low". Around time $t_{3.5}$, a firing of the second delayed strobe clock signal 625 captures a state of the RBLD 647 as "low".

In some examples where the memory cell stores voltage value $V_2$, the respective values coupled to the outputs 627, 629, and 631 (e.g., $S_0$, $S_1$, and $S_2$) will have a value of 100 (e.g., "high", "low, "low") or a binary value 100. The RBLD 647 having a high value around time $t_{1.5}$, a low value around time $t_{2.5}$, and a low value around time $t_{3.5}$ indicate that RBL 603 reached the predetermined threshold at time $t_2$, which correlates to a delay time $D_2$. An RBL 603 reaching a predetermined threshold within delay time $D_2$ is correlated to the memory cell 205 storing a voltage value $V_2$, which is further correlated to the binary value 10.

Still referring to FIG. 6, in another non-limiting example, the memory cell stores another lower voltage value $V_1$. In this example, the RBL 603 response will take longer than $t_1$ or $t_2$. For example, after RWL 643 goes high around time $t_0$, in response to RWL 643 going high, RBL 603 reaches a predetermined threshold at or around time $t_3$. In response to the RBL 603 reaching a predetermined threshold at time $t_3$, the output of the sense circuit 606 changes state. In this example, the output of the sense circuit 606 changes to a low state at or around time $t_{3.5}$. The transition to a low state at time $t_{3.5}$ is illustrated by the RBDL 647 in the timing diagram 641. Around time $t_{3.5}$, the output of the sense circuit 606 cascading through the flip flop 619 causes the output 631 of the flip flop to produce output value $S_2$ having a low value around time $t_{3.5}$.

The strobe clock signal 621 and iterations of the strobe clock signal 621 (e.g., first delayed strobe clock signal 623, second delayed strobe clock signal 625) couples the capture flip flop 613 to determine the time when the RBDL 647 changes state. Accordingly, the strobe clock signal 621 fires around time $t_{1.5}$ to capture a state of the RBLD 647, the first delayed strobe clock signal 623 fires around time $t_{2.5}$ to capture an additional state of the RBLD 647, and the second delayed strobe clock signal 625 fires around time $t_{3.5}$ to capture another state of the RBLD 647.

In some examples, where the memory cell stores voltage value $V_1$, a state of the RBLD 647 will change around time $t_{3.5}$. That is, the RBL 603 discharges within the time period delay $D_3$. Accordingly, at the time of firing of the strobe clock signal 621 (e.g., around time $t_{1.5}$) the state of the RBLD 647 has not changed. When the strobe clock signal 621 fires, the output of S0 captured around time $t_{1.5}$ is "high".

Subsequent to the firing of the strobe clock signal 621, the RBL 603 maintains state. Around time $t_{2.5}$, a firing of the first delayed strobe clock signal 623 captures a state of the RBLD 647 as "high". Subsequent to the firing of the strobe clock signal 621, the RBL 603 discharges and the state of the RBLD 647 changes (e.g., switch from a high to a low state). Around time $t_{3.5}$, a firing of the second delayed strobe clock signal 625 captures a state of the RBLD 647 as "low".

In some examples where the memory cell stores voltage value $V_1$, the respective values coupled to the outputs 627, 629, and 631 (e.g., $S_0$, $S_1$, and $S_2$) will have a value of 110 (e.g., "high", "high", "low") or a binary value 110. The RBLD 647 having a high value around time $t_{1.5}$, a high value around time $t_{2.5}$, and a low value around time $t_{3.5}$ indicate that RBL 603 reached the predetermined threshold at time $t_3$, which correlates to a delay time $D_3$. An RBL 603 reaching a predetermined threshold within delay time $D_3$ is correlated to the memory cell 205 storing a voltage value $V_1$, which is further correlated to the binary value 01.

Still referring to FIG. 6, in a non-limiting example where the memory cell stores the lower voltage value $V_0$, the RBL 603 does not reach the predetermined threshold and in turn the RBLD 647 does not transition to a low value. Accordingly, the firings of the strobe clock signal 621, capture high values at the outputs 627, 629, and 631 (e.g., $S_0$, $S_1$, and $S_2$). The respective values coupled to the outputs 627, 629, and 631 are all "high" or have a binary value 111. The RBLD 647 having a binary value of 111 is correlated to the memory cell 205 storing a voltage value $V_0$, which is further correlated to the binary value 00.

Value diagram 671 illustrates the various possible values for the outputs 627, 729, and 631 (e.g., $S_0$, $S_1$, and $S_2$, respectively) after firing of the strobe clock signal 621, the first delayed strobe clock signal 623, and the second delayed strobe clock signal 625. The possible values 670 correlate to the output 627, the possible values 672 correlate to the output 629, and the possible values 674 correlate to the output 631. From these possible values, the voltage value stored in the memory cell 205 of FIG. 4*a* can be determined and in turn, a logical value of the data value stored in the memory cell may be determined.

Figure 7:
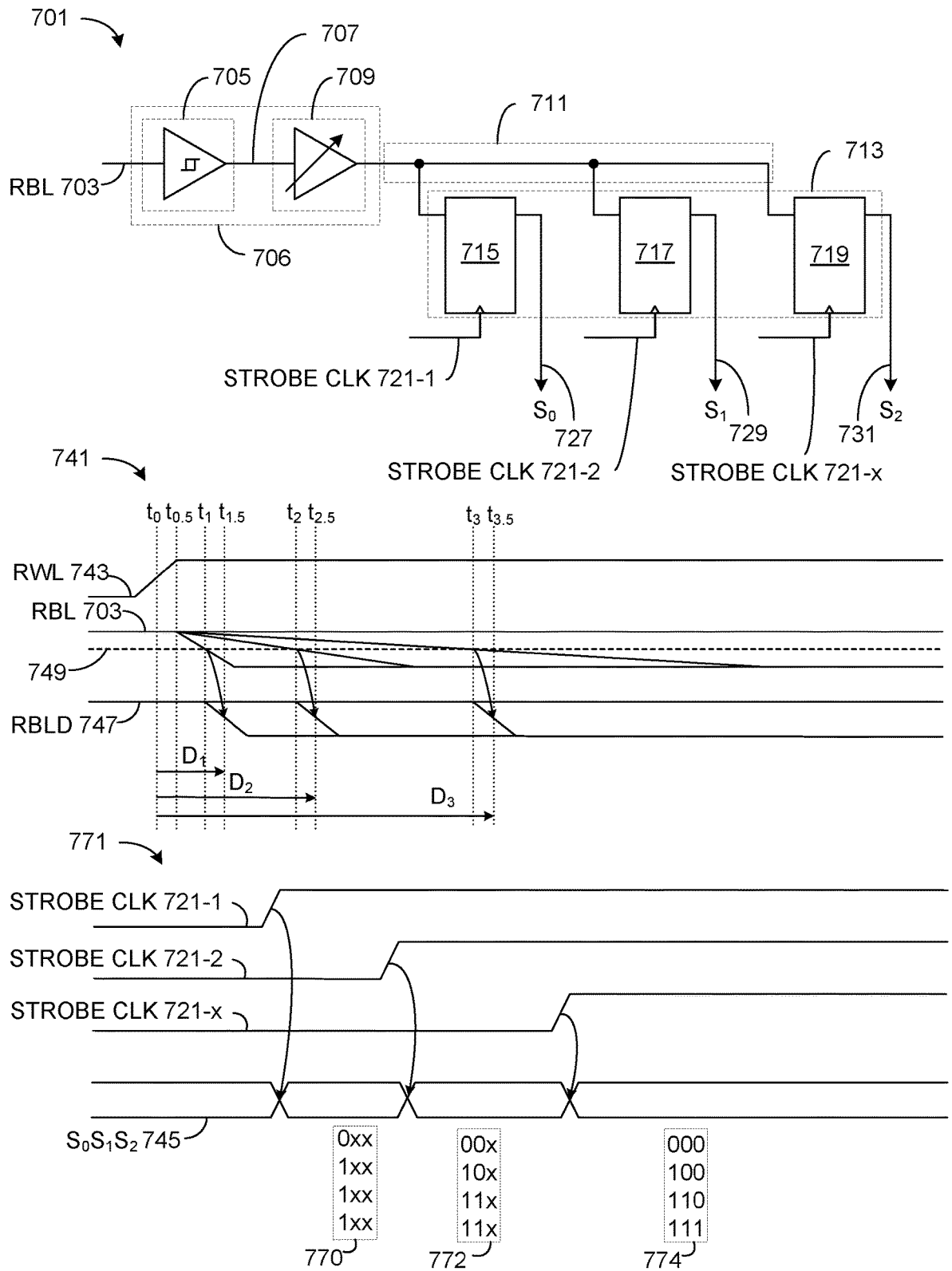
FIG. 7 shows a circuit configuration for a time-to-delay measurement circuit in accordance with at least some embodiments.

Turning now to FIG. 7, an example circuit block diagram 701 and corresponding timing and value diagrams (741 and 771, respectively) are illustrated. The block diagram 701 includes sense circuit 706, delay line 711, and capture flip flop 713. The block diagram 701 is configured to perform a time-to-transition method that correlates a measured delay time to a voltage value. In various embodiments, the block diagram 701 may represent a time-to-transition or time-to-delay measurement circuit.

In some embodiments, the block diagram 701 may be configured to operate in a manner similar to the block 521 in FIG. 5*b*. In some embodiments, the block diagram 701 may be a Time to Digital Converter (TDC). For purposes of this description, a time-to-transition circuit may be used interchangeably with Time to Digital Converter or time-to-delay measurement circuit.

The example block diagram 701 may be configured to couple a memory cell by way of an input coupled to the read bit line "RBL" 703. In various embodiments, the RBL 703 may be representative of RBL 249 as described herein with reference to FIGS. 4*a*, 4*b*, and/or 2. In one non-limiting example the block diagram 701 may be coupled to a memory cell such as memory cell 205 as described herein with reference to FIG. 2, where the memory cell 205 is configured to store four voltage levels representing 2 bits of data value.

The sense circuit 706 defines an input coupled to the RBL 703, a Schmitt buffer 705, an adjustable delay element 709, and an output. The delay line 711 defines an input coupled to the output of the sense circuit 706, and one or more outputs coupled to the capture flip flop 713. In some embodiments, the delay line 711 is an RC delay line that couples the output of the sense circuit 706 to the capture flip flop 713. In various embodiments, the delay line 711 is similar to the delay lines 507, 527, and 533 (FIGS. 5a, 5b, and 5c).

The capture flip flop 713 comprises a plurality of flip flops 715, 717, and 719 with respective outputs 727, 729, and 731. In the example described herein, the outputs 727, 729, and 731 respectfully couple output values $S_0$, $S_1$, and $S_2$. For example, the output value $S_0$ couples the output 727, the output value $S_1$ couples the output 729, and the output value $S_2$ couples the output 731. The capture flip flop 713 comprises a plurality of inputs coupling different strobe clock signals. For example, in FIG. 7, the capture flip flop 713 includes strobe clock signals 721-1, 721-2, and 721-x. The strobe blocks 721 are programmed such that a timing relationship between the strobe clocks 721 is based on a predetermined timing window. In FIG. 6, the example circuit 601 implements a timing relationship based on the adjustable delay elements 633 and 635. In the example circuit 701 shown in FIG. 7, the strobe clock signals are provided as individual inputs. Aside from this difference, the operation of circuit 701 (FIG. 7) may be similar to circuit 601 (FIG. 6).

The timing diagram 741 shows various values associated with a read word line "RWL" 743, the "RBL" 703, and the read bit line delay "RBLD" 747 during an example read operation. The example read operation uses the block diagram 701 to correlate a measure time delay to a voltage value stored in the memory cell (e.g., memory cell 205), and further to correlate the voltage value to a logical data value. The RWL 743 may be the RWL 237 (e.g., memory cell 205), and the RBLD 747 may represent values coupled to the delay line 711.

During an example read operation, subsequent to time $t_0$, RWL 743 changes state from a low value to a high value. Depending on the logical value stored as a voltage value in the memory cell, subsequent to RWL 743 going high, RBL 703 will begin to discharge. For cases where the memory cell stores a higher voltage value, the bit line will discharge faster than cases where the memory cell stores a lower voltage value.

In a non-limiting example where the memory cell stores a higher voltage value, such as voltage value $V_3$ (e.g., FIG. 4b, memory cell 205), in response to the RWL 743 going high, the RBL 703 reaches a predetermined threshold 749 at or around time $t_1$. In response to the RBL 703 reaching a predetermined threshold at $t_1$, the output of the sense circuit 706 changes state. In this example, the output of the sense circuit 706 changes to a low state at or around time $t_{1.5}$. The transition to a low state at time $t_{1.5}$ is illustrated by the RBLD 747 in the timing diagram 741. The output of the sense circuit 706 cascades through the flip flop 715, and causes the output 727 to produce output value $S_0$ having a low value around time $t_{1.5}$.

The plurality of strobe clock signals 721 couples the capture flip flop 713 to determine the time when the RBDL 747 changes state. In FIG. 7, the strobe clock signal 721-1 may be programmed to fire or change state (e.g., switch from a low to a high state) during a first predetermined time window. The first predetermined time window may be set for a period between when the delay $D_1$ ends and before delay $D_2$ ends. In one non-limiting example, the first predetermined time window is set around time $t_{1.5}$. In another non-limiting example, the first predetermined time window is set between times $t_{1.5}$ and $t_{2.5}$. The firing of the strobe clock signal 721-1 causes a state of the RBLD 747 to be captured at the time of the firing (e.g., time of firing around $t_{1.5}$).

In some examples, where the memory cell stores a voltage value of $V_3$, the RBLD 747 transitions to a low value around time $t_{1.5}$, which falls within the delay time $D_1$ (e.g., delay spanning from $t_0$ to $t_{1.5}$). When the strobe clock signal 721-1 fires during the first predetermined time window, the captured value is "low" as the RBLD 747 has transitioned to a low value in response to RBL 703 transitioning to a predetermined threshold 749 at time $t_1$.

The subsequent firing of the strobe clocks 721-2 and 721-x capture a low value outputs 729 ($S_1$) and 731 ($S_2$) of the flip flops 717 and 719, respectively. In various embodiments, the strobe clock signal 721-2 may be programmed to fire or change state (e.g., switch from a low to a high state) during a second predetermined time window. The second predetermined time window may be set for a period between when the delay $D_2$ ends and before delay $D_3$ ends. In one non-limiting example, the second predetermined time window is set around time $t_{2.5}$. In another non-limiting example, the second predetermined time window is set between times $t_{2.5}$ and $t_{3.5}$. The firing of strobe clock signal 721-2 causes a state of the RBLD 747 to be captured at the time of the firing (e.g., time of firing around $t_{2.5}$).

Additionally, the strobe clock signal 721-x may be programmed to fire or change state (e.g., switch from a low to a high state) during a third predetermined time window. The third predetermined time window may be set for a period after or around when delay $D_3$ ends. In one non-limiting example, the third predetermined time window is set around time $t_{3.5}$. The firing of the strobe clock signal 721-x causes a state of the RBLD 747 to be captured at the time of the firing (e.g., time of firing around $t_{3.5}$).

In some examples where the memory cell stores voltage value $V_3$, all three outputs 727, 729, and 731 may have a low value at the time the strobe clock signal 721-1 is fired. All three outputs 727, 729, and 731 having a low value around time $t_{1.5}$, $t_{2.5}$, and $t_{3.5}$ indicate that RBL 703 reached the predetermined threshold at time $t_1$, which correlates to a delay time $D_1$. An RBL 703 reaching a predetermined threshold within delay time $D_1$ is correlated to the memory cell 205 storing a voltage value $V_3$, which is further correlated to the binary value of 11.

Still referring to FIG. 7, in another non-limiting example, the memory cell stores a lower voltage value such as $V_2$. In this example, the RBL 703 response will take longer. For example, after RWL 743 goes high around time $t_0$, in response to RWL 743 going high, RBL 703 reaches a predetermined threshold at or around time $t_2$. In response to the RBL 703 reaching a predetermined threshold at time $t_2$, the output of the sense circuit 706 changes state. In this example, the output of the sense circuit 706 changes to a low state at or around time $t_{2.5}$. The transition to a low state at time $t_{2.5}$ is illustrated by the RBDL 747 in the timing diagram 741. Around time $t_{2.5}$, the output of the sense circuit 706 cascading through the flip flop 717 causes the output 729 of the flip flop to produce output value $S_1$ having a low value.

The strobe clock signals 721 couple the capture flip flop 713 to determine the time when the RBDL 747 changes state. Accordingly, the strobe clock signal 721-1 fires around time $t_{1.5}$ to capture a state of the RBLD 747, the strobe clock signal 721-2 fires around time $t_{2.5}$ to capture an additional state of the RBLD 747, and the strobe clock signal 721-x fires around time $t_{3.5}$ to capture another state of the RBLD 747.

In some examples, where the memory cell stores voltage value $V_2$, a state of the RBLD 747 will change around time $t_{2.5}$. That is, the RBL 703 discharges within the time period delay $D_2$. Accordingly, at the time of firing of the strobe clock signal 721-1 (e.g., around time $t_{1.5}$) the state of the RBLD 747 has not changed. When the strobe clock signal 721-1 fires, the output of S0 captured around time $t_{1.5}$ is "high".

Subsequent to the firing of the strobe clock signal 721-1, the RBL 703 discharges and the state of the RBLD 747 changes (e.g., switches from a high to a low state). Around time $t_{2.5}$, a firing of the strobe clock signal 721-2 captures a state of the RBLD 647 as "low". Around time $t_{3.5}$, a firing of the strobe clock signal 721-x captures a state of the RBLD 647 as "low".

In some examples where the memory cell stores voltage value $V_2$, the respective values coupled to the outputs 727, 729, and 731 (e.g., $S_0$, $S_1$, and $S_2$) will have a value of 100 (e.g., "high", "low", "low") or a binary value 100. The RBLD 747 having a high value around time $t_{1.5}$, a low value around time $t_{2.5}$, and a low value around time $t_{3.5}$ indicate that RBL 703 reached the predetermined threshold at time $t_2$, which correlates to a delay time $D_2$. An RBL 703 reaching a predetermined threshold within delay time $D_2$ is correlated to the memory cell 205 storing a voltage value $V_2$, which is further correlated to the binary value 10.

Still referring to FIG. 7, in another non-limiting example, the memory cell stores another lower voltage value $V_1$. In this example, the RBL 703 response will take longer than $t_1$ or $t_2$. For example, after RWL 743 goes high around time $t_0$, in response to RWL 743 going high, RBL 703 reaches a predetermined threshold at or around time $t_3$. In response to the RBL 703 reaching a predetermined threshold at time $t_3$, the output of the sense circuit 706 changes state. In this example, the output of the sense circuit 706 changes to a low state at or around time $t_{3.5}$. The transition to a low state at time $t_{3.5}$ is illustrated by the RBDL 747 in the timing diagram 741. Around time $t_{3.5}$, the output of the sense circuit 706 cascading through the flip flop 719 causes the output 731 of the flip flop to produce output value $S_2$ having a low value around time $t_{3.5}$.

The strobe clock signals 721 couple the capture flip flop 713 to determine the time when the RBDL 747 changes state. Accordingly, the strobe clock signal 721-1 fires around time $t_{1.5}$ to capture a state of the RBLD 747, the strobe clock signal 721-2 fires around time $t_{2.5}$ to capture an additional state of the RBLD 747, and the strobe clock signal 721-x fires around time $t_{3.5}$ to capture another state of the RBLD 747.

In some examples, where the memory cell stores voltage value $V_1$, a state of the RBLD 747 will change around time $t_{3.5}$. That is, the RBL 703 discharges within the time period delay $D_3$. Accordingly, at the time of firing of the strobe clock signal 721-1 (e.g., around time $t_{1.5}$) the state of the RBLD 747 has not changed. When the strobe clock signal 721-1 fires, the output of S0 captured around time $t_{1.5}$ is "high".

Subsequent to the firing of the strobe clock signal 721-1, the RBL 703 maintains state. Around time $t_{2.5}$, a firing of the strobe clock signal 721-2 captures a state of the RBLD 747 as "high". Subsequent to the firing of the strobe clock signal 721-2, the RBL 703 discharges and the state of the RBLD 747 changes (e.g., switch from a high to a low state). Around time $t_{3.5}$, a firing of the strobe clock signal 721-x captures a state of the RBLD 647 as "high".

In some examples where the memory cell stores voltage value $V_3$, the respective values coupled to the outputs 727, 729, and 731 (e.g., $S_0$, $S_1$, and $S_2$) will have a value of 110 (e.g., "high", "high", "low") or a binary value 110. The RBLD 747 having a high value around time $t_{1.5}$, a high value around time $t_{2.5}$, and a low value around time $t_{3.5}$ indicate that RBL 703 reached the predetermined threshold at time $t_3$, which correlates to a delay time $D_3$. An RBL 703 reaching a predetermined threshold within delay time $D_3$ is correlated to the memory cell 205 storing a voltage value $V_1$, which is further correlated to the binary value 01.

Still referring to FIG. 7, in a non-limiting example where the memory cell stores the lower voltage value $V_0$, the RBL 703 does not reach the predetermined threshold and in turn the RBLD 747 does not transition to a low value. Accordingly, the firings of the strobe clock signals 721, capture high values at the output 727, 729, and 731 (e.g., $S_0$, $S_1$, and $S_2$). The respective values coupled to the outputs 727, 729, and 731 are all "high" or have a binary value 111. The RBLD 747 having a binary value of 111 is correlated to the memory cell 205 storing a voltage value $V_0$, which is further correlated to the binary value 00.

Value diagram 771 illustrates the various possible values for the outputs 727, 729, and 731 (e.g., $S_0$, $S_1$, and $S_2$, respectively) after firing of the strobe clock signals 721. The possible values 770 correlate to the output 727, the possible values 772 correlate to the output 729, the possible values 774 correlate to the output 731. From these possible values, the voltage value stored in the memory cell 205 of FIG. 4a can be determined and in turn, a logical value of the data value stored in the memory cell may be determined.

Figure 8:
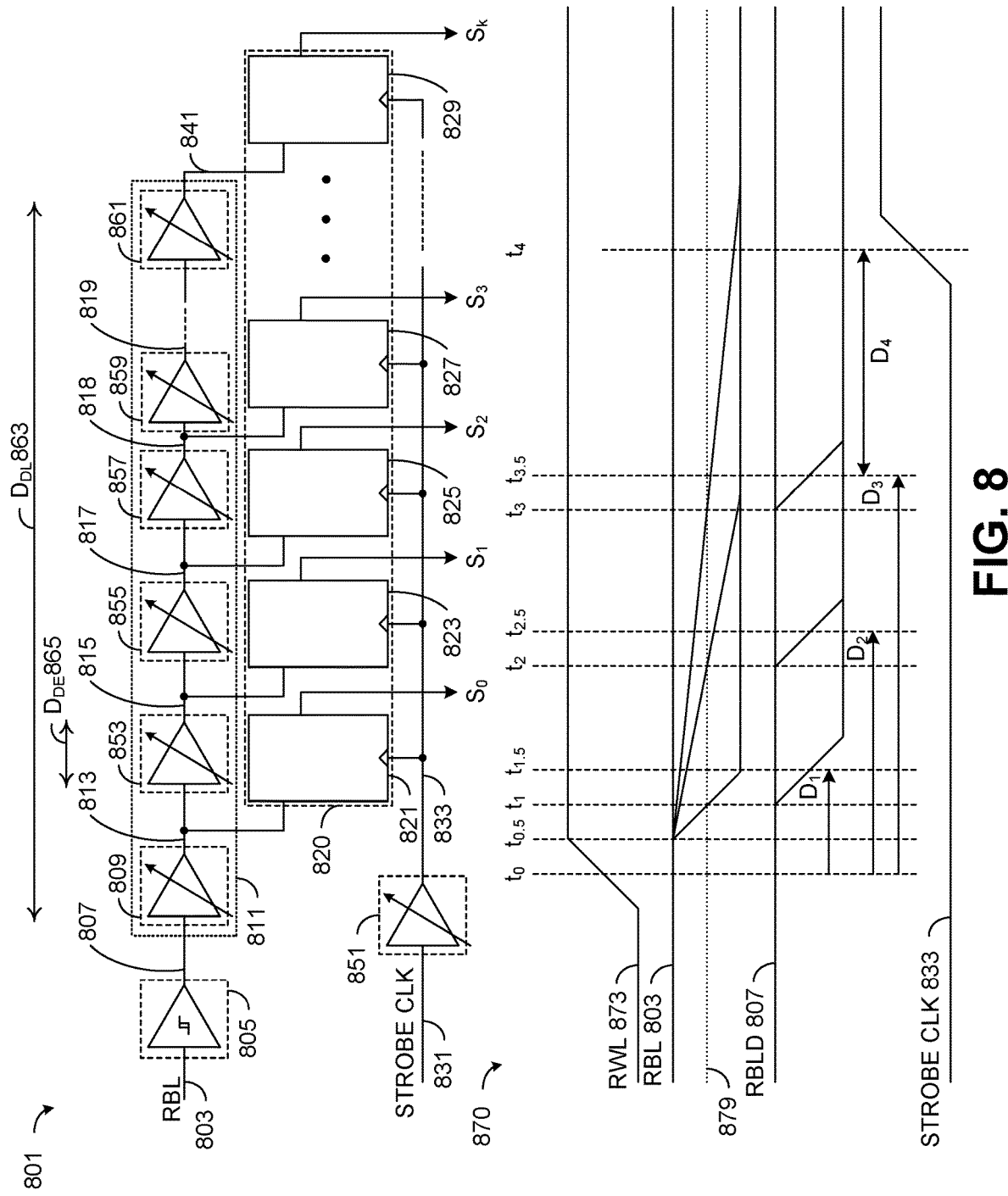
FIG. 8 shows, in block diagram form, a circuit configuration in accordance with at least some embodiments.

FIG. 8 illustrates an example circuit diagram 801 of the block diagram 501 described herein with reference to FIG. 5a. The circuit diagram 801 illustrates a circuit diagram for performing a time-to-transition measurement. In various embodiments, the circuit diagram 801 may represent a Time to Digital Converter (TDC), which may be used interchangeably with time-to-transition circuit or time-to-transition measurement circuit, herein.

The example circuit 805 is coupled to the memory cell 205 discussed herein with reference to FIG. 4a and the memory cell stores four voltage levels representing 2 bits of data value. The sense circuit 503 (FIG. 5a) is represented by the Schmitt buffer 805. The Schmitt buffer 805 couples RBL 803 which defines an output of the memory cell 205 described herein with reference to FIG. 4b. The delay line 811 is a delay line coupling the output of the sense circuit to the capture flip flop 820. The delay line 811 comprises a plurality of adjustable delay elements 809, 853, 855, 857, 859, and 861.

In some embodiments, the delay element may be a non-inverting delay element. In other embodiments, the delay element may be an inverting delay element. The capture flip flop 820 comprises a plurality of flip flops 821, 823, 825, 827, and 829 with respective outputs $S_0$, $S_1$, $S_2$, $S_3$, and $S_k$. The strobe clock signal 831 is coupled to an input of the adjustable delay element 851 and the output of the adjustable delay element 851 generates a delayed strobe clock signal 833 in response to the strobe clock signal 831 at the input. The output of each adjustable delay element in the delay line 811 is coupled to a successive adjustable delay element and input of the corresponding capture flip flop. In response to firing the strobe clock signal 831, output values of the all the delay elements in the delay line 811 are concurrently captured by the capture flip flop 820.

The timing graph 870 shows various values associated with a time-to-transition measurement occurring during a read operation. Various methods have been described herein for correlating the measured time delay to a voltage value stored in the memory cell, and in turn correlating the voltage value to a logical data value. During a read operation and performance of a time-to-transition measurement, the RWL 873 initially changes state, goes "high" in this example. In response to the RWL 873 going high, the RBL 803 reaches a predetermined threshold within the time window associated with the time delay $D_1$ for cases where the memory cell stores a voltage value $V_3$.

In response to the RBL 803 reaching a predetermined threshold around time $t_1$, the output of the sense circuit, RBLD 807 transitions low. The RBLD 807 transitioning at time $t_{1.5}$ starts propagating through the delay line 811 and the point of transition of the RBLD 807 within the delay line is captured by a strobe clock signal firing around time $t_4$. The strobe clock signal firing around time $t_4$, is a delayed response to the firing of the strobe clock signal 831.

The amount of time that has passed since the transition of the RBLD 807 is correlated to a data value in the time-to-transition measurement. For example, given a time reference of $t_4$ (e.g., when the strobe clock signal 833 fires), the time for when the RBLD 807 transitions at time $t_{2.5}$ and propagates through the delay line is less than when the RBLD 807 transitions at time $t_{1.5}$ and propagates through the delay line. Similarly, the time for when the RBLD 807 transitions at time $t_{3.5}$ and propagates through the delay line is even less when compared to transitions occurring around times $t_{2.5}$ or $t_{1.5}$.

In this example the propagation of "0" is longest for time delay $D_1$, next longest for time delay $D_2$, and then for time delay $D_3$. In the case of RBL not transitioning, the output of the capture flip flop is all "1". The time delay $D_{DL}$ 863 of the delay line 811 may be chosen to be greater than or equal to the time difference between time $t_4$ and time $t_{1.5}$. Having a time delay $D_{DL}$ greater than the time difference between time $t_4$ and time $t_{1.5}$ provides a delay margin for RBLD transitioning at time $t_{1.5}$ and propagating through the delay line 811.

The delay $D_{DE}$ 865 of a delay element in the delay line 811 may be uniform across all delay elements or may be non-uniform across all delay elements. In one embodiment the $D_{DE}$ may be in logarithmic incremental steps, where the delay of two successive delay elements increments logarithmically or decrement logarithmically. From the output of the capture flip flop a correlation to the logical value of the data stored in the memory cell 205 can be made. The correlation of the time-to-transition can be made to a voltage value in the memory cell 205 of FIG. 4b or an impedance value of a memory cell and in turn to the logical value of the data stored in stored.

For four voltage value $V_3$, $V_2$, $V_1$, and $V_0$ in the memory cell 205 in FIG. 4a configured to store 2 bit data values, the corresponding output values of block diagram 801 are $S_0$, $S_1$, and $S_2$, captured by firing of the strobe clocks 831, are 000, 011, 001, and 111. From the output values 000, 011, 001, and 111, a voltage value $V_3$, $V_2$, $V_1$, and $V_0$ can be correlated and in turn correlated to a binary value of 11, 10, 01, and 00 for the data stored in the memory cell 205 of FIG. 4a.

Turning now to FIG. 9a block diagram 901 illustrates a configuration of NMOS transistors 905, 907, and 909 coupled in series. The NMOS transistor 905 drain is coupled to the bit line RBL 903 and the control electrode is coupled to enable signal EN 911. The control electrode of NMOS transistor is coupled to a column control line signal CCL 913 and in this example the CCL 913 is orthogonal to EN 911. In another configuration the CCL 913 and EN 911 are parallel. The control electrode of NMOS transistor 909 is coupled to a data node $V_{g0}$ 915. In one embodiment, the data node $V_{g0}$ 915 is $V_{data}$ 401 in FIG. 4.

Turning now to FIG. 9b, a line graph 921 illustrates a possible voltage values for the CCL 913 in FIG. 9. In this example the CCL 913 has four possible voltage values, and each voltage value is illustrated as a bell curve for possible values for a voltage value. In case of CCL 913 having a voltage value of $V_0$, the NMOS transistor 907 is in non-conductive state or OFF state. The $V_{th}$ bell curve is a possible voltage value of the threshold voltage of NMOS transistor 907 and for voltage values of CCL 913 greater than the $V_{th}$ of NMOS transistor 907, the NMOS transistor 907 may be modeled as a variable resistor with resistance value being dependent on the voltage value of CCL 913 with respect to the threshold voltage value of NMOS transistor 907.

Turning now to FIG. 9c, a line graph 931 illustrates a possible voltage values for the data node $V_{g0}$ 915 in FIG. 9. In this example the $V_{g0}$ 909 has four possible voltage values, and each voltage value is illustrated as a bell curve for possible values for a voltage value. In case of $V_{g0}$ 915 having a voltage value of $V_0$, the NMOS transistor 907 is in non-conductive state or OFF state. The $V_{th}$ bell curve is a possible voltage value of the threshold voltage of NMOS transistor 909 and for voltage values of $V_{g0}$ 915 greater than the $V_{th}$ of NMOS transistor 909, the NMOS transistor 909 may be modeled as a variable resistor with resistance value being dependent on the voltage value of $V_{g0}$ 915 with respect to the threshold voltage value of NMOS transistor 909.

Turning now to FIG. 9d, equivalent resistors of NMOS transistors 907 $R_1$ 943, and NMOS transistor 909 $R_0$ 945 are in series and an effective resistance may be modeled as additive sum of two variable resistors. The table 1 illustrates additive sum of possible combinational values for the effective resistor values

| | NMOS transistor 907 possible resistor values | | | |
|---|---|---|---|---|
| | $R_0$ | $R_1$ | $R_2$ | $R_3$ |
| NMOS transistor 909 possible resistor values | $R_0$ $R'_0$ | $R'_0$ | $R'_0$ | $R'_0$ |
| | $R_1$ $R'_0$ | $R'_1$ | $R'_2$ | $R'_3$ |
| | $R_2$ $R'_0$ | $R'_4$ | $R'_5$ | $R'_6$ |
| | $R_3$ $R'_0$ | $R'_7$ | $R'_8$ | $R'_9$ |

In table 1, each combination of resistor value is treated as being a unique resistor value. In case of table 1, there are 10 unique resistor value combination and using a time to transition or a time to digital converter circuit discussed in FIGS. 5a, 5b, and 5c may be used to correlate to an effective resistance value and in turn correlated to a binary value. The correlated binary value may be an output of a function operating on CCL 913 voltage value and $V_{g0}$ 915 voltage value. Thus, the time to transition or the time to digital converter circuit output is an output of a function operation.

In an embodiment wherein the order of resistance value is negligible and may be considered equivalent table 2 illustrates the possible values based on principles of addition being commutative. There are 7 unique resistor value combination and using a time to transition or a time to digital converter circuit discussed in FIGS. 5a, 5b, and 5c may be used to correlate to an effective resistance value and in turn correlated to a binary value. The correlated binary value may be an output of a function operating on CCL 913 voltage value and $V_{g0}$ 915 voltage value. Thus, the time to transition or the time to digital converter circuit output is an output of a function operation.

| | | NMOS transistor 907 possible resistor values | | | |
|---|---|---|---|---|---|
| | | $R_0$ | $R_1$ | $R_2$ | $R_3$ |
| NMOS transistor 909 possible resistor values | $R_0$ | $R'_0$ | $R'_0$ | $R'_0$ | $R'_0$ |
| | $R_1$ | $R'_0$ | $R'_1$ | $R'_2$ | $R'_3$ |
| | $R_2$ | $R'_0$ | $R'_2$ | $R'_4$ | $R'_5$ |
| | $R_3$ | $R'_0$ | $R'_3$ | $R'_5$ | $R'_6$ |

Turning now to FIG. 9e, the line graph 951 illustrates various possible transition time for RBL 903 in response to EN 911 going high. The transition time is based on effective resistance and the smallest transition time of RBL 903 may be for the case where both CCL and $V_{g0}$ voltage values are $V_3$ as shown in the line graph 921, and 931. And the largest transition time of RBL 903 may be for the case where both CCL and $V_{g0}$ voltage values are $V_1$ as shown in the line graph 921, and 931. In case of RBL 903 not transitioning at least CCL or $V_{g0}$ have a voltage value $V_0$.

Turning now to FIG. 10a block diagram 1001 illustrates a configuration of NMOS transistors 1005, 1007, and 1009 coupled in series. The NMOS transistor 1005 drain is coupled to the bit line RBL 1003 and the control electrode is coupled to enable signal EN 1011. The control electrode of NMOS transistor is coupled to a data node $Vg_1$ 1013. In one embodiment, the data node $V_{g1}$ 1013 is $V_{data}$ 401 in FIG. 4a and in another embodiment, the data node $V_{g1}$ is coupled to a signal that is parallel to signal EN 1011. The control electrode of NMOS transistor 1009 is coupled to a data node $V_{g0}$ 1015. In one embodiment, the data node $V_{g0}$ 1015 is $V_{data}$ 401 in FIG. 4.

Turning now to FIG. 10b, a line graph 1021 illustrates a possible voltage values for the $V_{g1}$ 1013 in FIG. 10. In this example the $V_{g1}$ 1011 has four possible voltage values, and each voltage value is illustrated as a bell curve for possible values for a voltage value. In case of $V_{g1}$ 1013 having a voltage value of $V_0$, the NMOS transistor 1007 is in non-conductive state or OFF state. The $V_{th}$ bell curve is a possible voltage value of the threshold voltage of NMOS transistor 1007 and for voltage values of $V_{g1}$ 1013 greater than the $V_{th}$ of NMOS transistor 1007, the NMOS transistor 1007 may be modeled as a variable resistor with resistance value being dependent on the voltage value of $V_{g1}$ 1013 with respect to the threshold voltage value of NMOS transistor 1007.

Turning now to FIG. 10c, a line graph 1031 illustrates a possible voltage values for the data node $V_{g0}$ 1015 in FIG. 10. In this example the $V_{g0}$ 1009 has four possible voltage values, and each voltage value is illustrated as a bell curve for possible values for a voltage value. In case of $V_{g0}$ 1015 having a voltage value of $V_0$, the NMOS transistor 1007 is in non-conductive state or OFF state. The $V_{th}$ bell curve is a possible voltage value of the threshold voltage of NMOS transistor 1009 and for voltage values of $V_{g0}$ 1015 greater than the $V_{th}$ of NMOS transistor 1009, the NMOS transistor 1009 may be modeled as a variable resistor with resistance value being dependent on the voltage value of $V_{g0}$ 1015 with respect to the threshold voltage value of NMOS transistor 1009.

Turning now to FIG. 10d, equivalent resistors of NMOS transistors 1007 $R_1$ 1043, and NMOS transistor 1009 $R_0$ 1045 are in series and an effective resistance may be modeled as additive sum of two variable resistors. The table 1 illustrates additive sum of possible combinational values for the effective resistor values

| | | NMOS transistor 1007 possible resistor values | | | |
|---|---|---|---|---|---|
| | | $R_0$ | $R_1$ | $R_2$ | $R_3$ |
| NMOS transistor 1009 possible resistor values | $R_0$ | $R'_0$ | $R'_0$ | $R'_0$ | $R'_0$ |
| | $R_1$ | $R'_0$ | $R'_1$ | $R'_2$ | $R'_3$ |
| | $R_2$ | $R'_0$ | $R'_4$ | $R'_5$ | $R'_6$ |
| | $R_3$ | $R'_0$ | $R'_7$ | $R'_8$ | $R'_9$ |

In table 1, each combination of resistor value is treated as being a unique resistor value. In case of table 1, there are 10 unique resistor value combination and using a time to transition or a time to digital converter circuit discussed in FIGS. 5a, 5b, and 5c may be used to correlate to an effective resistance value and in turn correlated to a binary value. The correlated binary value may be an output of a function operating on $V_{g1}$ 1013 voltage value and $V_{g0}$ 1015 voltage value. Thus, the time to transition or the time to digital converter circuit output is an output of a function operation.

In an embodiment wherein the order of resistance value is negligible and may be considered equivalent table 2 illustrates the possible values based on principles of addition being commutative. There are 7 unique resistor value combination and using a time to transition or a time to digital converter circuit discussed in FIGS. 5a, 5b, and 5c may be used to correlate to an effective resistance value and in turn correlated to a binary value. The correlated binary value may be an output of a function operating on $V_{g1}$ 1013 voltage value and $V_{g0}$ 1015 voltage value. Thus, the time to transition or the time to digital converter circuit output is an output of a function operation.

| | | NMOS transistor 1007 possible resistor values | | | |
|---|---|---|---|---|---|
| | | $R_0$ | $R_1$ | $R_2$ | $R_3$ |
| NMOS transistor 1009 possible resistor values | $R_0$ | $R'_0$ | $R'_0$ | $R'_0$ | $R'_0$ |
| | $R_1$ | $R'_0$ | $R'_1$ | $R'_2$ | $R'_3$ |
| | $R_2$ | $R'_0$ | $R'_2$ | $R'_4$ | $R'_5$ |
| | $R_3$ | $R'_0$ | $R'_3$ | $R'_5$ | $R'_6$ |

Turning now to FIG. 10e, the line graph 1051 illustrates various possible transition time for RBL 1003 in response to EN 1011 going high. The transition time is based on effective resistance and the smallest transition time of RBL 1003 may be for the case where both $V_{g1}$ and $V_{g0}$ voltage values are $V_3$ as shown in the line graph 1021, and 1031. And the largest transition time of RBL 1003 may be for the case where both $V_{g1}$ and $V_{g0}$ voltage values are $V_1$ as shown in the line graph 1021, and 1031. In case of RBL 1003 not transitioning at least $V_{g0}$ or $V_{g1}$ have a voltage value $V_0$.

Figure 11:
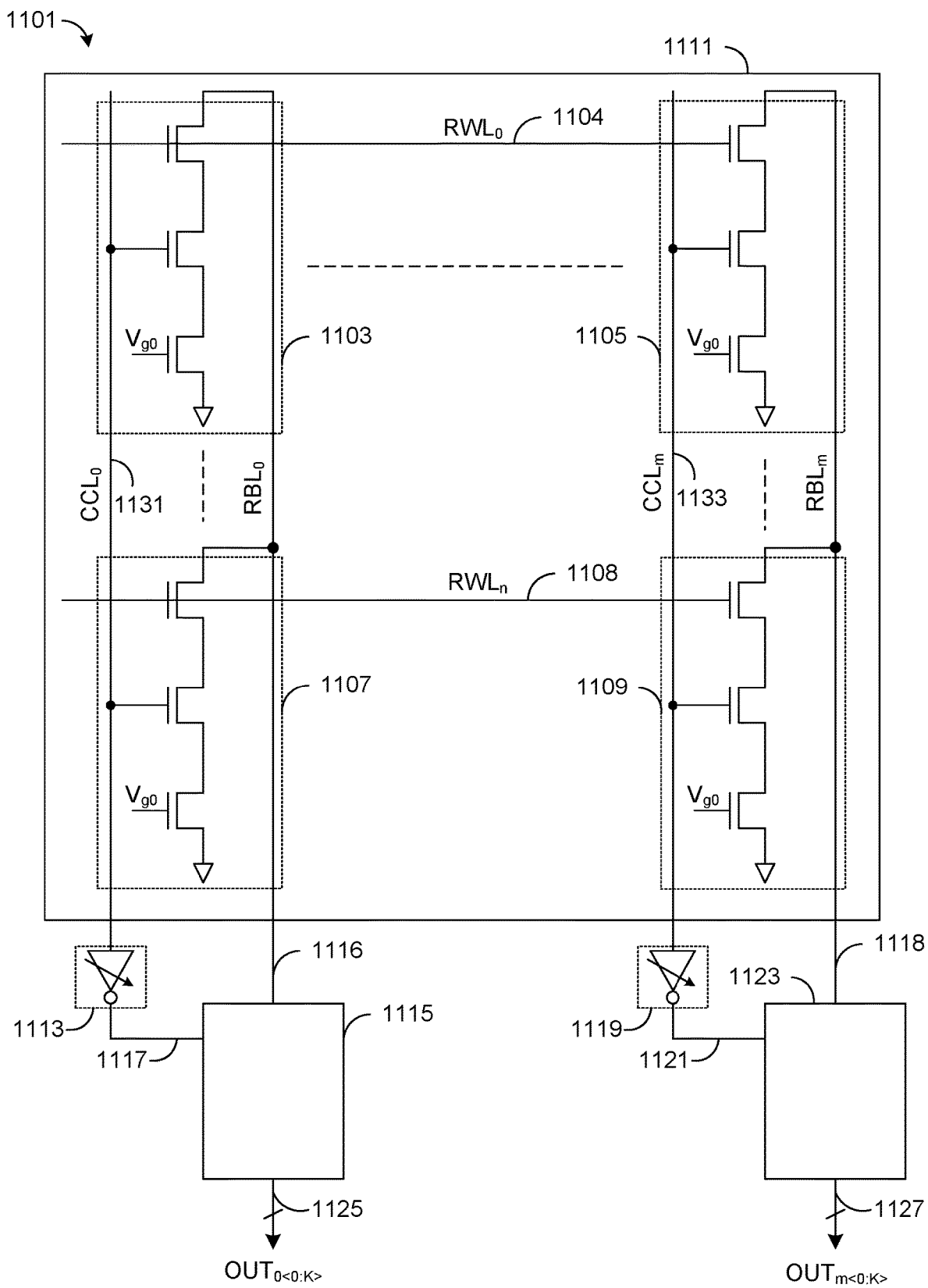
FIG. 11 shows, in a block diagram form, a circuit in accordance with at least some embodiments.

Turning now to FIG. 11, block diagram 1101 illustrates a configuration that may be used with the bit cell whose read stack configuration is discussed in FIG. 9a. The block diagram 1101 may comprise a two dimensional array 1111 where one or more rows are shown as word lines $RWL_0$ 1104, ..., and $RWL_n$ 1108. And one or more columns are shown as column control line $CCL_0$ 1131, ..., and $CCL_m$ 1133. A portion of the memory cell is shown in the two dimensional array 1111, NMOS read stack portion of memory cell 1103, 1105, 1107, ..., and 1109. When $RWL_0$ 1104 transitions to a high value, the effective impedance and for ease discussion effective resistance is used. The effective impedance and resistance are interchangeable. The effective resistance of 1103, . . . , and 1105 are coupled to the bit line RBL$_0$ 1116, . . . , and RBL$_m$ 1118. The transition rate of the RBL$_0$ 1116, . . . , and RBL$_m$ 1118 are based on the effective resistance of each NMOS read stack. And the column control lines CCL$_0$ 1131, . . . , and CCL$_m$ 1133 have a respective voltage value for example a possible voltage value from line graph 921 in FIG. 9b. The column control lines transition from a low value for example V$_0$ in line graph 921 of FIG. 9b to a respective voltage value after the word line has transitioned to a high value. The column control lines transitioning to their respective value is sensed by the circuit 1113, . . . , and 1119 generate a strobe clock 1117, . . . , and 1121 respectively. The strobe clock 1117, . . . , and 1121 provides a reference for measuring the time to transition of the bit lines RBL$_0$ 1116, . . . , and RBL$_m$ 1118. The time to transition measurement is performed by time to transition measurement circuit 1115, . . . , and 1123. The measurement circuit 1115, . . . , and 1123 may be one of the circuit block described in FIG. 5a, FIG. 5b, FIG. 5c, FIG. 6, FIG. 7, or FIG. 8. The output of the time to transition measurement provides an effective resistance value and correlated to an effective voltage value and in turn to a binary value. The correlated binary value may be based on an output of a function operation and inputs to the function operations are voltage value representing a data value for respective column control line and V$_{g0}$.

In FIG. 4a, a possible voltage value stored in the memory cell 205 is shown as a bell curve and each bell curve captures a potential distribution of voltage values that may correspond to a respective logical value stored in the memory cell 205. It is desirable and appreciable for a need of the strobe clock to track with the potential distribution of the voltage values. This need for strobe clock to track with potential distribution can be accomplished by having a tracking memory cell. In this example the tracking memory cell is shown for each row and in another embodiment the tracking cell can be a single instance for the array of bit cells.

Figure 12A:
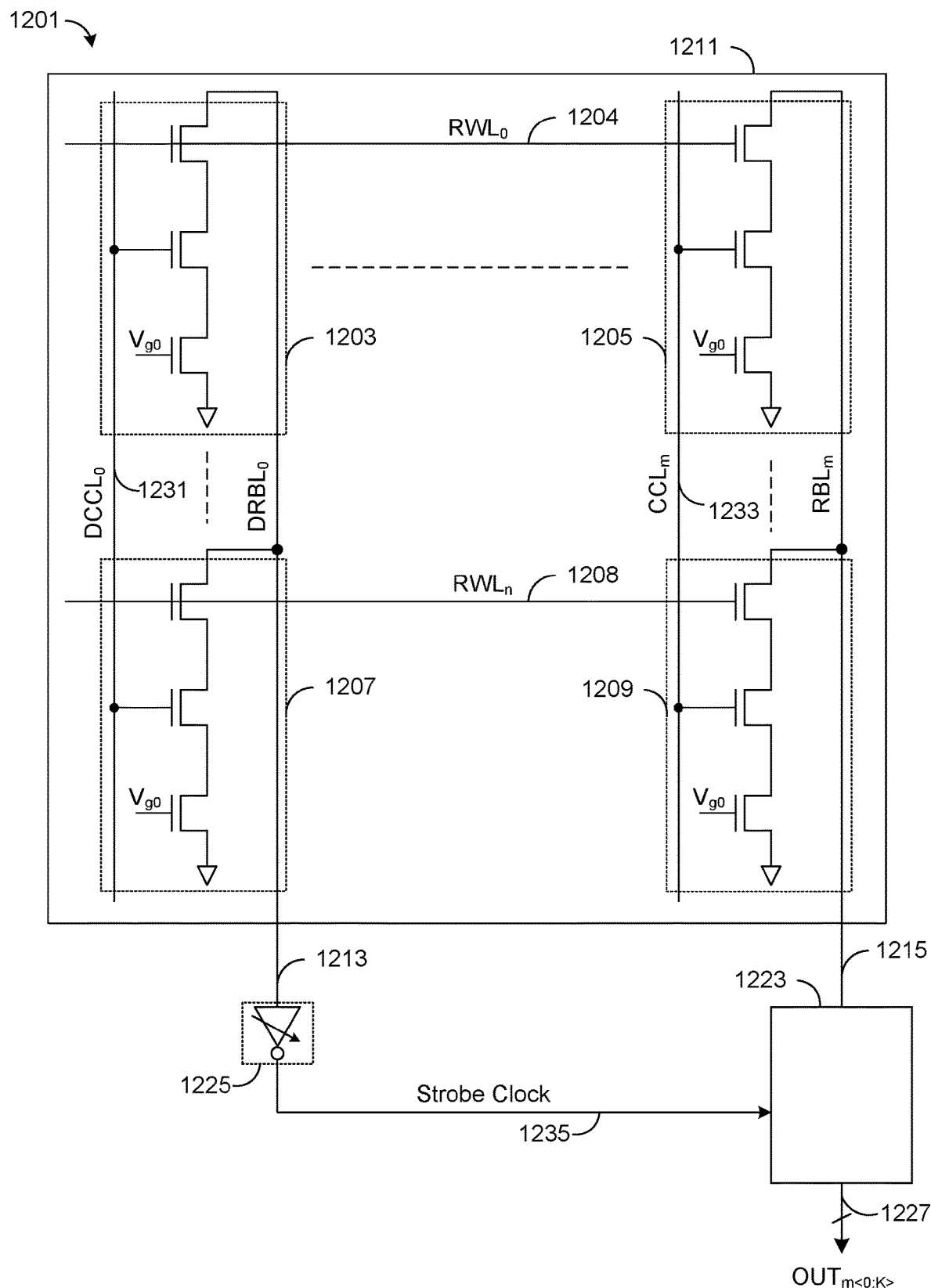
FIG. 12a shows, in a block diagram form, a circuit in accordance with at least some embodiments.

Turning now to FIG. 12a, block diagram 1201 illustrates a configuration that may be used with the memory cell whose read stack configuration is discussed in FIG. 9a. The block diagram 1201 may comprise a two dimensional array 1211 where one or more rows are shown as word lines RWL$_0$ 1204, . . . , and RWL$_n$ 1208. And one or more columns are shown as column control line DCCL$_0$ 1231, . . . , and CCL$_m$ 1233. A portion of the memory cell is shown in the two dimensional array 1211, NMOS read stack portion of memory cell 1203, 1205, 1207, . . . , and 1209. When RWL$_0$ 1204 transitions to a high value, the effective impedance and for ease discussion effective resistance is used. The effective impedance and resistance are interchangeable. The effective resistance of 1203, . . . , and 1205 are coupled to the bit line DRBL$_0$ 1216, . . . , and RBL$_m$ 1218. The transition rate of the RBL$_0$ 1216, . . . , and RBL$_m$ 1218 are based on the effective resistance of each NMOS read stack. And the column control lines DCCL$_0$ 1231, . . . , and CCL$_m$ 1233 have a respective voltage value for example a possible voltage value from line graph 921 in FIG. 9b. The column control line DCCL$_0$ is the tracking column control line with a predetermined voltage value and for example it may be V$_3$ from line graph 921 in FIG. 9b. Similarly, the voltage value of Vg0 of 1203, . . . , and 1207 are also a predetermined voltage value and for example it may be V$_3$ from line graph 931 in FIG. 9c. The bit line DRBL$_0$ 1213 transitioning to a predetermined voltage value at time t$_1$ for example in line graph 951 in FIG. 9e generates a strobe clock 1235 for the time to transition measurement circuit block 1223. The strobe clock 1235 provides a reference for measuring the time to transition of other bit lines in the memory array 1211. The time to transition measurement circuit 1223 may be one of the circuit block described in FIG. 5a, FIG. 5b, FIG. 5c, FIG. 6, FIG. 7, or FIG. 8. The output of the time to transition measurement provides an effective resistance value and correlated to an effective voltage value and in turn to a binary value. The correlated binary value may be based on an output of a function operation and inputs to the function operations are voltage value representing a data value for respective column control line CCL and V$_{g0}$.

Figure 12B:
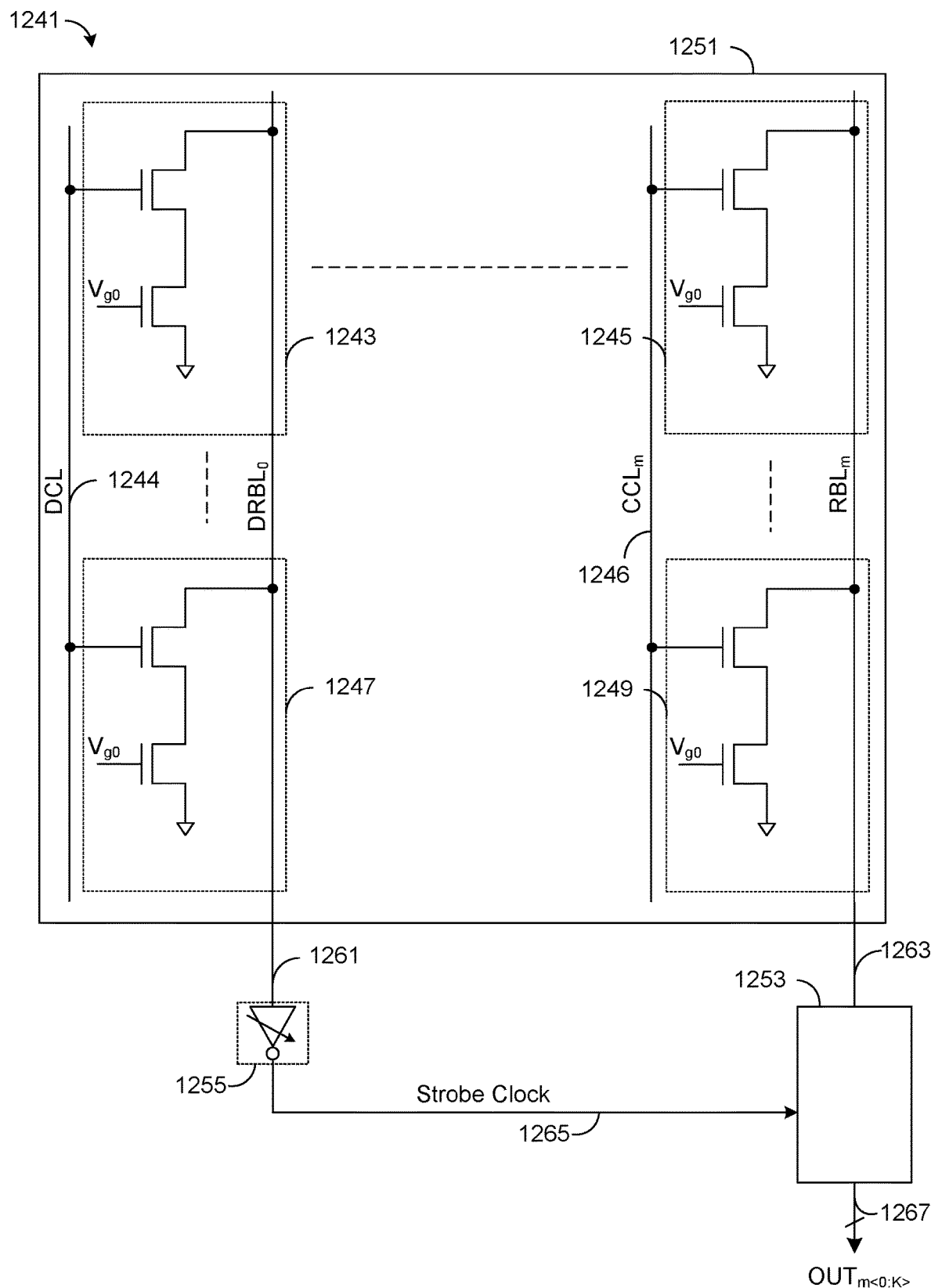
FIG. 12b shows, in a block diagram form, a circuit in accordance with at least some embodiments.

Turning now to FIG. 12b, block diagram 1251 illustrates a configuration that may be used with memory cell whose read stack configuration is discussed in FIG. 4b. Similar to the discussion of FIG. 12a, the memory cell 1243, . . . , and 1247 have a predetermined voltage value for their respective data node V$_{g0}$ and outputs coupled to bit line DRBL$_0$ 1261. The bit line DRBL$_0$ 1261 transitions to a predetermine voltage time at a predetermined time. The effective resistance of all the memory cells 1243, . . . , and 1247 in parallel configuration have a predetermined resistance and in turn a predetermined time to transition in this example a predetermined rate of discharge. The predetermined time to transition of DRBL$_0$ 1261 generates a strobe clock 1265 and the strobe clock 1265 provides the reference clock signal for measuring the time to transition of other bit lines RBL$_m$ 1263 in the memory array 1251 using the time to transition measurement circuit 1253. The measurement circuit 1251 may be one of the circuit blocks described in FIG. 5a, FIG. 5b, FIG. 5c, FIG. 6, FIG. 7, or FIG. 8. The output of the time to transition measurement provides an effective resistance value and correlated to an effective voltage value and in turn to a binary value. The correlated binary value may be based on an output of a function operation and inputs to the function operation are voltage value representing a data value of respective data node V$_{g0}$ coupled to a bit line.

Figure 12C:
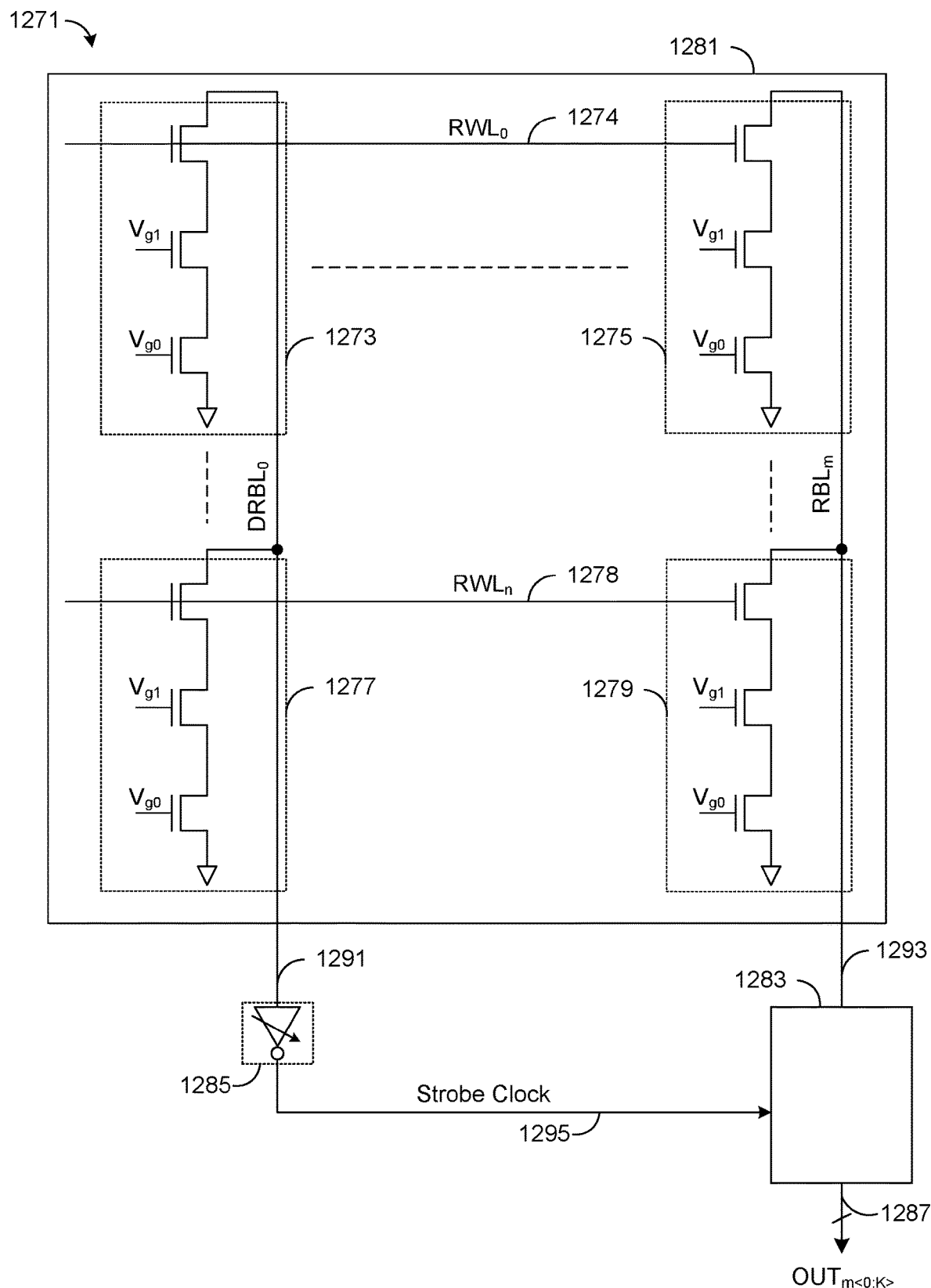
FIG. 12c shows, in a block diagram form, a circuit in accordance with at least some embodiments.

Turning now to FIG. 12c, block diagram 1281 illustrates a configuration that may be used with memory cell whose read stack configuration is discussed in FIG. 10a. Similar to the discussion of FIG. 12a, the memory cell 1273, . . . , and 1277 have a predetermined voltage value for their respective data nodes Vg and V$_{g0}$ and outputs coupled to bit line DRBL$_0$ 1273. In response to word line RWL$_0$ 1274 transitioning to a high value the bit line DRBL$_0$ 1273 transitions to a predetermine voltage time at a predetermined time. The effective resistance of the memory cell 1273 with data nodes V$_{g1}$ and V$_{g0}$ at predetermined voltage values, for example V$_3$ in line graph 1021 and 1031 has a predetermined resistance and in turn a predetermined time to transition in this example a predetermined rate of discharge. The predetermined time to transition of DRBL$_0$ 1291 generates a strobe clock 1295 and the strobe clock 1295 provides the reference clock signal for measuring the time to transition of other bit lines RBL$_m$ 1293 in the memory array 1281 using the time to transition measurement circuit 1253. The measurement circuit 1251 may be one of the circuit blocks described in FIG. 5a, FIG. 5b, FIG. 5c, FIG. 6, FIG. 7, or FIG. 8. The output of the time to transition measurement provides an effective resistance value and correlated to an effective voltage value and in turn to a binary value. The correlated binary value may be based on an output of a function operation and inputs to the function operation are voltage value representing a data value of data nodes V$_{g1}$ and V$_{g0}$ coupled to a bit line.

Turning now to FIG. 13a, the block diagram 1301 illustrates floating gate transistors Data 1307 and Weight 1309 connected in series. In this example the drain terminal of Data transistor 1307 is coupled to the bit line BL 1311 and the source terminal of Weight transistor 1309 is coupled to the ground. In another embodiment the series connection order can be reversed with Weight transistor drain terminal coupled to the bit line BL 1311 and source terminal of Data transistor coupled to the ground. The series connected floating gate transistors are equivalent to the series connected variable resistor in block diagram 481a of FIG. 4g.

Turning now to FIG. 13b, the block diagram 1341 illustrates floating gate transistors Data 1307 and Weight 1309 connected in series with additional transistors to control the coupling of the bit line BL 1311 and the source line which is coupled to ground. The floating gate configuration is a NAND configuration similar to NAND flash memory cell having two floating gate transistors in series instead of 32 or 64 floating gate transistors in series. The difference between the block diagram 1301 and 1341 is the additional transistors 1347 and 1349, otherwise the operation is equivalent.

Turning now to FIG. 13c, the line graph 1321 illustrates a bell curve of the threshold voltage value programmed into the Data transistor 1307. For ease of discussion, the programmed threshold voltage value is default erased state of the floating gate transistor. The voltage value of the control gate $WL_{data}$ representing a data value may be any voltage value between the lowest data value 1323 to the highest data value 1325 in the line graph 1321. With the $WL_{data}$ voltage at the lowest data value 1323 the floating gate transistor 1307 may have the highest variable resistance and with the $WL_{data}$ voltage at the highest data value 1325 the floating gate transistor 1307 may have the lowest variable resistance. The voltage value 1327 on the $WL_{data}$ lower than the programmed threshold voltage value results in Data transistor 1307 being in an OFF state or non-conducting state or high resistance state.

Turning now to FIG. 13d, the line graph 1331 illustrates a various possible threshold voltage value programmed into the Weigh transistor 1309. The various weight data value is programmed as a corresponding threshold voltage value. The voltage value on the $WL_{weight}$ is either at 1333 resulting in Weight transistor 1309 being in an OFF state or non-conducting state or high resistance state or at 1335. With the voltage value at 1333 on $WL_{weight}$ the Weight transistor 1309 may be modeled as the variable resistor with resistance value being dependent on the voltage difference between the programmed threshold voltage value and the voltage value 1335.

Turning back to FIG. 13a, FIG. 13b the effective resistance of two variable resistors in series is based on the voltage value on the $WL_{data}$ 1303 being between 1323 and 1325, and programmed threshold voltage of the Weight transistor 1309 with $WL_{weight}$ voltage value being 1335. The effective resistance in turn determines the time to transition of the Bit Line BL 1311 and using a time to transition measurement circuit the effective resistance may be correlated to a data value. The data value may be an output of a function operation and the input to the function operation are the voltage value of the $WL_{data}$ and the programmed threshold voltage value of the Weight transistor 1309.

Figure 14:
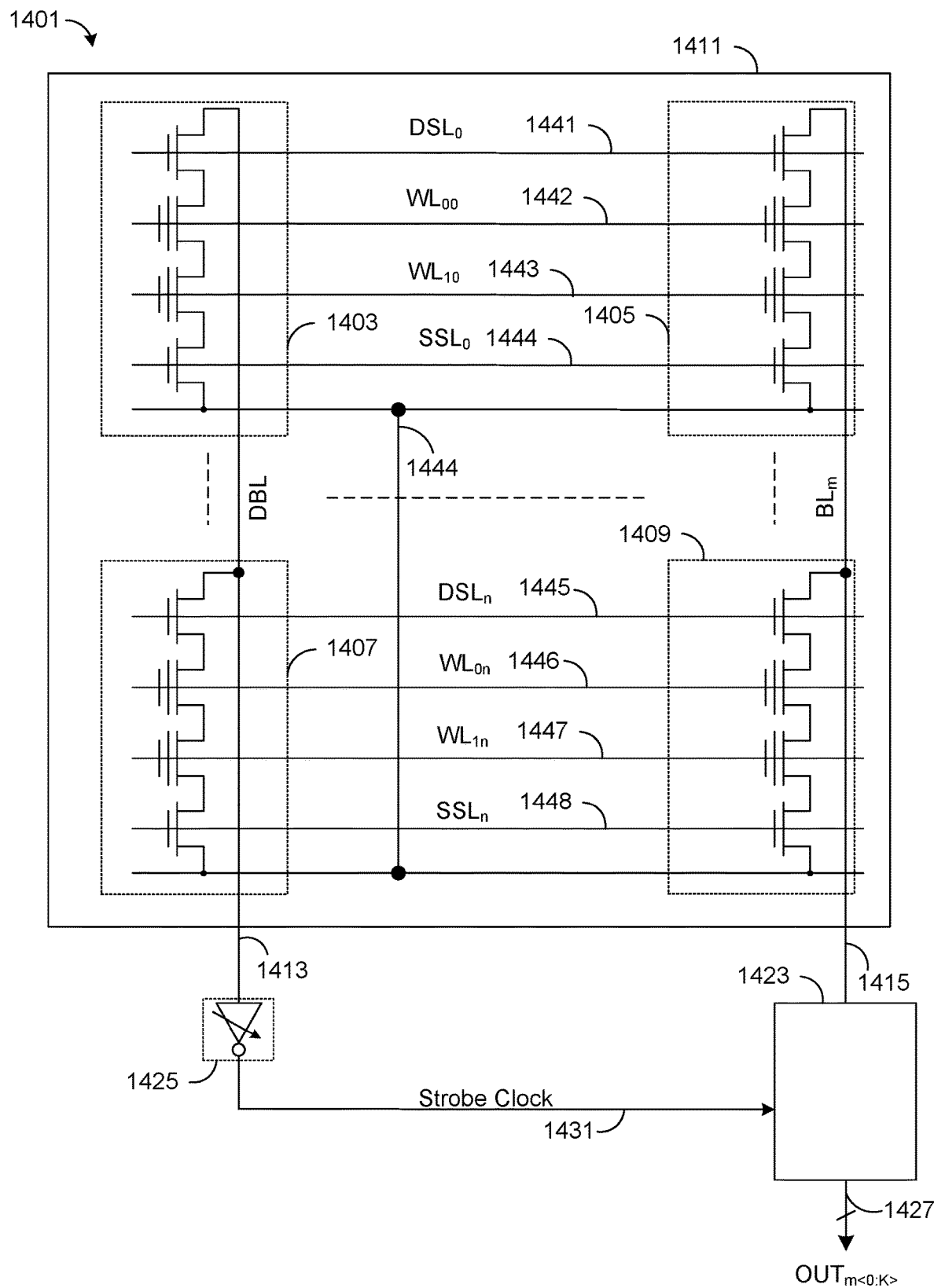
FIG. 14 shows, in a block diagram form, a circuit in accordance with at least some embodiments.

Turning now to FIG. 14, the block diagram 1401 illustrates a configuration that may be used with the floating gate transistor memory cell discussed in FIG. 13b. The block diagram 1401 may comprise a two dimensional array 1411 where one or more rows being shown by $DSL_0$ 1441 and $SSL_0$ 1444, . . . , $DSL_n$ 1445 and $SSL_n$ 1448 and one or more columns being shown by DBL 1413, . . . , and BLM 1415. A row $row_0$ comprises of control lines $DSL_0$ 1441, $WL_{00}$ 1442, $WL_{10}$ 1443, and $SSL_0$ 1444 with memory cell 1403, . . . , and 1405 coupled to the correspond control lines of $row_0$. The $WL_{00}$ 1442 corresponds to $WL_{data}$ 1303 in FIG. 13b and $WL_{10}$ 1443 corresponds to $WL_{weight}$ 1305 in FIG. 13b. The memory cell 1403, . . . , and 1407 form the tracking memory cell for the corresponding row and these memory cells have a predetermined threshold voltage value programmed into the corresponding Weight transistor. With $DSL_0$ 1441 and $SSL_0$ 1444 transition to a high value, based on the voltage value on the $WL_{00}$ which corresponds to data value and the predetermined threshold voltage programmed into the Weight transistor, the memory cell 1403 effective resistance effects a time to transition on the DBL 1413 and DBL 1413 transition provides a strobe clock 1431 and this strobe clock 1431 is used as reference clock signal for performing a time to transition measurement on all other bit lines in the 1411 using the time to transition measurement circuit 1423. The time to transition measurement circuit 1423 measures an effective resistance of memory cell 1405 and correlate to a binary data value. The correlated binary value of memory cell 1405 is with respect to the memory 1403 with a predetermined threshold voltage programmed into the Weight transistor. The correlated binary value may be an output of a function operation.

As can be appreciated, the two-dimensional array embodiments discussed in FIGS. 11, 12a, 12b, 12c, and/or 14 may be used to implement matrix multiplication operation, wherein each memory element in the two-dimensional array represents a multiplication operation of two elements in a matrix multiplication. The two-dimensional array embodiments may be used for other multiplication and addition operations. The time to digital converter or time to delay circuit output can be a threshold function operation or rectilinear operation. In threshold function operation, the time to digital converter or time to delay circuit output indicates whether the read bit line has transitioned or not, which may be correlated to a magnitude function value. In rectilinear operation, the output of the time to delay circuit is referenced to the strobe clock firing timing. The number of outputs transitioned in the capture flops indicates the RBL transition early with respect to the strobe clock. If all the outputs of the capture flop have the same value, the RBL may have transitioned after the arrival of the strobe clock or may not have transitioned. The output value from the captured flops is correlated to being "zero".

As can be appreciated, many of the embodiments described herein incorporate a memory cell having an impedance that varies in accordance with the data value stored therein (i.e., a variable impedance memory cell). The data value is read from the memory cell based upon a variable time delay of a related circuit node (i.e., signal node), for example, a bit line, a read bit line, etc. In some embodiments, a signal node is discharged at a rate that varies in accordance with the data value stored in the memory cell, and the time for that signal node to discharge to a particular value can be measured, and the data value inferred from that time-to-discharge measurement. Such time-to-discharge read techniques can be utilized with many types of memory circuits, as noted herein, and particularly to volatile and non-volatile memory technologies, including PN Junction memory devices, resistive memory devices, magnetoresistive memory devices, and spin-torque memory devices, and further including memory devices based upon silicon, carbon (e.g., carbon nanotubes), or other non-silicon semiconductor materials. In addition, the teachings herein regarding time-to-discharge read techniques and corresponding circuits may also be applied to analogous time-to-charge read techniques and corresponding circuits, such as, for example, in an embodiment having a P-type transistor whose source terminal is coupled to an upper power supply node instead of an N-type transistor whose source terminal is coupled to a lower power supply node. Consequently, such time-to-discharge and time-to-charge techniques and embodiments described herein may collectively be viewed as "time-to-transition" techniques in which a circuit (e.g., a read circuit, a memory cell selection circuit, etc.), effects a voltage transition of one node (e.g., a signal node) at a variable rate corresponding to the voltage of another node. In various embodiments, the signal node can be a bit line, a read bit line, and/or other suitable circuit node. In some embodiments, such a technique includes determining a variable time delay of a signal node voltage change corresponding to a variable impedance of a selected memory cell or other functional circuit. In some embodiments, such a technique includes determining a variable time delay of a signal node voltage change corresponding to the voltage of a first node that results from a first circuit coupling a signal value onto the first node. In some embodiments the first circuit can be a memory cell, such as a 1 T DRAM memory cell. In some embodiments the first circuit can be a function circuit.

In some of the embodiments described above, a calibration operation, such as a calibration time-to-transition measurement, is performed before actually sensing data from a selected memory cell. Such a calibration operation can remove the effects of any offsets (e.g., comparator offset voltage, transistor mismatch, resistance mismatch, etc.) when reading a selected memory cell, because in a given data path the same offsets affect the calibration operation in the same fashion as they affect the read operation. This is particularly helpful with modern processes incorporating extremely scaled transistors operating at very low voltages.

Consistent with the above disclosure, the examples enumerated in the following clauses are specifically contemplated and are intended as a non-limiting set of examples.

Clause 1. A memory device comprising:
a plurality of memory cells, each memory cell having at least two data values and having an effective variable impedance that varies in accordance with a respective data value stored therein; and
a plurality of tracking memory cells having a predetermined impedance in accordance with a respective data value stored therein; and
a read circuit configured to read the data value stored within a selected memory cell based upon a variable time delay determination of a signal node voltage change corresponding to the variable impedance of the selected memory cell with respect to the predetermined impedance of the selected tracking memory cell.

Clause 2. The memory device according to clause 1, wherein:
each respective data value corresponds to a plurality of bits.

Clause 3. The memory device according to any preceding clause, wherein:
the variable impedance comprises a variable current.

Clause 4. The memory device according to any preceding clause, wherein:
the variable impedance of each memory cell arises from a transistor within the cell whose gate voltage varies with the data written thereto.

Clause 5. The memory device according to any preceding clause, wherein:
the plurality of memory cells comprises volatile memory cells.

Clause 6. The memory device according to any preceding clause, wherein:
the plurality of memory cells comprises non-volatile memory cells.

Clause 7. The memory device according to any preceding clause, wherein:
each memory cell comprises more than one transistor whose respective gate voltage varies with the data written thereto; and
said more than one transistor together determine the variable impedance of the memory cell.

Clause 8. The memory device according to any preceding clause, wherein:
the signal node comprises a read bit line node.

Clause 9. The memory device according to any preceding clause, wherein:
the read circuit, together with a selection circuit, is configured to effect a change in voltage of the signal node at a variable rate corresponding to the variable impedance of the selected memory cell, and to read the data value stored within the selected memory cell based upon the variable time delay determination of the signal node voltage change.

Clause 10. The memory device according to any preceding clause, wherein:
the read circuit is configured to discharge the signal node at a variable rate corresponding to the variable impedance of a selected memory cell;
the variable time delay determination of the signal node voltage change comprises a time-to-discharge measurement of the signal node voltage change; and
the signal node comprises a read bit line node.

Clause 11. The memory device according to any preceding clause, wherein:
the read circuit is configured to charge the signal node at a variable rate corresponding to the variable impedance of a selected memory cell;
the variable time delay determination of the signal node comprises a time-to-charge measurement of the signal node; and
the signal node comprises a read bit line node.

Clause 12. A memory device comprising:
a plurality of memory cells in an array, each memory cell having at least two data values; and
a plurality of tracking memory cells in the array with a predetermined data value; and
a read circuit configured to effect a voltage transition of a signal node at a variable rate corresponding to a data value stored within a selected memory cell, and to perform a time-to-transition measurement of the signal node to determine the data value stored within the selected memory cell with respect to the predetermined data value stored within the selected tracking memory cell.

Clause 13. The memory device according to clause 12, wherein:
each respective data value corresponds to a plurality of bits.

Clause 14. The memory device according to any of clauses 12-13, wherein:
the variable impedance of each memory cell arises from a transistor within the cell whose gate voltage varies with the data written thereto.

Clause 15. The memory device according to any of clauses 12-14, wherein:
the plurality of memory cells comprises volatile memory cells.

Clause 16. The memory device according to any of clauses 12-15, wherein:
  each memory cell comprises more than one transistor whose gate voltage varies with the data written thereto; and
  said more than one transistor together determine the variable impedance of the memory cell.

Clause 17. The memory device according to any of clauses 12-16, wherein:
  the read circuit is further configured to perform, before selecting the selected memory cell, a calibration time-to-transition measurement of the signal node to calibrate a reference condition of the signal node; and the read circuit is further configured to compare the time-to-transition measurement against the calibration time-to-transition measurement to determine the data value stored in the selected memory cell.

Clause 18. The memory device according to any of clauses 12-17, wherein the read circuit comprises:
  a time-to-discharge measurement circuit having an input coupled to the signal node, and having a delay line that includes a plurality of delay stages, each coupled to a respective one of a plurality of registers that are responsive to a common strobe clock.

Clause 19. The memory device according to any of clauses 12-18, wherein the time-to-discharge measurement circuit further comprises:
  an input stage having an input coupled to the signal node, and having an output coupled to the delay line, said input stage configured to generate a timing signal on its output when the signal node has fallen to a predetermined percentage of its initial voltage.

Clause 20. The memory device according to any of clauses 12-19, wherein:
  the signal node comprises a read bit line node; and
  each respective data value corresponds to a plurality of bits.

References to "one embodiment", "an embodiment", "some embodiments", "various embodiments", or the like indicate that a particular element or characteristic is included in at least one embodiment of the invention. Although the phrases may appear in various places, the phrases do not necessarily refer to the same embodiment or example.

Regarding terminology used herein, many of the node names and signal names include subscripts to better distinguish between distinct instantiations of similar nodes and signals (e.g., $WL_0$ and $WL_1$), as such usage is well understood in the art. Nevertheless, any inadvertent use herein without such subscript is not intended to imply any difference relative to a subscripted version of the same name (e.g., Vbias and Vbias) unless the context clearly requires such. In addition, any use herein of a term including a lower case portion thereof is not intended to imply any difference relative to an upper case version of the same name (e.g., $V_{TH}$ and $V_{th}$) unless the context clearly requires such.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "node 11 is brought high by circuit 10," "circuit 10 pulls the OUT signal high," and "circuit 10 drives OUT high." Such shorthand phrases for describing circuit operation used herein are more efficient to communicate details of circuit operation, particularly because the schematic diagrams in the figures clearly associate various signal names with the corresponding circuit blocks and nodes. For convenience, and otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of this disclosure. It is to be appreciated by those skilled in the art that each of these and other similar phrases may be interchangeably used to describe common circuit operation, and no subtle inferences should be read into varied usage within this description.

An insulated gate field effect transistor (IGFET) may be conceptualized as having a control terminal which controls the flow of current between a first current handling terminal and a second current handling terminal. Although IGFET transistors are frequently discussed as having a drain, a gate, and a source, in most such devices the drain is interchangeable with the source. This is because the layout and semiconductor processing of the transistor is frequently symmetrical (which is typically not the case for bipolar transistors). For an N-channel IGFET transistor, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source voltage referred to in N-channel IGFET device equations merely refers to whichever drain or source terminal has the lower voltage at any given point in time. For example, the "source" of the N-channel device of a bi-directional CMOS transfer gate depends on which side of the transfer gate is at the lower voltage. To reflect this symmetry of most N-channel IGFET transistors, the control terminal may be deemed the gate, the first current handling terminal may be termed the "drain/source", and the second current handling terminal may be termed the "source/drain". The source and drain terminals may also be referred to as conduction electrodes. Such a description is equally valid for a P-channel IGFET transistor, since the polarity between drain and source voltages, and the direction of current flow between drain and source, is not implied by such terminology. Alternatively, one current-handling terminal may arbitrarily deemed the "drain" and the other deemed the "source", with an implicit understanding that the two are not distinct, but interchangeable. It should be noted that IGFET transistors are commonly referred to as MOSFET transistors (which literally is an acronym for "Metal-Oxide-Semiconductor Field Effect Transistor"), even though the gate material may be polysilicon or some material other than metal, and the dielectric may be oxynitride, nitride, or some material other than oxide. The casual use of such historical legacy terms as MOS and MOSFET should not be interpreted to literally refer to only a metal gate FET having an oxide dielectric.

Regarding power supplies, a single positive power supply voltage (e.g., a 2.5 volt power supply) used to power a circuit is frequently named the "$V_{DD}$" power supply. In an integrated circuit, transistors and other circuit elements are actually connected to a $V_{DD}$ terminal or a $V_{DD}$ node, which is then operably connected to the $V_{DD}$ power supply. The colloquial use of phrases such as "tied to $V_{DD}$" or "connected to $V_{DD}$" is understood to mean "connected to the $V_{DD}$ node", which is typically then operably connected to actually receive the $V_{DD}$ power supply voltage during use of the integrated circuit. The reference voltage for such a single power supply circuit is frequently called "$V_{SS}$." Transistors and other circuit elements are actually connected to a $V_{SS}$ terminal or a $V_{SS}$ node, which is then operably connected to the $V_{SS}$ power supply during use of the integrated circuit. Frequently the $V_{SS}$ terminal is connected to a ground reference potential, or just "ground." Describing a node which is "grounded" by a particular transistor or circuit (unless otherwise defined) means the same as being "pulled low" or "pulled to ground" by the transistor or circuit.

Generalizing somewhat, the first power supply terminal is frequently named "$V_{DD}$", and the second power supply terminal is frequently named "$V_{SS}$." Historically the nomenclature "$V_{DD}$" implied a DC voltage connected to the drain terminal of an MOS transistor and $V_{SS}$ implied a DC voltage connected to the source terminal of an MOS transistor. For example, legacy PMOS circuits used a negative $V_{DD}$ power supply, while legacy NMOS circuits used a positive $V_{DD}$ power supply. Common usage, however, frequently ignores this legacy and uses $V_{DD}$ for the more positive supply voltage and $V_{SS}$ for the more negative (or ground) supply voltage unless, of course, defined otherwise. Describing a circuit as functioning with a "$V_{DD}$ supply" and "ground" does not necessarily mean the circuit cannot function using other power supply potentials. Other common power supply terminal names are "$V_{CC}$" (a historical term from bipolar circuits and frequently synonymous with a +5 volt power supply voltage, even when used with MOS transistors which lack collector terminals) and "GND" or just "ground."

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

While the disclosed devices and techniques have been described in light of the embodiments discussed above, one skilled in the art will also recognize that certain substitutions may be easily made in the circuits without departing from the teachings of this disclosure. Also, many circuits using NMOS transistors may be implemented using PMOS transistors instead, as is known in the art, provided the logic polarity and power supply potentials are reversed. In this vein, the transistor conductivity type (i.e., N-channel or P-channel) within a CMOS circuit may be frequently reversed while still preserving similar or analogous operation. Moreover, implementation of the disclosed devices and techniques is not necessarily limited to CMOS technology, and thus implementations utilizing NMOS, PMOS, and various bipolar or other semiconductor fabrication technologies are also contemplated, including PN junction memory devices and nanotube devices.

The various techniques, structures, and methods described above are contemplated to be used alone as well as in various combinations. The above discussion is meant to be illustrative of the principles and various embodiments of the present invention, and it should be understood that the drawings and detailed description herein are to be regarded in an illustrative rather than a restrictive manner, and are not intended to be limiting to the particular forms and examples disclosed. Numerous variations and modifications will become apparent to those skilled in the art once the above disclosure is fully appreciated. It is intended that the following claims be interpreted to embrace all such variations and modifications.

What is claimed is:

1. A memory device comprising:
   a plurality of memory cells, each memory cell having at least two data values, and each memory cell having an effective variable impedance that varies in accordance with a respective data value stored for each data value therein;
   a plurality of tracking memory cells having a predetermined effective impedance in accordance with a respective data value stored therein; and
   a read circuit configured to read an effective data value stored within a selected memory cell based upon a variable time delay determination of a signal node voltage change corresponding to the variable impedance of the selected memory cell with respect to the predetermined impedance of a selected tracking memory cell, wherein the effective data value corresponds to a plurality of bits.

2. The memory device according to claim 1, wherein:
   each respective data value corresponds to a plurality of bits.

3. The memory device according to claim 1, wherein:
   the variable impedance comprises a variable current.

4. The memory device according to claim 1, wherein:
   the variable impedance of each memory cell arises from a transistor within the cell whose gate voltage varies with the data written thereto.

5. The memory device according to claim 4, wherein:
   the plurality of memory cells comprises volatile memory cells.

6. The memory device according to claim 4, wherein:
   the plurality of memory cells comprises non-volatile memory cells.

7. The memory device according to claim 4, wherein:
   each memory cell comprises more than one transistor whose respective gate voltage varies with the data written thereto; and
   said more than one transistor together determine the variable impedance of the memory cell.

8. The memory device according to claim 1, wherein:
   the signal node comprises a read bit line node.

9. The memory device according to claim 1, wherein:
   the read circuit, together with a selection circuit, is configured to effect a change in voltage of the signal node at a variable rate corresponding to the variable impedance of the selected memory cell, and to read the data value stored within the selected memory cell based upon the variable time delay determination of the signal node voltage change.

10. The memory device according to claim 9, wherein:
    the read circuit is configured to discharge the signal node at a variable rate corresponding to the impedance of the selected memory cell;
    the variable time delay determination of the signal node voltage change comprises a time-to-discharge measurement of the signal node voltage change; and
    the signal node comprises a read bit line node.

11. The memory device according to claim 9, wherein:
the read circuit is configured to charge the signal node at a variable rate corresponding to the variable impedance of the selected memory cell;
the variable time delay determination of the signal node comprises a time-to-charge measurement of the signal node; and
the signal node comprises a read bit line node.

12. A memory device comprising:
a plurality of memory cells in an array, each memory cell having at least two data values;
a plurality of tracking cells in the array with a predetermined data value; and
a read circuit configured to effect a voltage transition of a signal node at a variable rate corresponding to a data value stored within a selected memory cell, and to perform a time-to-transition measurement of the signal node to determine an effective data value stored within the selected memory cell with respect to the predetermined data value stored within a selected tracking cell, wherein the effective data value corresponds to a plurality of bits.

13. The memory device according to claim 12, wherein:
each respective data value corresponds to a plurality of bits.

14. The memory device according to claim 12, wherein:
the variable impedance of each memory cell arises from a transistor within the cell whose gate voltage varies with the data written thereto.

15. The memory device according to claim 14, wherein:
the plurality of memory cells comprises volatile memory cells.

16. The memory device according to claim 14, wherein:
each memory cell comprises more than one transistor whose gate voltage varies with the data written thereto; and
said more than one transistor together determine the variable impedance of the memory cell.

17. The memory device according to claim 12, wherein:
the read circuit is further configured to perform, before selecting the selected memory cell, a calibration time-to-transition measurement of the signal node to calibrate a reference condition of the signal node; and
the read circuit is further configured to compare the time-to-transition measurement against the calibration time-to-transition measurement to determine the data value stored in the selected memory cell.

18. The memory device according to claim 12, wherein the read circuit comprises:
a time-to-discharge measurement circuit having an input coupled to the signal node, and having a delay line that includes a plurality of delay stages, each coupled to a respective one of a plurality of registers that are responsive to a common strobe clock.

19. The memory device according to claim 18, wherein the time-to-discharge measurement circuit further comprises:
an input stage having an input coupled to the signal node, and having an output coupled to the delay line, said input stage configured to generate a timing signal on its output when the signal node has fallen to a predetermined percentage of its initial voltage.

20. The memory device according to claim 19, wherein:
the signal node comprises a read bit line node; and
each respective data value corresponds to a plurality of bits.

* * * * *